United States Patent
Hiraiwa et al.

(10) Patent No.: US 7,662,696 B2
(45) Date of Patent: Feb. 16, 2010

(54) METHOD FOR FABRICATING SEMICONDUCTOR DEVICES

(75) Inventors: Atsushi Hiraiwa, Higashimurayama (JP); Satoshi Sakai, Yokohama (JP); Dai Ishikawa, Ome (JP); Yoshihiro Ikeda, Takarazuka (JP)

(73) Assignee: Renesas Technology Corp., Tokyo (JP)

( * ) Notice: Subject to any disclaimer, the term of this patent is extended or adjusted under 35 U.S.C. 154(b) by 164 days.

(21) Appl. No.: 11/690,521

(22) Filed: Mar. 23, 2007

(65) Prior Publication Data
US 2007/0190744 A1    Aug. 16, 2007

Related U.S. Application Data

(62) Division of application No. 10/695,798, filed on Oct. 30, 2003, now Pat. No. 7,211,497.

(30) Foreign Application Priority Data
Oct. 31, 2002   (JP)   ............................ P2002-317028

(51) Int. Cl.
*H01L 21/31*    (2006.01)
*H01L 21/469*   (2006.01)
(52) U.S. Cl. ........................ 438/424; 438/407; 438/780; 257/E21.545; 257/E21.257
(58) Field of Classification Search .............. 438/407, 438/424, 780
See application file for complete search history.

(56) References Cited

U.S. PATENT DOCUMENTS

| 6,096,664 | A  | * | 8/2000 | Rupp et al. ................. 438/275 |
| 6,391,803 | B1 | * | 5/2002 | Kim et al. ................... 438/787 |
| 2002/0040847 | A1 | * | 4/2002 | Ohmi et al. ............ 204/192.22 |
| 2002/0171107 | A1 | | 11/2002 | Cheng et al. |

FOREIGN PATENT DOCUMENTS

| CN | 1245835 A | 3/2000 |
| CN | 1258095 A | 6/2000 |
| JP | 9-008034 A | 1/1997 |
| TW | 538495 | 6/2003 |

* cited by examiner

*Primary Examiner*—Alexander G Ghyka
(74) *Attorney, Agent, or Firm*—Miles & Stockbridge P.C.

(57) ABSTRACT

According to the present invention, an oxide film with the film quality almost equivalent to that of the thermal oxide can be formed by the low-temperature treatment. After removing an insulator on the active region of the substrate which constitutes a semiconductor wafer, an insulator made of, for example, silicon oxide is deposited on the main surface of the semiconductor wafer by the low pressure CVD method. This insulator is a film to form a gate insulator of MISFET in a later step. Subsequently, a plasma treatment is performed in an atmosphere containing oxygen (oxygen plasma treatment) to the insulator in the manner as schematically shown by the arrows. By so doing, the film quality of the insulator formed by the CVD method can be improved to the extent almost equivalent to that of the insulator formed of the thermal oxide.

6 Claims, 57 Drawing Sheets

METHOD FOR FABRICATING SEMICONDUCTOR DEVICES

CROSS-REFERENCE TO RELATED APPLICATION

This application is a division of Application No. 10/695,798 filed Oct. 30, 2003 now U.S. Pat. No. 7,211,497.

BACKGROUND OF THE INVENTION

The present invention relates to a technique for fabricating a semiconductor device and, more particularly, to a technique effectively applied to a method for forming an insulator, which constitutes the semiconductor device.

Some semiconductor devices include a MISFET (Metal Insulator Semiconductor Field Effect Transistor) in which two or more gate insulators different in thickness are formed on the same semiconductor substrate. In general, the MISFET with a relatively thick gate insulator is used as a high breakdown voltage MISFET to which a relatively high voltage is applied.

In a non-volatile memory such as a flash memory or the like, data is recorded by storing electric charges in an isolated electrode (floating electrode) during the operation of the data writing and deleting. Therefore, high voltage of, for example, about 20 to 26 V is necessary to introduce the electric charges into the floating electrode. For this reason, the gate insulator around the MISFET, to which the high voltage is applied, is required to have the thickness capable of withstanding the application of the above high voltage, for example, a thickness of about 20 to 30 nm.

Note that the technique for forming the gate insulator by the chemical vapor deposition (CVD) method has been described in the gazette of Japanese Patent Laid-Open No. 11-177047 which was filed on Jul. 2, 1999 by the present applicant. Additionally, the technique described below and examined by the inventors discloses that, by exposing an insulator formed by the CVD method to atomic oxygen (O*) at 400° C., the etching rate of the insulator in a hydrofluoric acid solution can be made equal to that of a thermal oxide.

The above-mentioned technique is shown in: pp. 42 to 51 (particularly, see FIG. 74 on page 49) in the papers of UCS closing memorial symposium titled "toward the new century led by semiconductor" held on Sep. 24 (Sun) and 25 (Mon), 2000 at Hotel East 21 Tokyo hosted by USC (Ultra Clean Society) Semiconductor Substrate Technology laboratory.

SUMMARY OF THE INVENTION

However, since the voltage used in the non-volatile memory is high, the gate insulator of the MISFET is thick. Therefore, large stress is generated, due to the volume expansion of the sidewalls of a device isolation oxidized in forming the gate insulator by the thermal oxidation. As a result, since some defects occur in the semiconductor substrate and a junction leakage current is increased, there has been the problem that the device characteristics are degraded, for example, the time for writing data is increased due to the decrease of the writing voltage.

Meanwhile, a silicon oxide, having the film quality equivalent to that of the thermal oxide, is required for a portion(s) other than the semiconductor substrate, for example, on the floating electrode. However, since the underlying material of such portion is not the semiconductor substrate, it is difficult to form a high-quality silicon oxide by the thermal oxidation method.

For the solution of these problems, since the sufficient film quality cannot be obtained in the case where the silicon oxide is formed by the CVD method, the improvement in the film quality by the thermal treatment of the formed film must be made. However, due to the insufficient effect of the thermal treatment, there has been the problem that it is difficult to obtain the film quality equivalent to that of the thermal oxide.

An object of the present invention is to provide a technique capable of forming the silicon oxide with the film quality equivalent to that of the thermal oxide without the thermal oxidation in the manufacturing process of a semiconductor device.

The above and other objects and novel characteristics of the present invention will be apparent from the description of this specification and the accompanying drawings.

The typical ones of the inventions disclosed in this application will be briefly described as follows.

That is, in the present invention, a plasma treatment in the low-pressure atmosphere containing oxygen atoms is performed to an oxide film formed over the semiconductor substrate by the CVD method.

Also, the plasma treatment is performed under the atmosphere that contains ions in plasma.

Also, the plasma treatment is performed in the low-pressure atmosphere.

Additionally, another method for fabricating a semiconductor device is as follows:

1. A method for fabricating a semiconductor device comprises the step of repeating the following steps twice or more: depositing an insulator composed of a single layer film of silicon oxide, silicon nitride, or silicon oxynitride or an insulator composed of a laminated film of two or more films selected from the single layer films over a semiconductor substrate by a chemical vapor deposition method; and performing a plasma treatment to said insulator in an atmosphere containing oxygen atoms.

2. The method for fabricating a semiconductor device according to item 1, wherein said plasma treatment is a treatment of the plasma mainly composed of ions containing oxygen atoms.

3. The method for fabricating a semiconductor device according to claim 1 or item 1, wherein said plasma treatment is performed under the condition that the ratio of ions in the plasma is larger than that of radicals.

4. The method for fabricating a semiconductor device according to claim 1 or item 1, further comprises the step of forming field effect transistors having gate insulators different in thickness over said semiconductor substrate, wherein said insulator to which the plasma treatment is performed is a film for forming a relatively thick gate insulator.

Further, yet another method for fabricating a semiconductor device is as follows:

1. A method for fabricating a semiconductor device, comprises the steps of:

(a) depositing a relatively thick insulator made of silicon oxide over a semiconductor substrate by a chemical vapor deposition method;

(b) performing a plasma treatment to said relatively thick insulator in an atmosphere containing oxygen atoms;

(c) after said steps (a) and (b), depositing a sacrificial insulator made of silicon oxide over said semiconductor substrate by the chemical vapor deposition method;

(d) patterning said relatively thick insulator so that said relatively thick insulator and said sacrificial insulator can be left at least in a thick-film region over said semiconductor substrate;

(e) removing selectively said sacrificial insulator when a resist film used as an etching mask is removed in said step (d);

(f) forming a relatively thin insulator in a thin-film region over said semiconductor substrate; and (g) forming gate electrodes in said thick-film region and said thin-film region.

2. A method for fabricating a semiconductor device, comprises the steps of:

(a) depositing a relatively thick insulator made of silicon oxide over a semiconductor substrate by a chemical vapor deposition method;

(b) patterning said relatively thick insulator so that said relatively thick insulator can be left at least in a thick-film region over said semiconductor substrate;

(c) performing a plasma treatment to said semiconductor substrate and said relatively thick insulator in an atmosphere containing oxygen atoms, thereby forming a relatively thin insulator made of silicon oxide in a thin-film region over said semiconductor substrate; and (d) forming gate electrodes in said thick-film region and said thin-film region.

3. A method for fabricating a semiconductor device, comprises the steps of:

(a) forming a laminated film by repeating the following steps twice or more: depositing an insulator made of silicon oxide over a semiconductor substrate by a chemical vapor deposition method; and performing a plasma treatment to said deposited insulator in an atmosphere containing oxygen atoms;

(b) patterning said laminated film so that a relatively thick insulator composed of said laminated film can be left at least in a thick-film region over said semiconductor substrate;

(c) forming a relatively thin insulator in a thin-film region over said semiconductor substrate; and (d) forming gate electrodes in said thick-film region and said thin-film region.

4. A method for fabricating a semiconductor device, comprises the step of: when a first silicon oxide, a silicon nitride, and a second silicon oxide is sequentially formed between a first gate electrode and a second gate electrode which constitute a non-volatile memory cell, depositing at least one of said first silicon oxide and said second silicon oxide by a chemical vapor deposition method, wherein, after the deposition process of said first or second silicon oxide, a plasma treatment is performed in an atmosphere containing oxygen atoms.

5. A method for fabricating a semiconductor device, comprises the step of: when a first silicon oxide, a silicon nitride, and a second silicon oxide are sequentially formed between a first gate electrode and a semiconductor substrate which constitute a non-volatile memory cell, depositing at least one of said first silicon oxide and said second silicon oxide by a chemical vapor deposition method, wherein, after the deposition process of said first or second silicon oxide, a plasma treatment is performed to said first or second silicon oxide in an atmosphere containing oxygen atoms.

6. The method for fabricating a semiconductor device according to item 5, wherein said silicon nitride functions as means storing electric charge with scattered positions.

7. A method for fabricating a semiconductor device, comprises the steps of:

(a) forming an element over a semiconductor substrate;

(b) depositing an interlayer insulator made of silicon oxide over said semiconductor substrate by a chemical vapor deposition method;

(c) performing a plasma treatment to said interlayer insulator in an atmosphere containing oxygen atoms; and (d) forming a wiring on said interlayer insulator.

8. A method for fabricating a semiconductor device, comprises the steps of:

(a) depositing an insulator composed of a single layer film of silicon oxide, silicon nitride, or silicon oxynitride or an insulator composed of a laminated film of two or more films selected from the single layer films over a semiconductor substrate by a chemical vapor deposition method; and (b) performing a plasma treatment in an atmosphere containing oxygen atoms to said insulator under the pressure of 1 to 200 Pa.

9. The method of fabricating a semiconductor device according to item 8, wherein the thickness of said silicon oxide formed over the semiconductor substrate by said plasma treatment is within the range of a 60% minimum limit to a 140% maximum limit of that of said insulator formed by the chemical vapor deposition method.

10. The method for fabricating a semiconductor device according to item 8, wherein said insulator, formed by the chemical vapor deposition method, is formed by an atomic layer deposition method.

11. A method for fabricating a semiconductor device, comprises the step of repeating the following steps twice or more: depositing an insulator composed of a single layer film of silicon oxide, silicon nitride, or silicon oxynitride or an insulator composed of a laminated film of two or more films selected from the single layer films over a semiconductor substrate by a chemical vapor deposition method; and performing a plasma treatment to said insulator in an atmosphere containing oxygen atoms under the pressure of 1 to 200 Pa.

12m. The method for fabricating a semiconductor device according to item8 or 11, further comprises the step of forming field effect transistors having gate insulators different in thickness over said semiconductor substrate, wherein said insulator is a film for forming a relatively thick gate insulator.

13. A method for fabricating a semiconductor device, comprises the steps of:

(a) depositing a relatively thick insulator made of silicon oxide over a semiconductor substrate by a chemical vapor deposition method;

(b) performing a plasma treatment to said relatively thick insulator in an atmosphere containing oxygen atoms under the pressure of 1 to 200 Pa; and (c) patterning said relatively thick insulator so that said relatively thick insulator can be left at least in a thick-film region over said semiconductor substrate.

14. The method for fabricating a semiconductor device according to item 13, further comprises the steps of:

(d) after said step (c), performing at least a thermal oxidation treatment to said semiconductor substrate, thereby forming a relatively thin insulator in a thin-film region over said semiconductor substrate; and (e) forming gate electrodes in said thick-film region and said thin-film region.

15. A method for fabricating a semiconductor device, comprises the steps of:
  (a) depositing a relatively thick insulator made of silicon oxide over a semiconductor substrate by a chemical vapor deposition method;
  (b) performing a plasma treatment to said relatively thick insulator in an atmosphere containing oxygen atoms under the pressure of 1 to 200 Pa;
  (c) patterning said relatively thick insulator so that said relatively thick insulator can be left at least in a thick-film region over said semiconductor substrate;
  (d) depositing a relatively thin insulator composed of a single layer film of silicon oxide, silicon nitride, or silicon oxynitride or composed of a laminated film of two or more films selected from the single layer films over said semiconductor substrate by the chemical vapor deposition method;
  (e) performing the plasma treatment to said relatively thin insulator in an atmosphere containing oxygen atoms under the pressure of 1 to 200 Pa; and
  (f) forming gate electrodes in said thick-film region and said thick-film region.

16. The method for fabricating a semiconductor device according to item 15,
  wherein said relatively thin insulator is formed to cover also an isolation region of said semiconductor substrate.

17. A method for fabricating a semiconductor device, comprises the steps of:
  (a) depositing a relatively thick insulator made of silicon oxide over a semiconductor substrate by a chemical vapor deposition method;
  (b) performing a plasma treatment to said relatively thick insulator in an atmosphere containing oxygen atoms under the pressure of 1 to 200 Pa;
  (c) after said steps (a) and (b), depositing a sacrificial insulator made of silicon oxide over said semiconductor substrate by the chemical vapor deposition method;
  (d) patterning said relatively thick insulator so that said relatively thick insulator and said sacrificial insulator can be left at least in a thick-film region over said semiconductor substrate;
  (e) selectively removing said sacrificial insulator when a resist film used as an etching mask is removed in said step (d);
  (f) forming a relatively thin insulator in a thin-film region over said semiconductor substrate; and
  (g) forming gate electrodes in said thick-film region and said thin-film region.

18. A method for fabricating a semiconductor device, comprises the steps of:
  (a) depositing a relatively thick insulator made of silicon oxide over a semiconductor substrate by a chemical vapor deposition method;
  (b) patterning said relatively thick insulator so that said relatively thick insulator can be left at least in a thick-film region over said semiconductor substrate;
  (c) performing a plasma treatment to said semiconductor substrate and said relatively thick insulator in an atmosphere containing oxygen atoms under the pressure of 1 to 200 Pa, thereby forming a relatively thin insulator made of silicon oxide in a thin-film region over said semiconductor substrate; and
  (d) forming gate electrodes in said thick-film region and said thin-film region.

19. A method for fabricating a semiconductor device, comprises the steps of:
  (a) forming a laminated film by repeating the following steps twice or more: depositing an insulator made of silicon oxide over a semiconductor substrate by a chemical vapor deposition method; and performing a plasma treatment to said deposited insulator in an atmosphere containing oxygen atoms under the pressure of 1 to 200 Pa;
  (b) patterning said laminated film so that a relatively thick insulator composed of said laminated film can be left at least in a thick-film region over said semiconductor substrate;
  (c) forming a relatively thin insulator in a thin-film region over said semiconductor substrate; and
  (d) forming gate electrodes in said thick-film region and in said thin-film region.

20. A method for fabricating a semiconductor device, comprises the step of: when a first silicon oxide, a silicon nitride, and a second silicon oxide are sequentially formed to form an insulator between a first gate electrode and a second gate electrode which constitute a non-volatile memory cell, depositing at least one of said first silicon oxide and said second silicon oxide by a chemical vapor deposition method,
  wherein, after the deposition process of said first or second silicon oxide, a plasma treatment is performed to said first or second silicon oxide in an atmosphere containing oxygen atoms under the pressure of 1 to 200 Pa.

21. A method for fabricating a semiconductor device, comprises the step of: when a first silicon oxide, a silicon nitride, and a second silicon oxide are sequentially formed between a first gate electrode and a second gate electrode which constitute a non-volatile memory cell, depositing at least one of said first silicon oxide and said second silicon oxide by a chemical vapor deposition method,
  wherein, after the deposition process of said first or second silicon oxide, a plasma treatment is performed to said first or second silicon oxide in an atmosphere containing oxygen atoms under the pressure of 1 to 200 Pa.

22. The method for fabricating a semiconductor device according to item 21,
  wherein said silicon nitride functions as means storing electric charge with scattered positions.

DESCRIPTION OF THE PREFERRED EMBODIMENTS

Figure 1:
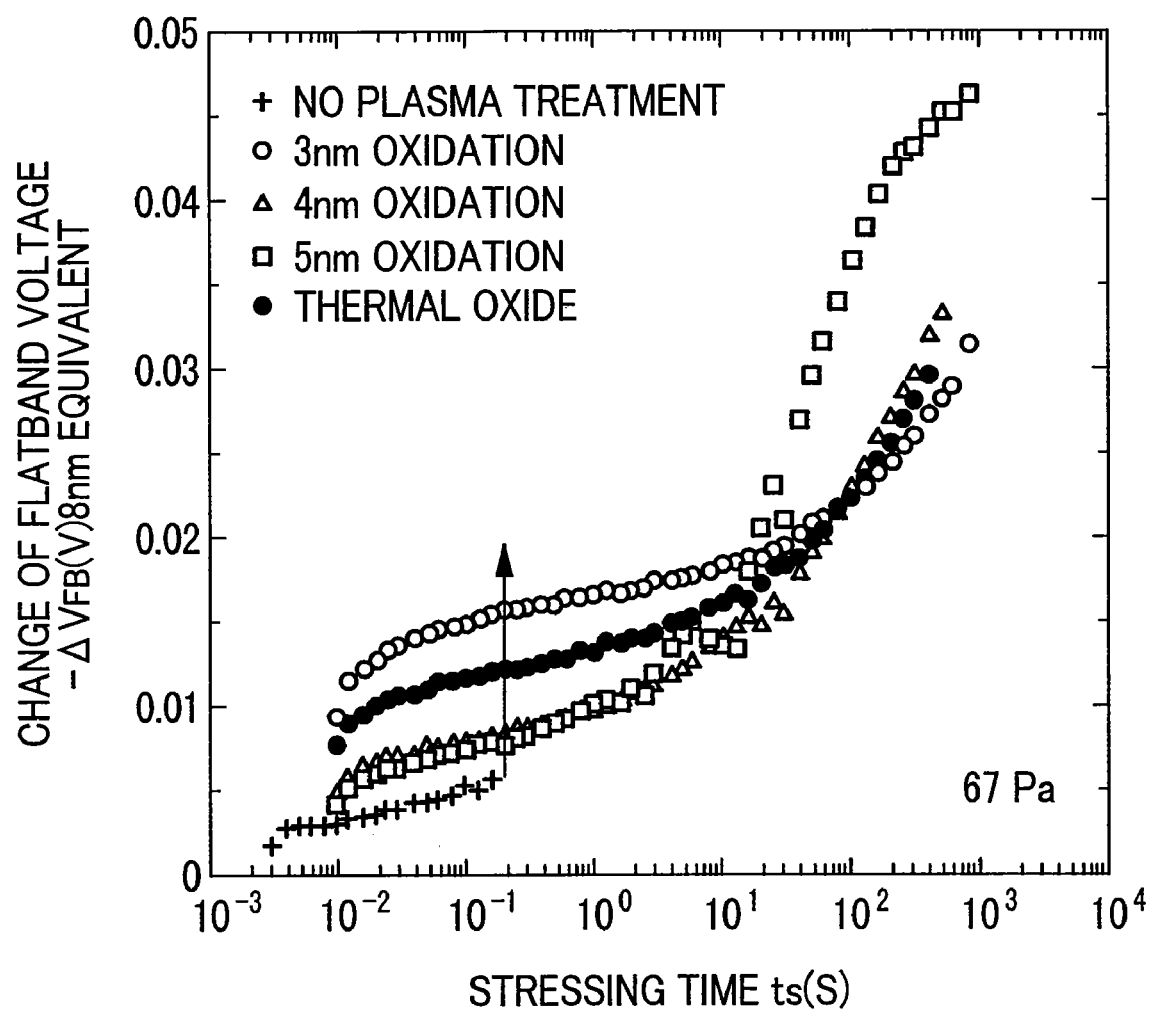
FIG. 1 is a graph showing the results of an experiment by the inventors, in which the variation of the flatband voltage from an initial value is shown as the function of the total time during which the voltage stress is applied.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of an element (including number of pieces, values, amount, range, and the like), the number of the element is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. This condition is also applicable to the numerical value and the range described above. In addition, plasma is usually generated by ionizing the gas substituted with a specific gas (treating gas) while the treating gas is supplemented in a reaction chamber under the action of high-frequency electric field or the like as occasion arises. In practice, however, it is impossible to completely substitute the gas with the treating gas. In the present application, therefore, the term "oxygen plasma" does not indicate complete oxygen plasma and existence of impurity gases (nitrogen, carbon dioxide, water vapor and/or the like) contained in the plasma is permitted. Similarly, needless to say, the plasma may contain a dilution gas(s) or additive gas(s). Additionally, the expression "made of silicon oxide", "mainly made of silicon oxide" or "silicon oxide based" as used herein means that the silicon oxide is used as a main component. More specifically, even in the process for forming the silicon oxide, the impurity is inevitably contained, and thus the existence of the additives and the impurities in the member made of silicon oxide is permitted. Also, the above expression includes the laminated structure in which an insulator made of other materials is formed on a surface of the member made of silicon oxide. This condition is not limited to the silicon oxide and is similarly applicable to other insulators such as silicon nitride and the like. Hereinafter, embodiments of the present invention will be described in detail with reference to the accompanying drawings. Note that components having the same function are denoted by the same reference symbols throughout the drawings for describing the embodiments, and the repetitive description thereof will be omitted. Furthermore, in the embodiments of the present invention, a MISFET (including a MOSFET (Metal Oxide Semiconductor Field Effect Transistor) as a subordinate concept of the MISFET), which is a field effect transistor, is abbreviated as "MIS", a p channel MISFET is abbreviated as "pMIS", and an n channel MISFET is abbreviated as "nMIS".

First Embodiment

The inventors have first found out that, when the plasma treatment (oxygen plasma treatment) in an atmosphere containing oxygen ($O_2$) as a main gas is performed to the silicon oxide ($SiO_2$ and the like) deposited by the CVD (Chemical Vapor Deposition) method, the action of the ions in plasma, especially, of oxygen ions ($O^+$ or $O_2^+$) is important for the quality improvement of silicon oxide. This is probably because the physical (mechanical) impact by the ions in plasma, collided to the silicon oxide, causes the rearrangement of the constituent atoms in the silicon oxide and, thus, the film quality of the silicon oxide will be improved. Hereinafter, results of the experiment by the inventors for verifying the effectiveness of the embodiments will be described with reference to FIGS. 1 to 10. Note that radical oxygen by plasma is abbreviated to "oxygen radical ($O^*$)".

Figure 2:
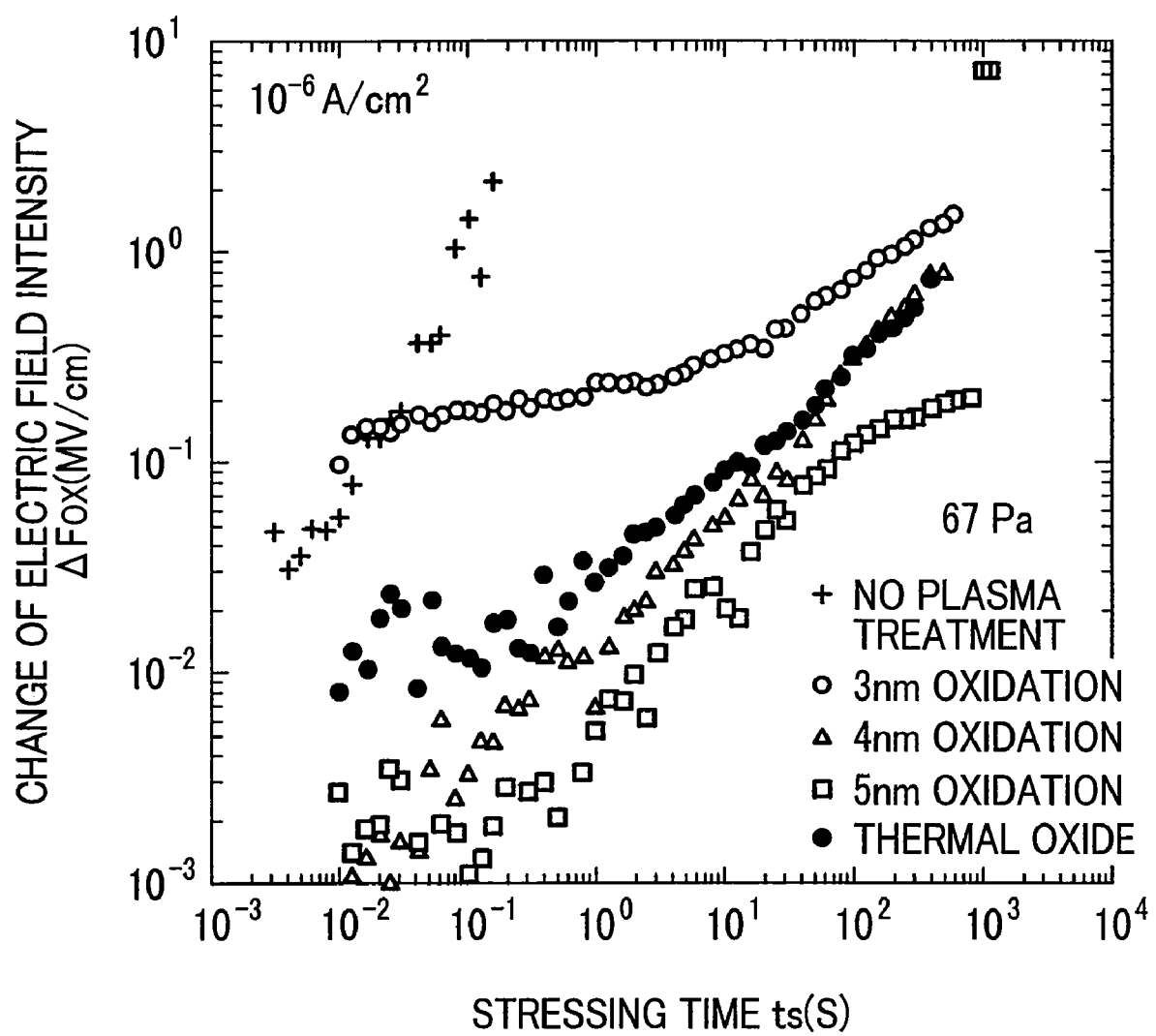
FIG. 2 is a graph showing the measurement results in which the current-voltage characteristics (leakage current in gate insulator) are measured instead of the capacitance-voltage characteristics in FIG. 1.

In the experiment of FIGS. 1 and 2, an n type gate MOS capacitor is fabricated and is used as an experiment sample, in which there is used, as a gate insulator, the film obtained by performing the oxygen plasma treatment with a pressure of 67 Pa to a silicon oxide ($SiO_2$ and the like) to have about 4 nm in equivalent oxide thickness on a p type silicon (Si) substrate, the silicon oxide being formed by the low pressure CVD (abbreviated to "LPCVD", hereinafter) method and device isolation regions being formed in the p type silicon substrate. The time period of the oxygen plasma treatment is varied in each of the samples, and silicon oxide with about 3 to 5 nm in equivalent oxide thickness is grown by the oxygen plasma treatment over the silicon substrate, over which no silicon oxide deposited by the LPCVD method (referred to as "LPCVD silicon oxide", hereinafter) is formed. Subsequently, the operations as follows are repeatedly performed. That is, while the n type gate MOS capacitor is maintained at, for example, 125° C., a constant negative voltage is applied for a predetermined time to the gate electrode so that the electric field intensity in the gate insulator can be set to −10 MV/cm. Then, the capacitance-voltage characteristics are measured. In this manner, the change in flatband voltage ($V_{FB}$) with time has been examined. The low pressure CVD method, selected as the film forming method of the silicon oxide in this experiment, is the CVD method, in which the pressure at the film formation is set lower than the atmospheric pressure (normal pressure), since it is known that the method can form relatively high-quality silicon oxide.

FIG. 1 shows variation of the above-mentioned flatband voltage from an initial value (the value before applying the voltage stress), as the function of the total time during which the voltage stress is applied. The LPCVD silicon oxide, to which no oxygen plasma treatment is performed, is broken before the total time period of applying the voltage stress reaches 1 second (see the mark "+" in FIG. 1). In contrast, it is understood that the LPCVD silicon oxide, to which the oxygen plasma treatment is performed, has sufficient time to breakdown. It is also understood that, by the oxygen plasma treatment, the variation of the flatband voltage is reduced to the level equal to the thermal oxide (see the black circular marks in FIG. 1). Further, at the treatment time when the amount of oxidation of the silicon substrate reaches about 5 nm or more in equivalent oxide thickness, the variation in flatband voltage ($\Delta_{VFB}$) is gradually increased. Therefore, it is desirable that the oxygen plasma treatment is maintained within the range that the amount of oxidation of the silicon substrate is a 30% increase in the thickness of the LPCVD silicon oxide. However, even in the case where the thickness of the silicon oxide on the silicon substrate is larger than the 30% increase in the thickness of the LPCVD silicon oxide, the variation of the flatband voltage does not cause any problem in the practical use. Therefore, the effectiveness of such oxygen plasma treatment is not denied. As described above, the phenomenon that the excessive oxygen plasma treatment causes the increase in variation of the flatband voltage is found out by the inventors for the first time. According to the examination by the inventors, the phenomenon is caused from the increase of carrier trap, due to the increase of the stress at the interface between the silicon oxide and the silicon substrate by the progress of oxidation of the silicon substrate below the LPCVD silicon oxide.

Next, FIG. 2 shows the measurement results of the current-voltage characteristics (leakage current of gate insulator) instead of the capacitance-voltage characteristics of FIG. 1. In general, in the case of using the silicon oxide and applying the voltage stress, the leakage current is apparently generated in the gate insulator even by the low (small absolute value) gate voltage, and as a result, the problem occurs such that the stored charges for the data storage disappear in the non-volatile memory. FIG. 2 shows the variation from the initial value of the electric field intensity excited in the gate insulator under the gate voltage that generates a leakage current of 1 $\mu A/cm^2$. By performing the oxygen plasma treatment, the variation in the electric field intensity is significantly decreased to the level equal to that of the silicon oxide formed by the thermal oxidation. With respect to the variation in the electric field intensity, in the case where the time period of the oxygen plasma treatment is short (oxidation amount of the silicon substrate is 3 nm or less in FIG. 2), the variation in the electric field intensity is not completely prevented. However, it is improved to the level with no problem in the practical use (see white circular marks in FIG. 2). Therefore, considering FIGS. 1 and 2 together, the following facts are found out first by the inventors. That is, it is effective to control the time period of the oxygen plasma treatment so that the silicon oxide with the thickness almost equal to that of the formed LPCVD silicon oxide can be formed on the silicon substrate, and it is more effective in many cases to adjust the treatment time period so that the thickness of the silicon oxide, formed over the silicon substrate by the oxygen plasma treatment, is within the range of a 30% decrease to a 30% increase of the thickness of the LPCVD silicon oxide.

Figure 3:
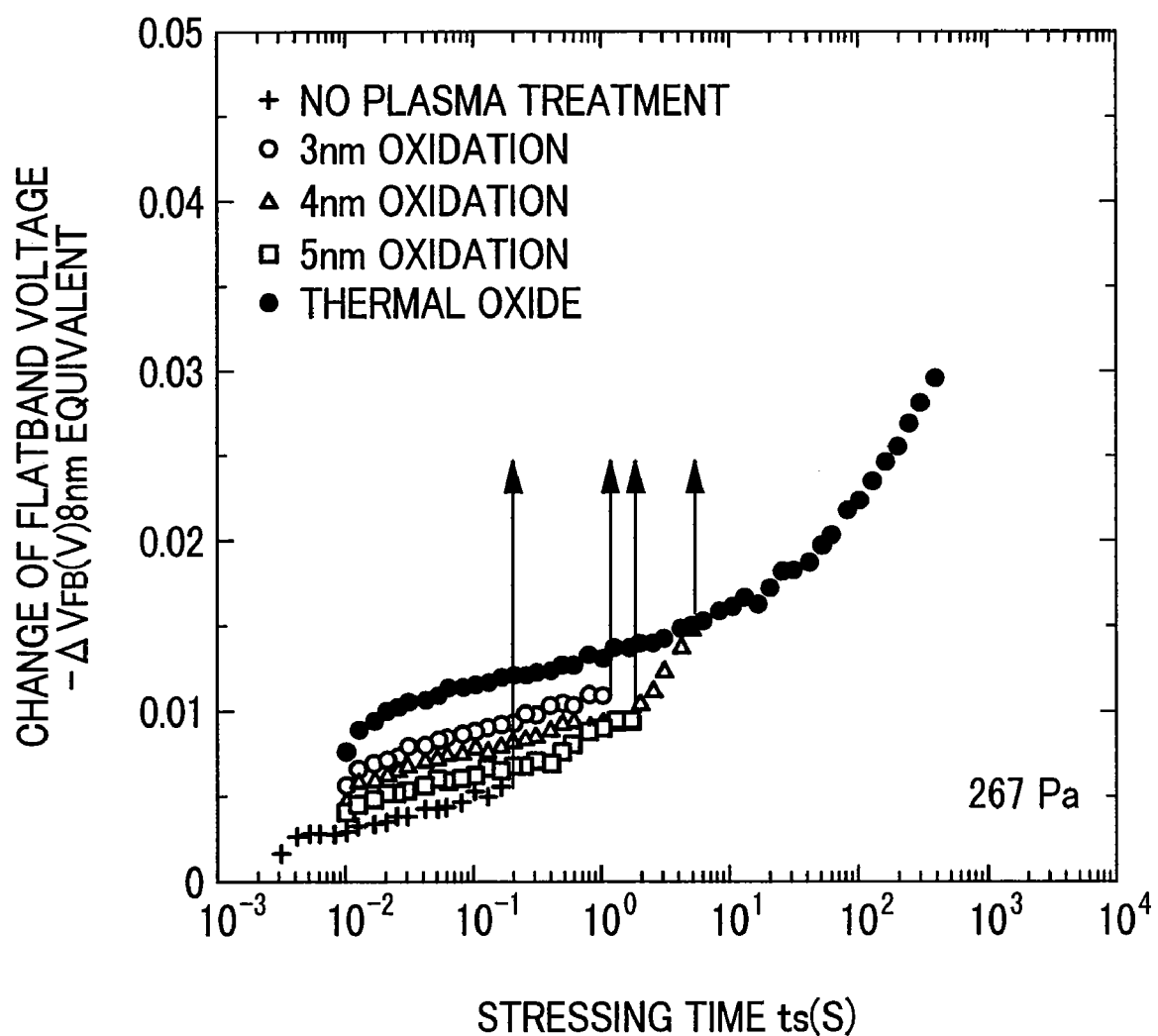
FIG. 3 is a graph, in which the variation of the flatband voltage from the initial value is shown as the function of the total time during which the voltage stress is applied, using the samples obtained by the oxygen plasma treatment different from that in FIG. 1 in a pressure condition.
Figure 4:
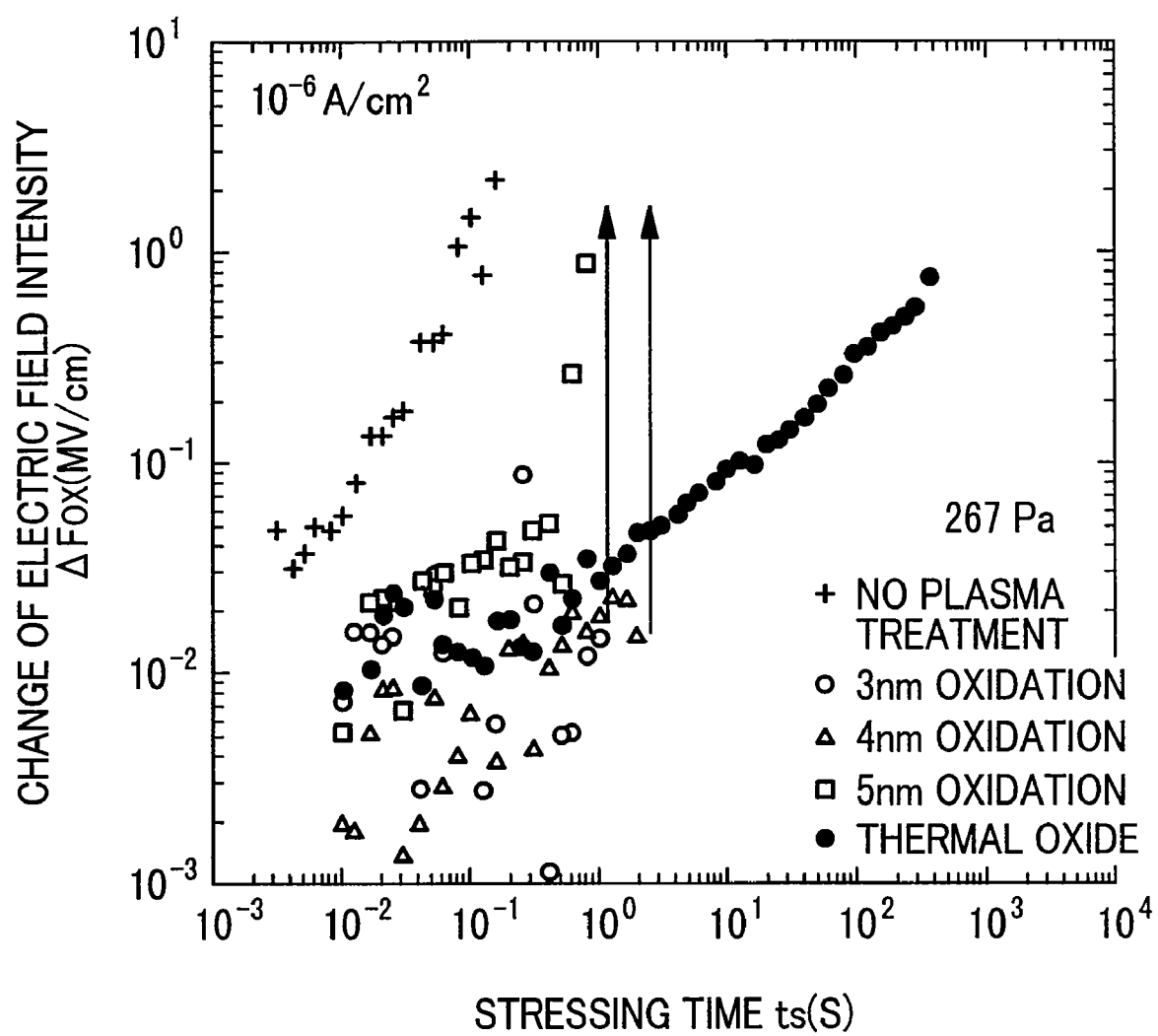
FIG. 4 is a graph showing the measurement results in which the current-voltage characteristics (leakage current in gate insulator) are measured instead of the capacitance-voltage characteristics in FIG. 3.

Next, FIGS. 3 and 4 respectively show the results of the measurement similar to that described with reference to FIGS. 1 and 2, using the samples obtained by performing the oxygen plasma treatment in which the pressure is set to 267 Pa instead of 67 Pa described above. As is evident from FIGS. 3 and 4, in the case where the pressure of the oxygen plasma treatment is high, the dielectric breakdown occurs in a short time even though the oxidation of the silicon substrate by the oxygen plasma treatment is performed to the same extent as that of the oxygen plasma treatment with the low pressure and, thus, the reforming of the LPCVD silicon oxide is not sufficiently achieved. Such facts are found out first by the inventors. The inventors has thought that the cause of such difference is as follows. That is, when the pressure of the plasma is low, the ratio of the ions to radicals in plasma is increased in comparison to the case of the high pressure. The ions in the oxygen plasma (which are mainly oxygen ions ($O^+$ or $O_2^+$) but, also in the case of adding the gas other than oxygen, includes the ions of the additive gas) are accelerated and collided to the LPCVD silicon oxide. Therefore, the LPCVD silicon oxide is partially destroyed by the physical (mechanical) impact and, therefore, the constituent atoms of the LPCVD silicon oxide are rearranged to form a more stable bonding. As a result, the more strong structure is formed in the LPCVD silicon oxide. In contrast, when the pressure of the plasma is high, the ratio of the ions to the radicals in plasma is reduced in comparison to the case of the low pressure and thus the above rearrangement is not sufficient. Therefore, the reforming effect cannot be sufficiently obtained. More specifically, the inventors find out first that the oxygen radical ($O^*$ or $O_2^*$) also contributes to the reforming of the LPCVD silicon oxide, but the oxygen radical cannot sufficiently improve the film quality (breakdown voltage of gate insulator). The above non-patent document has the description "the etching rate of the oxide film in the fluoride solution can be reduced by the treatment of exposing the CVD silicon oxide to the oxygen radical ($O^*$ or $O_2^*$)". However, it is anticipated that it is difficult to improve the film quality (breakdown voltage of gate insulator) of the silicon oxide by the above-mentioned oxygen radical treatment. As describe above, the inventors find out first that the action of the ions in plasma is important for the improvement of the film quality of the oxide film and that the sufficient effect for improving the film quality can be hardly obtained even if the oxygen plasma treatment is simply performed.

Figure 5:
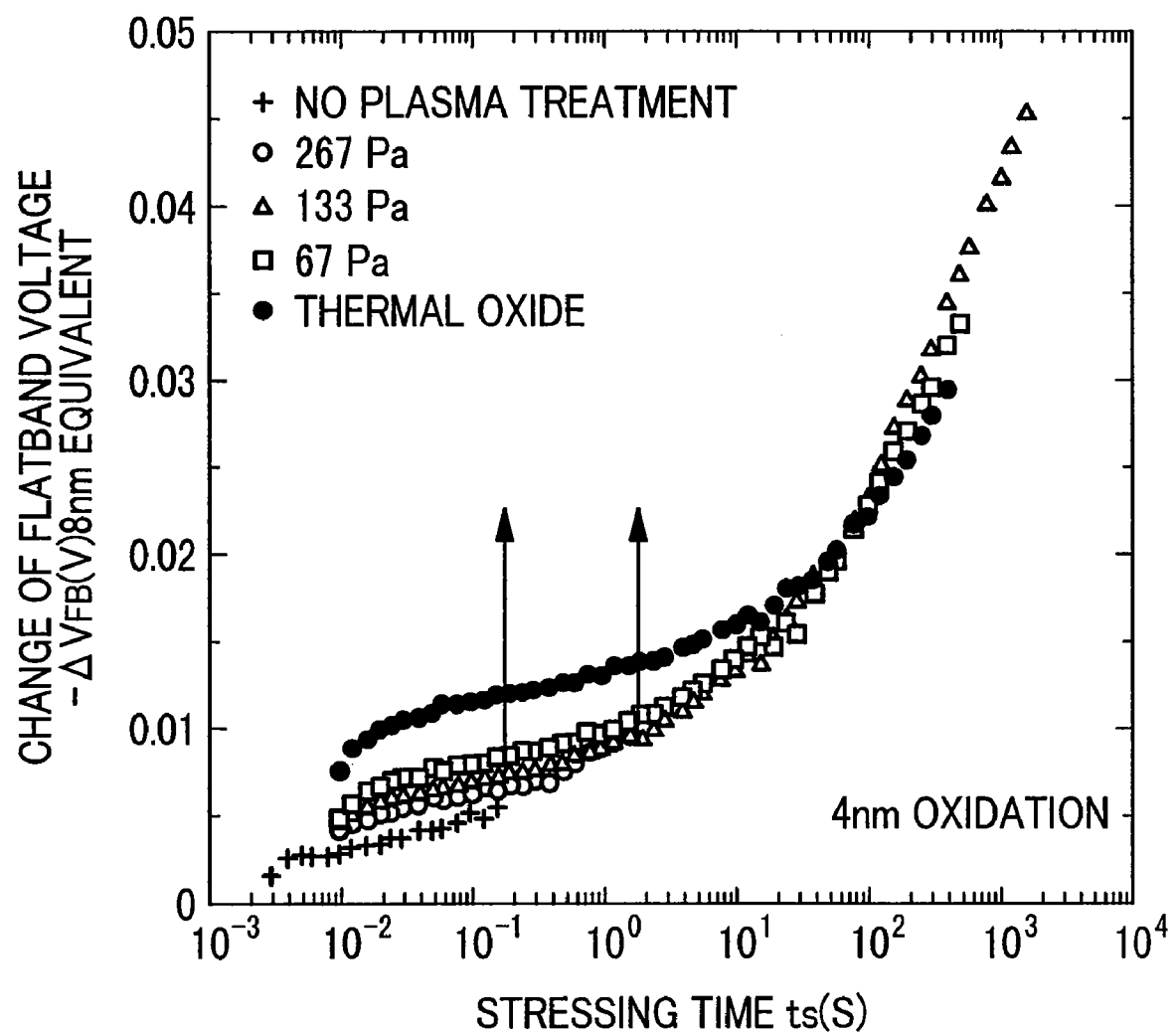
FIG. 5 is a graph, in which the variation of the flatband voltage from the initial value is shown as the function of the total time during which the voltage stress is applied, using various samples obtained by the oxygen plasma treatment different from that in FIG. 1 in a pressure condition.
Figure 6:
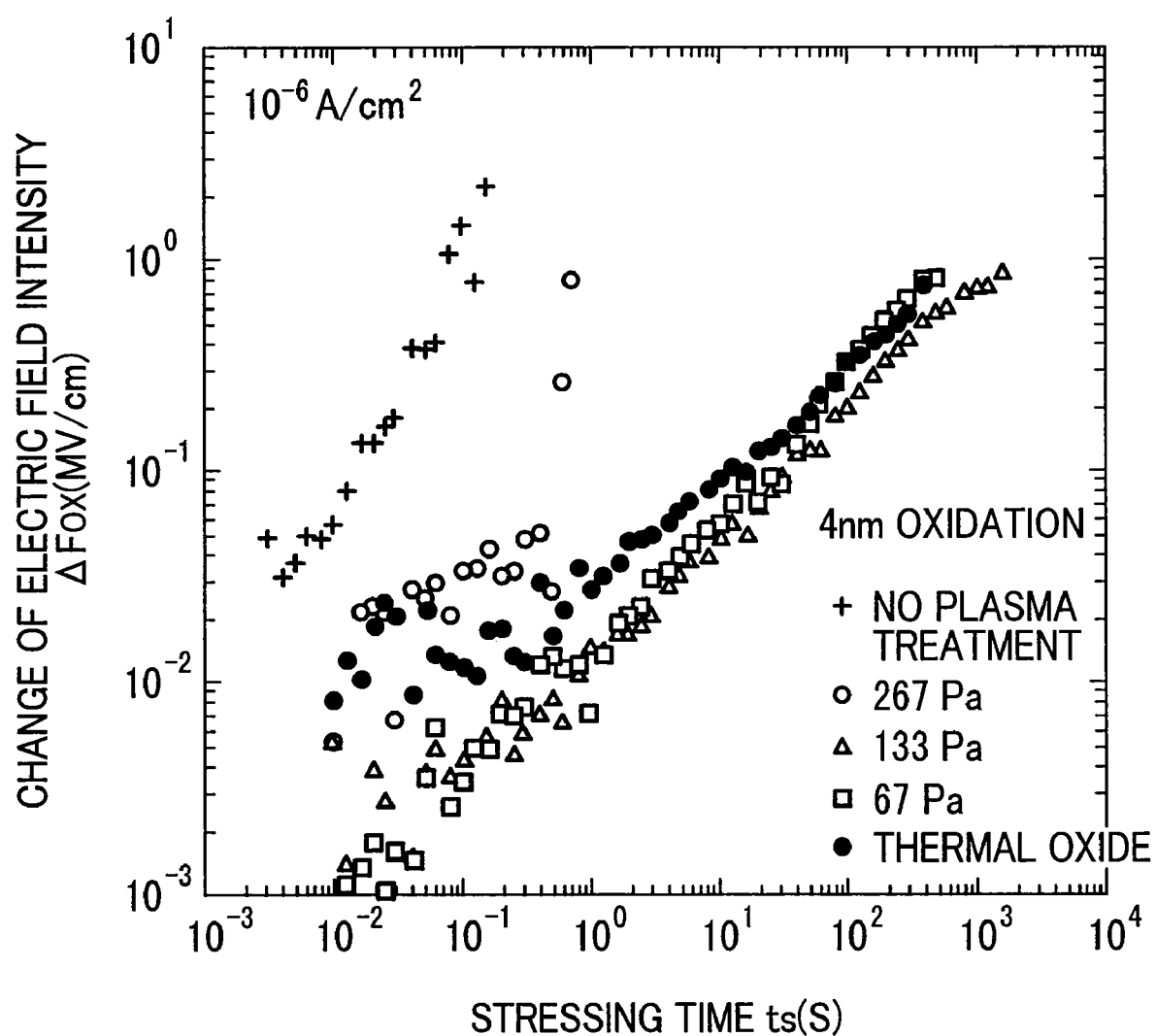
FIG. 6 is a graph showing the measurement results in which the current-voltage characteristics (leakage current in gate insulator) are measured instead of the capacitance-voltage characteristics in FIG. 5.

FIGS. 5 and 6 respectively show the results of the measurement similar to that described with reference to FIGS. 1 and 2, using the samples obtained by the oxygen plasma treatment in which the pressure is changed. Also, the treatment time period is adjusted so that the silicon oxide formed on the silicon substrate can have the thickness of about 4 nm in equivalent oxide thickness even though the pressure of the treatment is changed. As is evident from FIGS. 5 and 6, it is possible to obtain the good reforming effect by setting the pressure of the oxygen plasma treatment to 200 Pa or less. In addition, it is not preferable to set the treatment pressure to 1 Pa or less because the plasma becomes unstable and the influence of the residual gas in the chamber is increased and, thereby, the problem may occur in the effect and the reproducibility of the oxygen plasma treatment. According to the examination by the inventors, it is difficult to determine the optimum pressure in the plasma treatment because the pressure varies depending on the plasma treatment apparatus and other conditions, etc. However, the pressure range in which the improvement of film quality can be made by the ions in plasma can be exemplified from the viewpoint of the action, and the range from 1 Pa to 200 Pa, more preferably, the range from 67 Pa to 133 Pa can be exemplified based on the experiment by the inventors.

Figure 7:
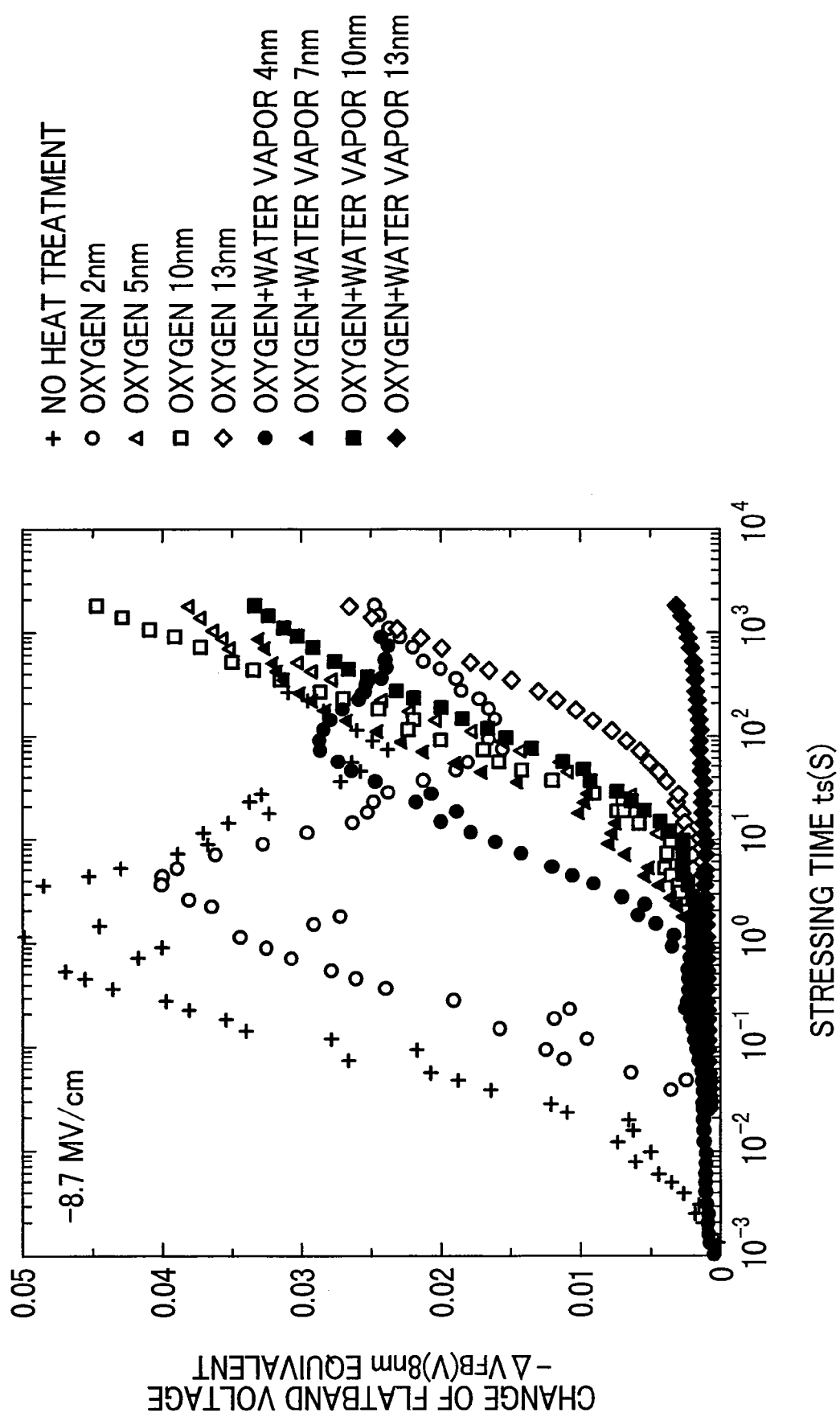
FIG. 7 is a graph, in which the variation of the flatband voltage from the initial value is shown as the function of the total time during which the voltage stress is applied, using the samples different from those in FIG. 1 in a silicon oxide thickness and a stress voltage.
Figure 8:
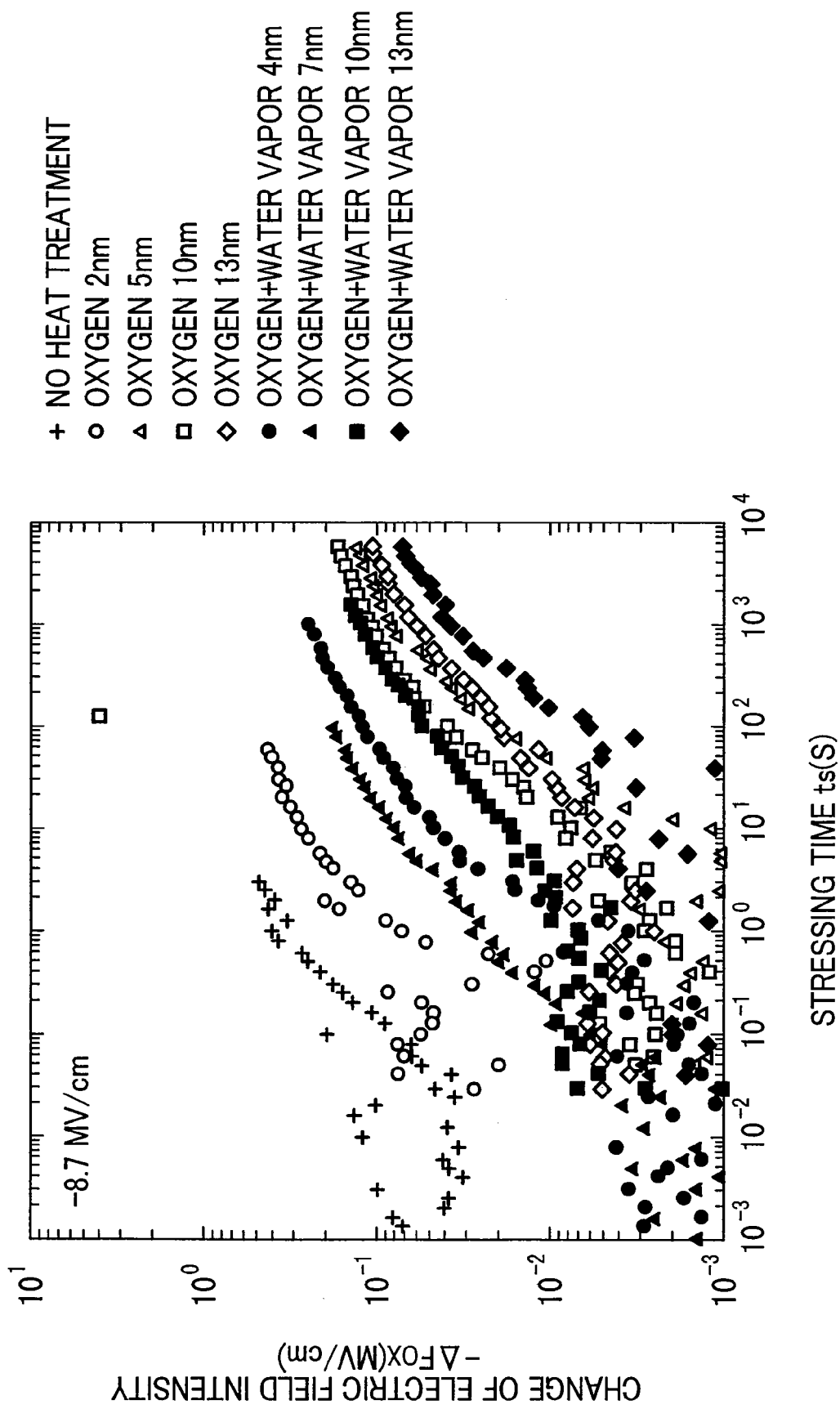
FIG. 8 is a graph showing the measurement results in which the current-voltage characteristics (leakage current in gate insulator) are measured instead of the capacitance-voltage characteristics in FIG. 7.

Next, the dependency of the plasma treatment time to the thick LPCVD silicon oxide will be described. FIGS. 7 and 8 respectively show the variation of the flatband voltage and the variation of the electric field intensity, at which the leakage current becomes constant at the time when the stress voltage is applied to the silicon oxide obtained by performing the plasma treatment to a silicon oxide with a thickness of about 17 nm (equivalent oxide thickness) formed by the LPCVD method so that the electric field in the silicon oxide can be set to −8.7 MV/cm. The pressure of the plasma treatment is, for example, about 67 Pa. Also, FIG. 8 shows the result of the experiment for examining the electric field intensity at which the leakage current becomes $0.1\ \mu A/cm^2$. In FIGS. 7 and 8, the results in the case where the atmosphere of the plasma treatment is oxygen and the results in the case where the atmosphere of the plasma treatment is oxygen containing water vapor are compared. In either cases of the atmosphere, with the increase of the treatment amount, the variation of the characteristics due to the voltage stress is reduced. In FIGS. 7 and 8, the oxidation amount on the silicon substrate by the plasma treatment is thinner than that of the silicon oxide just after the formation by the CVD method, and the fact that the improvement effect is increased together with the increase of the treatment amount in such a treatment range is similar to that in the case described with reference to FIGS. 1 and 2. Since the change in electric field intensity shown in FIG. 8 is negative, the voltage stress makes it difficult to carry the leakage current. From the viewpoint of the reduction of the leakage current, the large variation seems to be desirable. However, it is not desirable because it causes the reduction in speed of the writing and deleting when used in the tunnel oxide or the like of the non-volatile memory.

Next, the relation with the atmosphere in the oxygen plasma treatment will be described. With respect to the atmosphere, the oxygen atmosphere containing water vapor can obtain the more preferable results, especially, about the variation of the flatband voltage shown in FIG. 7 than the oxygen atmosphere.

Figure 9:
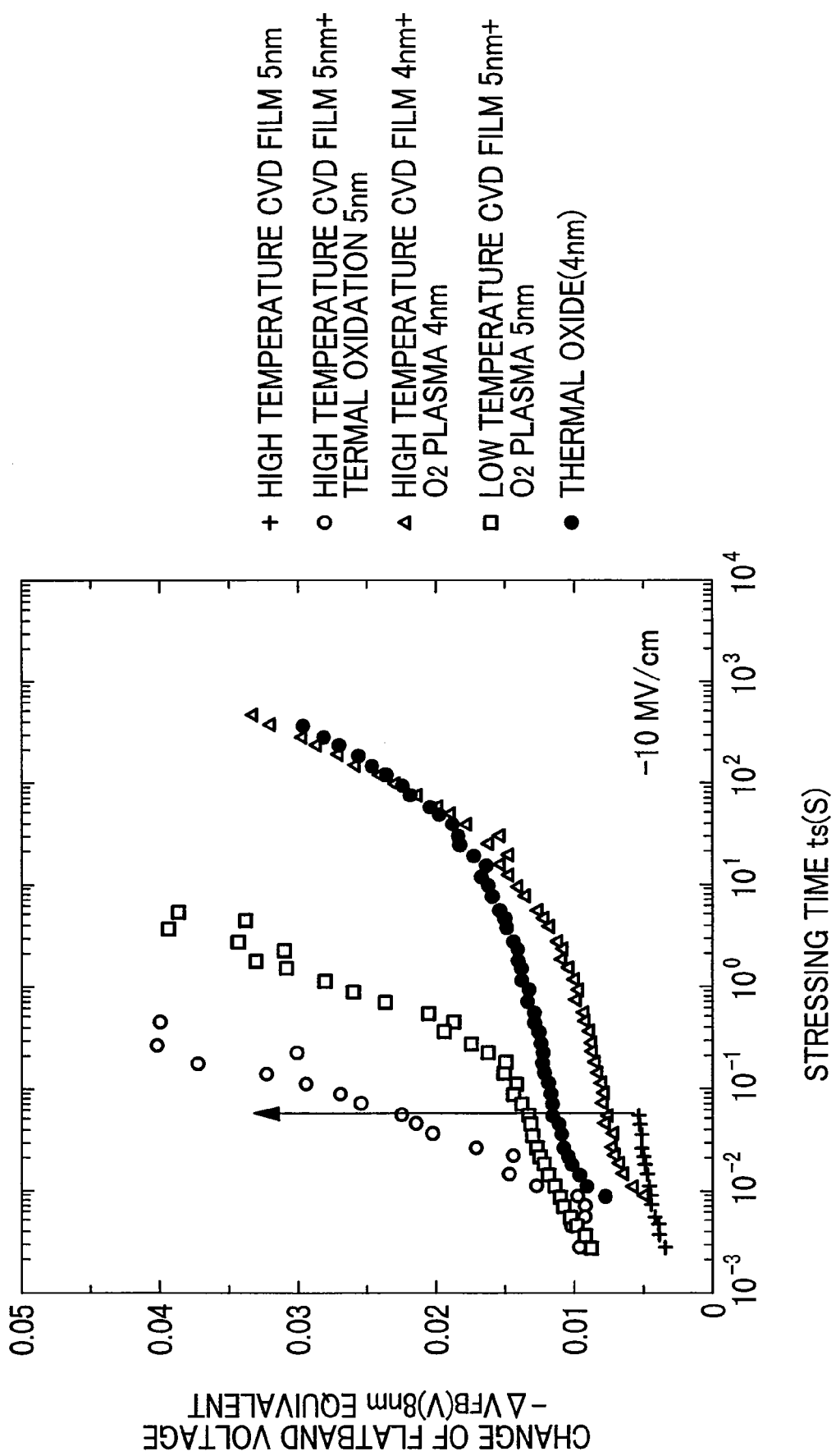
FIG. 9 is a graph showing the comparison between the results in the case where the CVD silicon oxide is formed at a low temperature and those in the case where it is formed at a high temperature.
Figure 10:
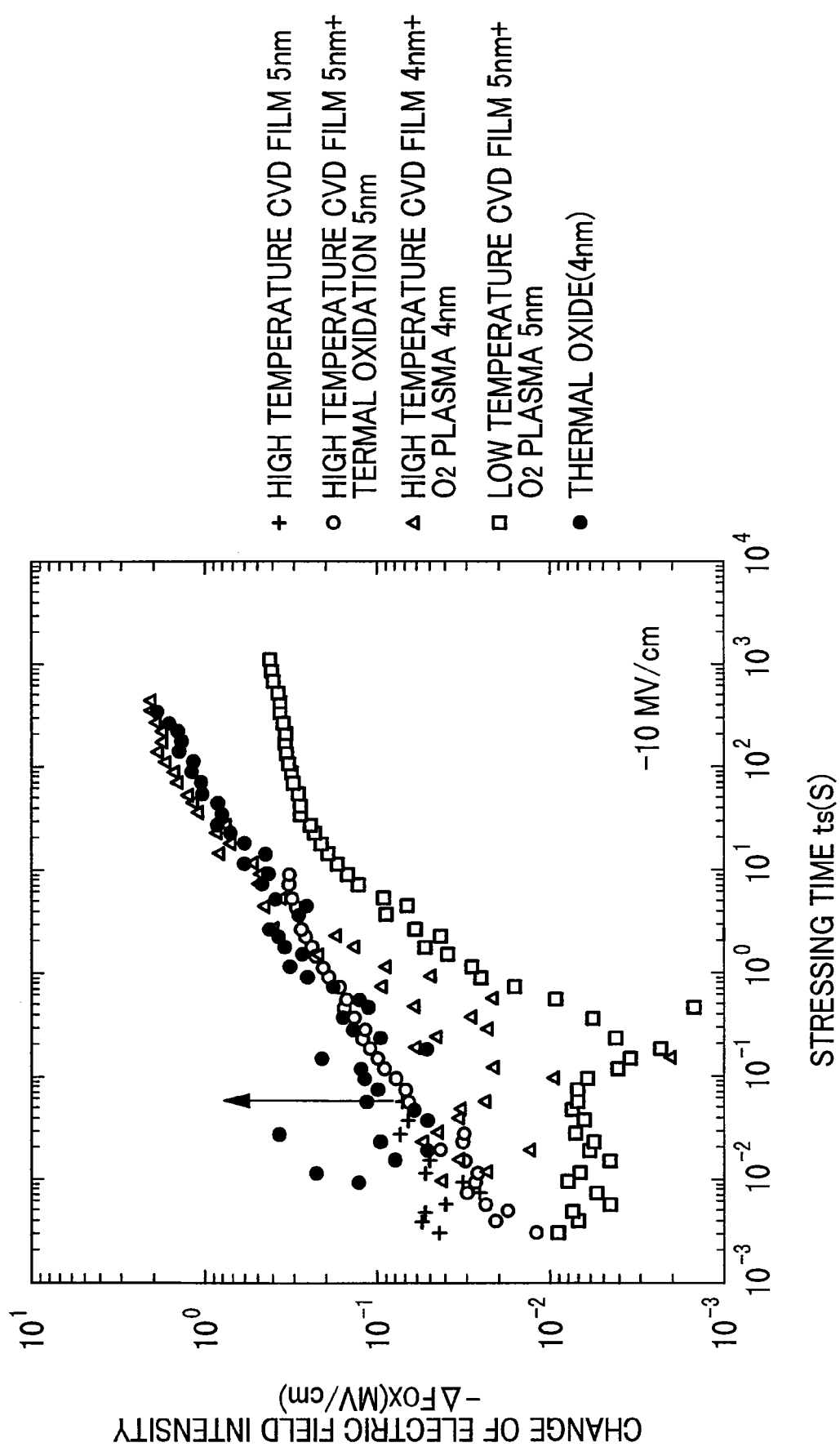
FIG. 10 is a graph showing the comparison between the results in the case where the CVD silicon oxide is formed at a low temperature and those in the case where it is formed at a high temperature.

Next, the relation with the film quality of the CVD silicon oxide will be described. In FIGS. 9 and 10, the results in the case where the CVD silicon oxide is formed at a low temperature and the results in the case where the CVD silicon oxide is formed at a high temperature are compared. The film formation at the low temperature was performed at 680° C. with using, for example, Tetra Ethyl Ortho Silicate (TEOS; $Si(OC_2H_5)_4$) as a reaction gas. The film formation at the high temperature was performed at 800° C. with using, for example, the mixed gas containing monosilane ($SiH_4$) and $N_2O$. Note that the silicon oxide formed at a high temperature is used in all the experiments of FIGS. 1 to 8.

In FIGS. 9 and 10, the thickness of the silicon oxide formed by the CVD method is different in that the thickness in the low temperature formation is about 5 nm and that in the high temperature formation is about 4 nm. Also, the thickness of the silicon oxide, formed on the silicon substrate by the oxygen plasma treatment, is controlled to be equal to that formed by the CVD method. When the film is formed at the low temperature at the CVD method, little improvement can be achieved in the flatband voltage by the voltage stress (see square marks in FIG. 9). Hence, the silicon oxide formed at the high temperature is desirably used for the achievement of the objects of this embodiment (see triangular marks in FIG. 9).

In addition, when an atomic layer deposition (ALD) CVD method is used as the film forming method of the silicon oxide instead of the normal LPCVD method, the results, being in no way inferior to those of high temperature formation, was obtained. In addition, depending on the purposes, the atomic layer deposition CVD method may be performed without performing the oxygen plasma treatment.

In addition, the results in the case where the normal thermal oxidation treatment is performed without the plasma are also shown in FIGS. 9 and 10. Also in the case of the thermal oxidation treatment, the treatment time period is controlled so that the thickness of the silicon oxide, formed over the silicon substrate, can be equal to that of the silicon oxide formed by the CVD method. The atmosphere of the thermal oxidation treatment in this case is the mixed gas of water vapor and oxygen. It can be understood from these drawings, that, though the thermal oxidation treatment is effective in the improvement of the breakdown voltage, it has an inferior to effect on preventing the variation of the flatband voltage and that of the electric field intensity corresponding to the specific leakage current and, therefore, the oxygen plasma treatment according to this embodiment produces the special effects never seen before.

Figure 11:
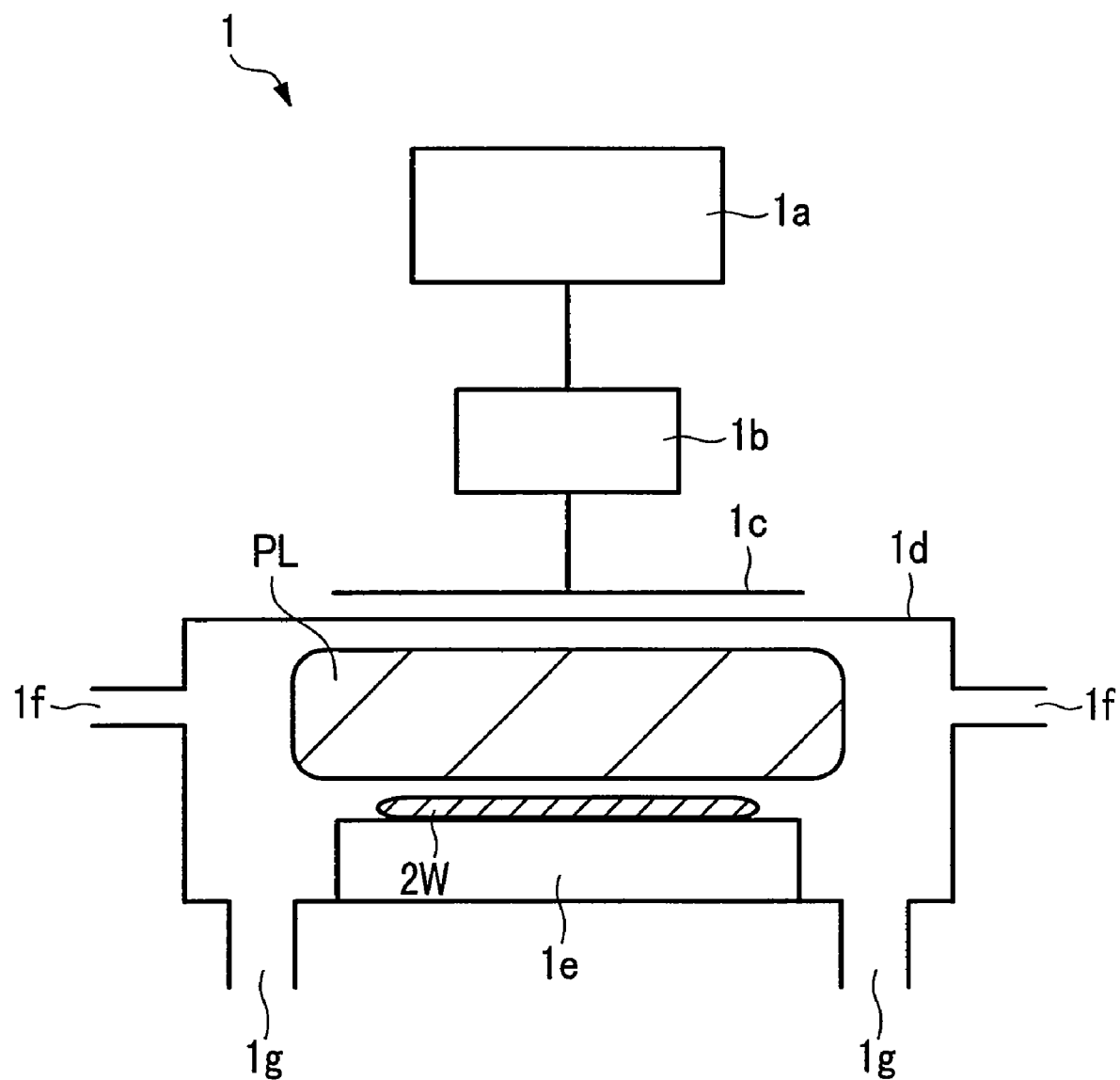
FIG. 11 is an explanatory drawing of an example of the oxygen plasma treatment apparatus used in the method for fabricating a semiconductor device according to an embodiment of the present invention.

Next, FIG. 11 shows an example of a plasma treatment apparatus 1 used in the oxygen plasma treatment in this embodiment. The plasma treatment apparatus 1 has a high frequency power source 1a, a tuner 1b, an antenna 1c, a reaction vessel 1d, a treatment stage 1e, reaction gas inlets 1f, and gas outlets 1g. The high frequency power source 1a is designed to generate the high frequency electromagnetic wave of 2.45 GHz. The high frequency electromagnetic wave generated in the high frequency power source 1a is transmitted through the tuner 1b to the antenna 1c provided outside the reaction vessel 1d. As the antenna 1c, for example, a RLSA (Radial Line Slot Antenna) is used, thereby allowing the circularly-polarized electromagnetic wave to be radiated into the reaction vessel 1d. By the microwave radiated into the reaction vessel 1d from the antenna 1c, plasma PL is generated in the reaction vessel 1d between a main surface of a semiconductor wafer 2W on the treatment stage 1e and the antenna 1c. The semiconductor wafer 2W is placed in a diffusion-plasma region from a plasma excitation region so that the plasma excitation region is separated from the treatment space. In this manner, the treatment that is uniform across the wafer 2W is made no dependence on the patterns on the main surface of the semiconductor wafer 2W. In this apparatus, the energy of the ions radiated to the main surface of the semiconductor wafer 2W is set to about 1 eV or less. Therefore, it is possible to prevent the damage on the main surface of the semiconductor wafer 2W. A heater is provided on the treatment stage 1e and the temperature of the semiconductor wafer 2W during the plasma treatment is controlled to, for example, about 400° C. The treatment gas containing oxygen ($O_2$) as a main gas is supplied through the reaction gas inlets 1f to the space above the main surface of the semiconductor wafer 2W in the reaction vessel 1d. It is also possible to use the structure, in which a shower plate is arranged so as to face to the main surface of the semiconductor wafer 2W and the treatment gas is uniformly supplied through the shower plate to the main surface of the semiconductor wafer 2W. The used treatment gas is uniformly exhausted through the outlets 1g near the semiconductor wafer 2W.

Next, an example of the method for fabricating a semiconductor device in this embodiment will be described with reference to FIGS. 12 to 17. FIGS. 12 to 17 are sectional views showing the principal part of the semiconductor wafer 2W in the fabrication process of the semiconductor device according to the first embodiment. Note that the reference numeral "A1" denotes a thin-film region, "A2" denotes a thick-film region, and "A3" denotes an isolation region, respectively.

Figure 12:
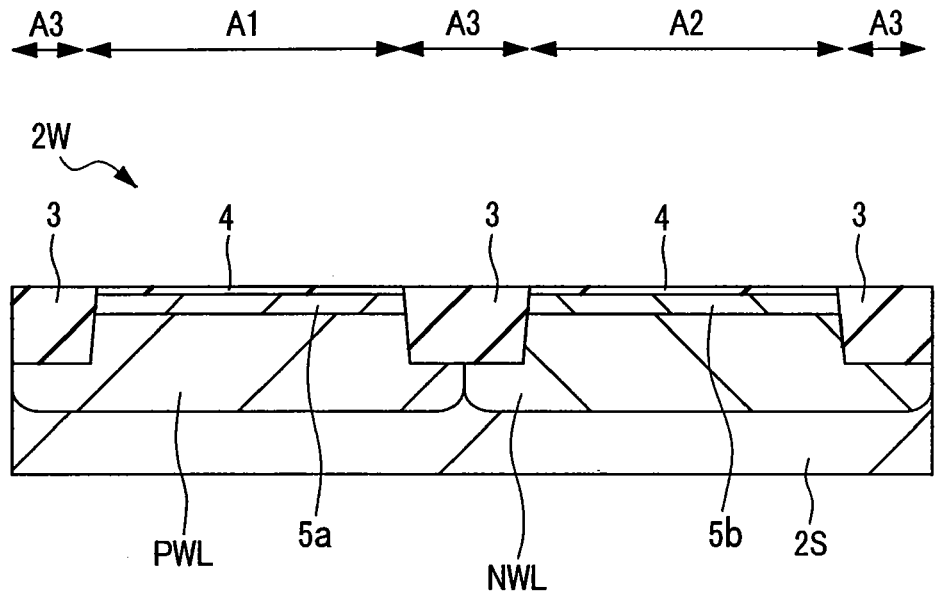
FIG. 12 is a sectional view showing the principal part in the fabrication process of the semiconductor device according to an embodiment of the present invention.

First, as shown in FIG. 12, for example, shallow groove isolations (SGI) or shallow trench isolations (STI) 3 are formed in the isolation regions A3 on a main surface (device forming surface) of the semiconductor substrate (referred to as "substrate", hereinafter) 2S made of p type single crystal silicon (Si), which constitutes the semiconductor wafer 2W having an almost plane circular shape. Subsequently, an insulator 4 made of, for example, silicon oxide is formed, on the active regions surrounded by the device isolations 3 on the main surface of the substrate 2S, by the thermal oxidation method. The insulator 4 has a function to protect the semiconductor wafer 2W in the later-described ion implantation process. Thereafter, the ion implantation for forming a p well PWL and an n well NWL into the substrate 2S through the insulator 4 is performed with using the respective different photoresist patterns as masks. Furthermore, the ion implantation for forming semiconductor regions 5a and 5b functioning to adjust the threshold voltage is performed with using the respective different photoresist patterns as masks.

Figure 13:
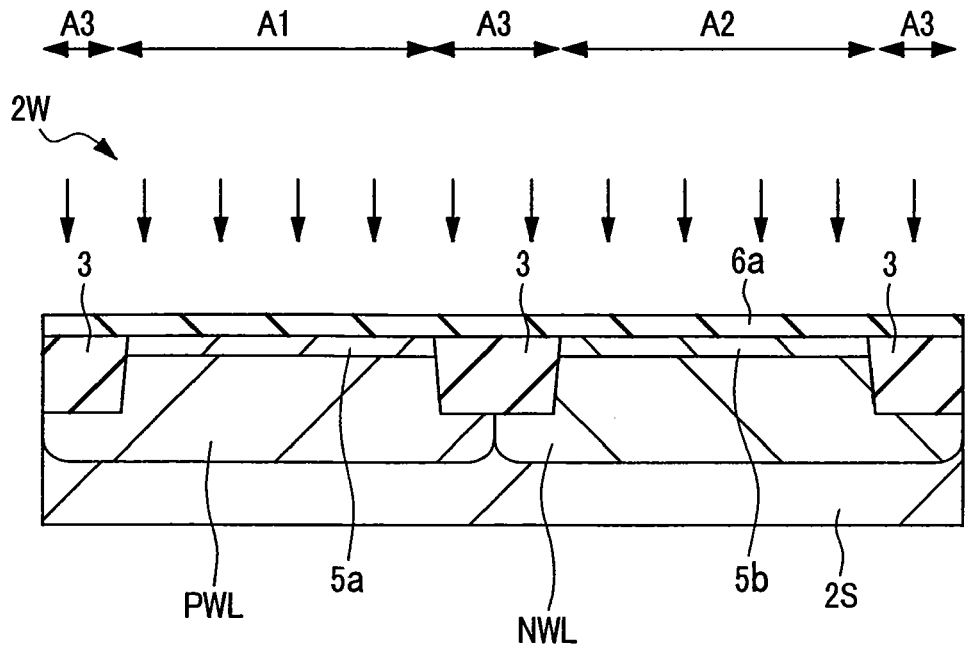
FIG. 13 is a sectional view showing the principal part at the step subsequent to that in FIG. 12 in the fabrication process of the semiconductor device.

Subsequently, after the insulator 4 is removed in the hydrofluoric acid solution, an insulator 6a made of, for example, silicon oxide is deposited on the main surface of the semiconductor wafer 2W by the LPCVD method so as to have about 20 nm in equivalent oxide thickness, as shown in FIG. 13. The insulator 6a is to later be a gate insulator. The treatment temperature when depositing the insulator 6a is, for example, about 800° C. Subsequently, after accommodating the semiconductor wafer 2W in the plasma treatment apparatus 1, the above-mentioned oxygen plasma treatment is performed to the insulator 6a on the main surface of the semiconductor wafer 2W, in the manner as schematically shown by the arrows in FIG. 13. The temperature of the semiconductor wafer 2W during the oxygen plasma treatment is low, for example, a low temperature of about 400° C. In addition, as the treatment gas of the oxygen plasma treatment, the mixed gas ($O_2$/Ar) of a main gas such as oxygen ($O_2$) or the like and a dilution gas such as argon (Ar) or the like is used. The oxygen flow rate in this case is, for example, about 10 cc/min, and the argon flow rate is, for example, 1000 to 2000 cc/min. More specifically, the dilution gas flow rate is set higher than the oxygen gas flow rate (oxygen gas flow rate <dilution gas flow rate). According to the experiment by the inventors, the inventors find out first that if the oxygen flow rate is too high (for example, about 200 cc/min), the failure ratio of the breakdown voltage of gate insulator is increased similar to the above-mentioned case of the high pressure. The reason why the dilution gas is added is that, by adding the molecules (argon in this case, and referred to as "additive molecules") excited (ionized or charged to radicals) rather than the molecules to be easily excited (oxygen in this case, and referred to as "target molecules") in the treatment gas, the target molecules are indirectly excited by the use of the energy of the additive molecules, thereby making it possible to enhance the excitation efficiency of the target molecules and to improve the treatment efficiency.

In addition, it is anticipated that the physical impact of the additive molecules (for example, sputtering) also contributes to the improvement of the film quality of the LPCVD silicon oxide. However, the treatment gas is not limited to the foregoing and can be variously modified and altered. For example, a single component gas of ozone ($O_3$), a single component gas of oxygen ($O_2$), water vapor ($H_2O$), a single component gas of NO, or a single component gas of $N_2O$ is available. In addition, a mixed gas of hydrogen ($H_2$) and oxygen (which forms $H_2O$ in plasma), a mixed gas of water vapor ($H_2O$) and oxygen, a mixed gas of an NO gas and oxygen, or a mixed gas of $N_2O$ and oxygen is also available as the treatment gas. Furthermore, the gas obtained by diluting the above-mentioned single component gas or mixed gas with inert gas (helium (He), argon, krypton (Kr) or xenon (Xe)) is also available. According to the examination by the inventors, from the viewpoint of the improvement of the film quality of the LPCVD silicon oxide, the order of effectiveness as the treatment gas species can be shown as follows. That is, ($H_2$/$O_2$/Ar)=($H_2$/$O_2$/Kr)=($H_2$/$O_2$/He)=($H_2O$/$O_2$/Ar)=($H_2O$/$O_2$/Kr)=($H_2O$/$O_2$/He)=($H_2O$/Ar)=($H_2O$/Kr)=($H_2O$/He)>($O_3$/Ar)=($O_3$/Kr)=($O_3$/He)>($O_2$/Ar)=($O_2$/Kr)=($O_2$/He)>$O_3$>$O_2$>NO>$N_2O$. Note that since the concentration of ozone generated from the current ozone generator is about 10% and the remaining 90% is oxygen, the mixed gas of ozone and oxygen is intentionally excluded from the example of the treatment gas. However, the mixed gas of ozone and oxygen is also available. Also, the pressure in the treatment chamber during the oxygen plasma treatment is set as described above.

By performing such oxygen plasma treatment, the film quality of the insulator 6a formed by the LPCVD method can be improved to the extent equal to that of the silicon oxide formed by the thermal oxidation method, due to the action of the ions and radicals in plasma. In addition, since the irradiation energy of ions in oxygen plasma to the main surface of the semiconductor wafer 2W can be made relatively low (about several eV), the damages to the main surface of the semiconductor wafer 2W and the insulator 6a can be reduced, thereby allowing the treatment for improving the insulator 6a to be performed.

Figure 14:
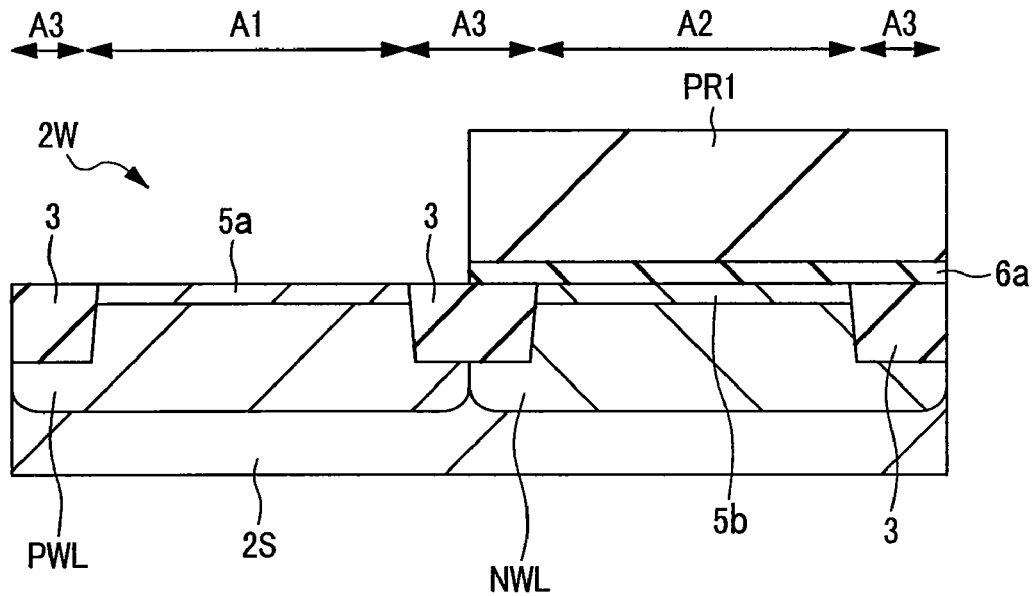
FIG. 14 is a sectional view showing the principal part at the step subsequent to that in FIG. 13 in the fabrication process of the semiconductor device.

Next, as shown in FIG. 14, a photoresist pattern (referred to as "resist pattern", hereinafter) PR1, which has an opening for the thin-film region A1 and covers the thick-film region A2 and at least a part of the isolation region A3 around the region A2, is formed. Thereafter, the insulator 6a exposed from the resist pattern PR1 is removed in the hydrofluoric acid solution. Since the insulator 6a is formed in the isolation region 3 not covered with the resist pattern PR1, it is possible to reduce or prevent the removal and the recession of the exposed upper portion of a filling insulator of the device isolation 3. If the upper portion of the device isolation 3 is receded, the substrate 2S on the side of the upper portion of the trench in the device isolation 3 is exposed and a thin thermal oxide with a thickness of about 8 nm is inevitably formed on the exposed portion by the subsequent thermal oxidation treatment. Furthermore, the impurity for controlling the threshold voltage is not implanted to the substrate 2S on the side of the upper portion of the trench exposed by the recession of the device isolation 3. Therefore, if the gate electrode is overlapped on the side of the upper portion of the trench, a threshold voltage of the MIS is decreased and an off current is increased. As a result, the problem of the degradation of the switching characteristics of the MIS occurs. In contrast, since the recession of the upper portion of the device isolation 3 can be reduced or prevented in this embodiment, it is possible to significantly improve the switching characteristics of the MIS.

Subsequently, a cleaning process is performed after the removal of the resist pattern PR1 by an ashing method. In this case, although the insulator 6a is formed by the above-mentioned LPCVD method, since the film quality of the insulator 6a is improved to the extent equal to that of the thermal oxide by performing the oxygen plasma treatment to the insulator 6a in the first embodiment, it is possible to reduce or prevent the etching of and the damage to the insulator 6a to be the gate insulator of the MIS in the thick-film region, during the cleaning process after the removal of the resist pattern. Thus, the formation of the insulator 6a, having the film quality equal to that of the thermal oxide in the device isolation 3, plays important roles in reducing the recession amount of the filling insulator in the device isolation 3 and in preventing the undesirable change of the switching characteristics of the MIS.

Figure 15:
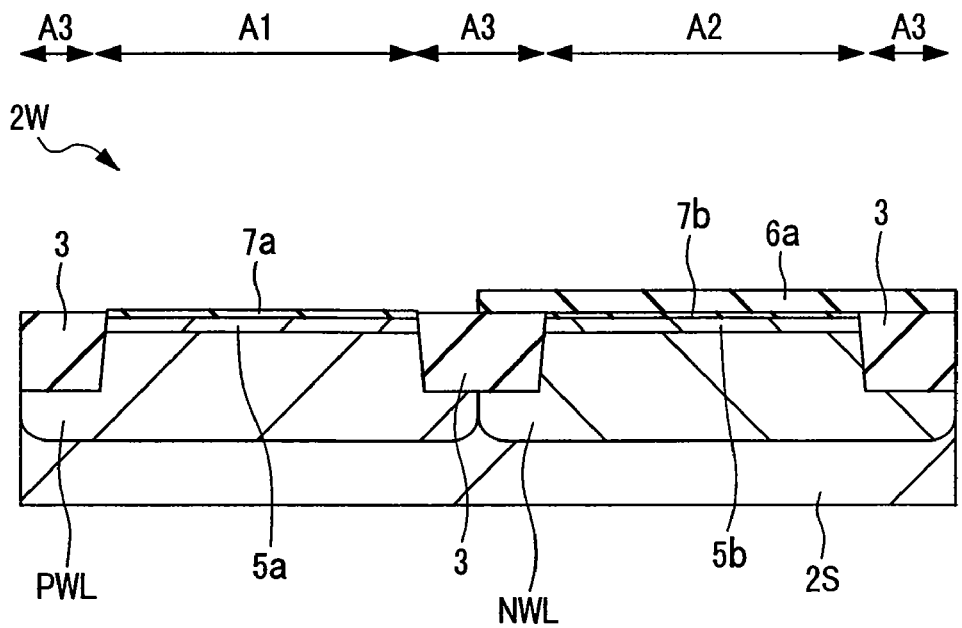
FIG. 15 is a sectional view showing the principal part at the step subsequent to that in FIG. 14 in the fabrication process of the semiconductor device.

Next, the thermal oxidation treatment is performed to the semiconductor wafer 2W so that a silicon oxide with about 8 nm in equivalent oxide thickness can be formed on the exposed surface of the substrate 2S. By so doing, an insulator 7a made of, for example, silicon oxide with about 8 nm in equivalent oxide thickness is formed in the thin-film region A1 as shown in FIG. 15. At this time, an insulator 7b made of, for example, silicon oxide with about 5 nm in equivalent oxide thickness is simultaneously formed at the interface of the substrate 2S, which comes into contact with the insulator 6a in the thick-film region A2. More specifically, by the above thermal oxidation treatment, the total thickness of the insulators 6a and 7b on the substrate 2S in the thick-film region A2 becomes about 25 nm, for example, in equivalent oxide thickness. The insulator 7a is a gate insulator of the MIS in the thin-film region A1, and the laminated film of the insulators 6a and 7b is a gate insulator of the MIS in the thick-film region A2.

Figure 16:
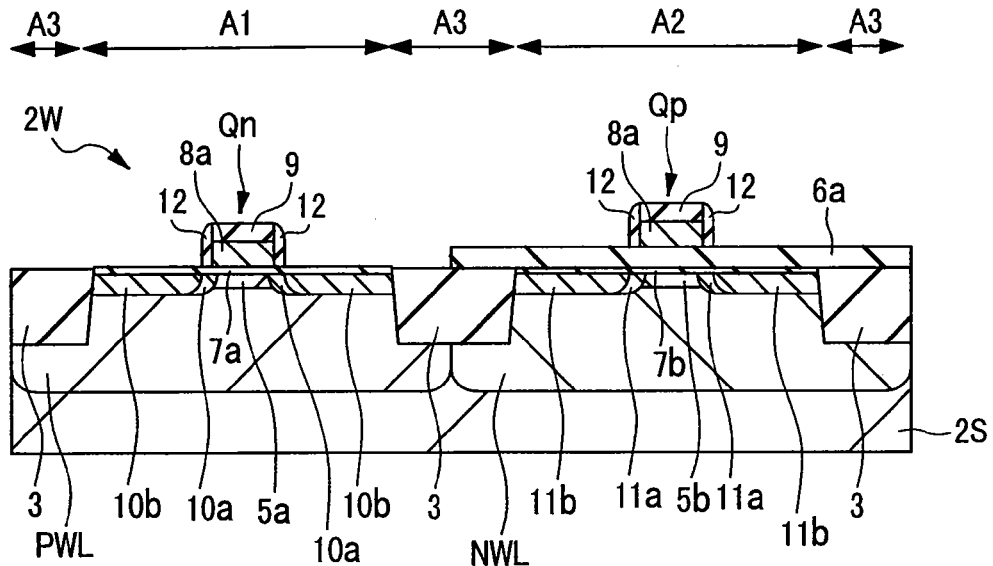
FIG. 16 is a sectional view showing the principal part at the step subsequent to that in FIG. 15 in the fabrication process of the semiconductor device.

Subsequently, gate electrodes 8a and cap insulators 9 are formed as shown in FIG. 16. Each of the gate electrodes 8a in the thin-film region A1 and the thick-film region A2 is formed by patterning the same polycrystalline silicon film by the use of the photolithography (referred to as "lithography", hereinafter) technique and the dry etching technique. Each cap insulator 9 is made of, for example, silicon oxide and is patterned in the same pattering process as that of each gate electrode 8a. Thereafter, the ion implantation for forming semiconductor regions 10a and 11a with relatively low impurity concentration is performed with using the respective different resist patterns as masks. The semiconductor region 10a becomes n type by the introduction of, for example, phosphorus (P) or arsenic (As), and the semiconductor region 11a becomes p type by the introduction of, for example, boron (B) or boron difluoride ($BF_2$). Thereafter, an insulator made of, for example, silicon oxide is deposited on the main surface of the semiconductor wafer 2W by the CVD method or the like. Then, the deposited insulator is etched back by the anisotropic etching, and sidewalls 12 are formed on the side surfaces of the gate electrodes 8a and the cap insulators 9. Thereafter, the ion implantation for forming semiconductor regions 10b and 11b with relatively high impurity concentration is performed with using the respective different resist patterns as masks. The semiconductor region 10b becomes $n^+$ type by the introduction of, for example, phosphorus or arsenic, and the semiconductor region 11b becomes $p^+$ type by the introduction of, for example, boron or boron difluoride. In this manner, the semiconductor regions 10a, 10b, 11a, and 11b to be the sources and drains, which constitute a LDD (Lightly Doped Drain) structure, are formed and, for example, an nMIS Qn is formed in the thin-film region A1 and a pMIS Qp is formed in the thick-film region A2. The MIS, driven by a relatively low power supply voltage and requiring a relatively high speed operation, is shown as an example of the nMIS Qn, and the MIS, driven by a relatively high power supply voltage and not requiring a high speed operation, is shown as an example of the pMIS Qp. However, since this is really just an example, the PMIS may be formed in the thin-film region A1 and/or the nMIS may be formed in the thick-film region A2.

Figure 17:
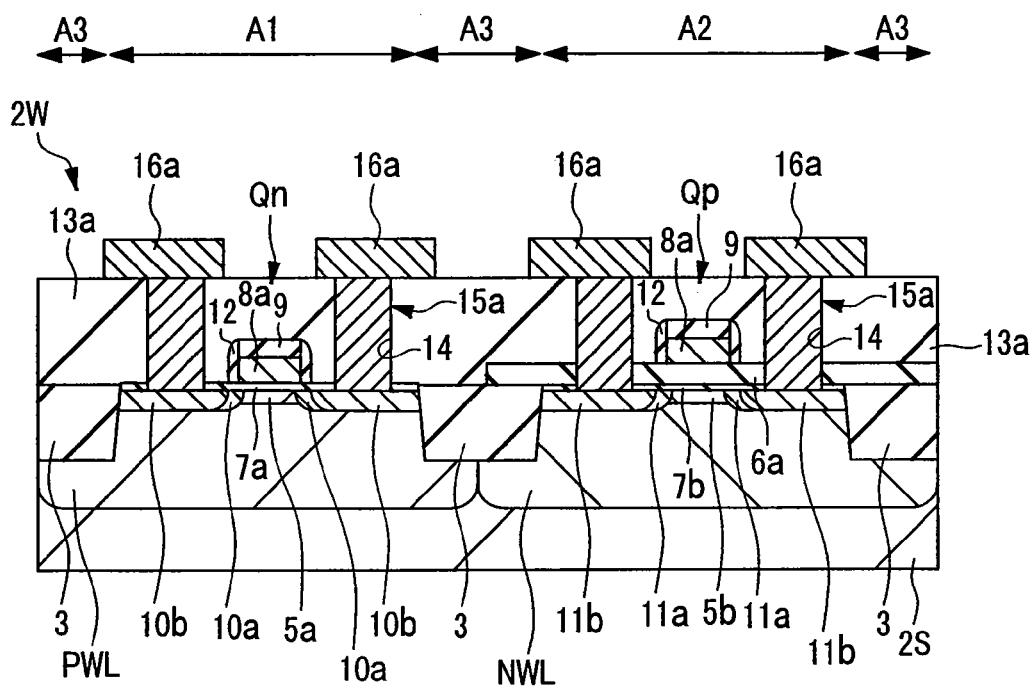
FIG. 17 is a sectional view showing the principal part at the step subsequent to that in FIG. 16 in the fabrication process of the semiconductor device.

Next, as shown in FIG. 17, after an insulator 13a made of, for example, silicon oxide is deposited on the main surface of the semiconductor wafer W2 by the CVD method or the coating method, contact holes 14 for exposing each part of the semiconductor regions 10b and 11b and the gate electrodes 8a are formed in the insulator 13a. Thereafter, after a relatively thin conductor film made of, for example, titanium nitride (TiN) or the like is deposited on the main surface of the semiconductor wafer 2W, a relatively thick metal film made of tungsten or the like is deposited thereon. Further, the laminated film thereof is removed by the etch back method or the CMP (Chemical Mechanical Polishing) method so as to leave the laminated film only in the contact holes 14 to form plugs 15a in the contact holes 14. Thereafter, a metal film made of, for example, aluminum (Al) or aluminum alloy is deposited on the main surface of the semiconductor wafer 2W by the sputtering method, and then the deposited metal film is patterned by the lithography technique and the dry etching technique to form each wiring 16a. In this manner, a semiconductor device, in which the nMIS Qn and the pMIS Qp respectively having gate insulators different in thickness are formed over the same substrate 2S, is completed.

Thus, in the first embodiment, the degradation of the reliability of gate insulator (breakdown voltage of gate insulator) inherent in the silicon oxide, formed by the LPCVD method, is improved to such a level that no problem arises by performing the above-mentioned oxygen plasma treatment. In addition, since the thick gate insulator is formed without oxidizing the substrate 2S too much, it is possible to significantly reduce the oxidation amount of the sidewalls of the trenches in the device isolations 3 and to reduce the number of crystal defects to such an extent that no problem arises. In addition, since the formation and the reforming of the gate insulator of the MIS in the thick-film region A2 can be made under the relatively low temperature condition (800° C. or lower), it is possible to reduce or prevent the rediffusion of the impurity already introduced to the substrate 2S and to achieve the more desirable impurity concentration profile. In addition, since the irradiation energy of the ions in oxygen plasma to the main surface of the semiconductor wafer 2W can be set relatively low (about several eV), the damages to the main surface of the semiconductor wafer 2W and the insulator 6a can be reduced and the treatment for improving the insulator 6a can be performed. Furthermore, since the thickness of the filling insulator of the device isolation 3 can be maintained at the value before the process for forming the gate insulator, the recession of the filling insulator in the device isolation 3 can be reduced in comparison to the conventional case. As a result, it is possible to significantly improve the switching characteristics of the MIS. Therefore, the reliability and the performance of the semiconductor device can be improved.

It is needless to say that, since the whole film is not reformed if the oxygen plasma treatment is insufficient, the desirable insulation reliability cannot be obtained. However, if the oxygen plasma treatment is too excessive, the insulation reliability is degraded. These are found out first by the examination by the inventors. Therefore, it is desirable in this embodiment that when the oxygen plasma treatment is performed without forming any film on the main surface of the substrate 2S, the thickness of the silicon oxide (equivalent oxide thickness) formed over the main surface of the substrate 2S is made approximately equal to that of the silicon oxide (insulator 6a) deposited to have a thickness of about 20 nm (equivalent oxide thickness).

Second Embodiment

Figure 18:
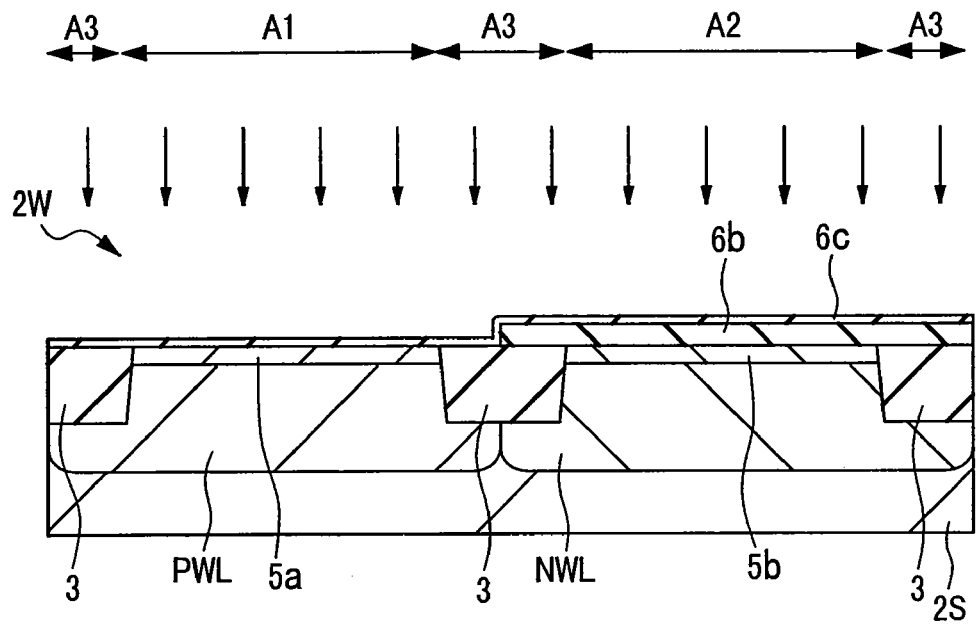
FIG. 18 is a sectional view showing the principal part in the fabrication process of the semiconductor device according to another embodiment of the present invention.
Figure 19:
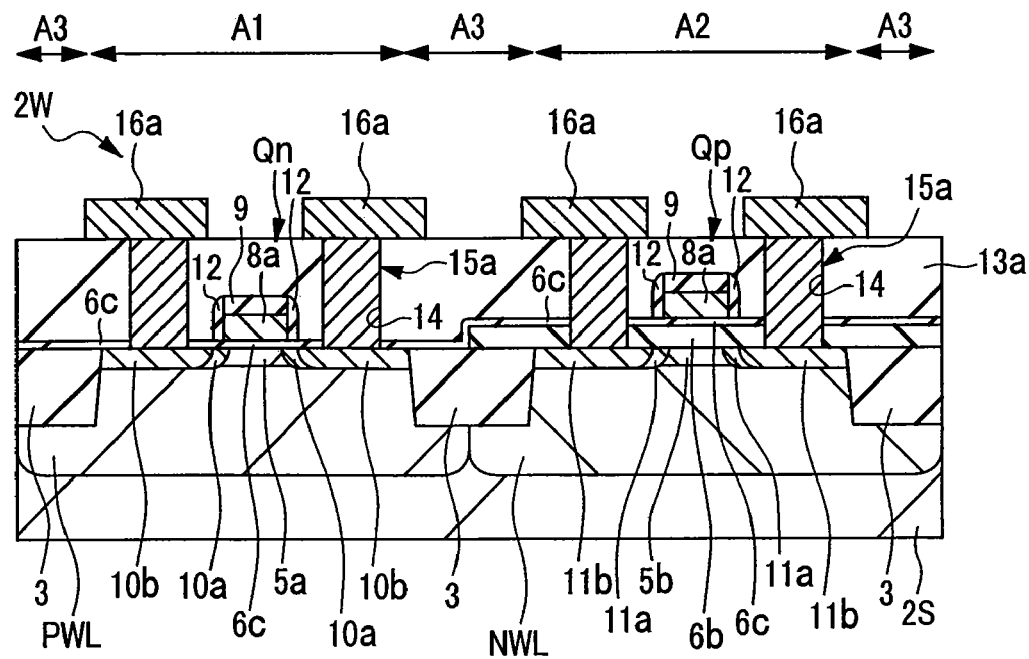
FIG. 19 is a sectional view showing the principal part at the step subsequent to that in FIG. 18 in the fabrication process of the semiconductor device.

In the second embodiment, an example of the case where the gate insulator in the thin-film region is also formed of the CVD oxide film will be described with reference to FIGS. 18 and 19. FIGS. 18 and 19 are sectional views showing the principal part of the semiconductor wafer 2W in the fabrication process of the semiconductor device according to the second embodiment.

First, after the process of removing the insulator 4 shown in FIG. 12 in the first embodiment, as shown in FIG. 18, an insulator 6b made of, for example, silicon oxide is deposited on the main surface of the semiconductor wafer 2W by the LPCVD method to have about 16 nm in equivalent oxide thickness, and, further, the oxygen plasma treatment similar to that described with reference to FIG. 13 is performed to the insulator 6b. By so doing, the film quality of the insulator 6b formed by the LPCVD can be improved to be equal to that of the silicon oxide formed by the thermal oxidation.

Next, similarly to the insulator 6a in the first embodiment, a resist pattern, which has an opening in the thin-film region A1 and covers the thick-film region A2 and at least a part of the isolation region A3 around the region A2, is formed. Thereafter, the insulator 6b exposed from the resist pattern is removed in the hydrofluoric acid solution. Also in this case, since the insulator 6a is formed in the isolation region 3 not covered with the resist pattern PR1, it is possible to reduce or prevent the removal and the recession of the upper portion of the filling insulator in the exposed device isolation 3 during the etching process. Therefore, it is possible to significantly improve the switching characteristics of the MIS. Subsequently, the cleaning process is performed, after the resist pattern used as a mask in patterning the insulator 6b is removed by the ashing method. Also in this case, similarly to the first embodiment, since the film quality of the insulator 6b is reformed to the extent equal to that of the thermal oxide by performing the oxygen plasma treatment, it is possible to reduce or prevent the etching of and the damages to the insulator 6b to be the gate insulator of the MIS in the thick-film region, during the cleaning process after the removal of the resist pattern. Thereafter, an insulator 6c made of, for example, silicon oxide is deposited on the main surface of the semiconductor wafer 2W by the LPCVD method or the like to have about 8 nm in equivalent oxide thickness. In this case, the insulator 6c is deposited also on the device isolation 3. Therefore, even if the upper portion of the device isolation 3 is slightly removed and receded by the patterning of the insulator 6b and/or the cleaning process of the resist pattern, the recession can be repaired by the insulator 6c. Consequently, it is possible to further improve the switching characteristics of the MIS. Thereafter, the oxygen plasma treatment similar to that described with reference to FIG. 13 is performed to the insulator 6c in the manner as schematically shown by the arrows in FIG. 18. By so doing, the film quality of the insulator 6c formed by the LPCVD method can be improved to be equal to that of the silicon oxide formed by the thermal oxidation. In addition, since the forming and the reforming of the insulator 6c can be made under the relatively low temperature condition, it is possible to reduce or prevent the rediffusion of the impurity already introduced to the substrate 2S and to achieve the more desirable impurity concentration profile. In addition, since the irradiation energy of the ions in oxygen plasma to the main surface of the semiconductor wafer 2W can be set relatively low (about several eV), the damages to the main surface of the semiconductor wafer 2W and the insulator 6c can be reduced, thereby allowing the treatment for improving the insulator 6c to be performed. Consequently, it is possible to improve the reliability and the performance of the device. The total thickness of the insulators in the thick-film region A2, after the oxygen plasma treatment, is about 25 nm in equivalent oxide thickness. Thereafter, as shown in FIG. 19, a semiconductor device, in which the nMIS Qn and the pMIS Qp respectively having gate insulators different in thickness are formed on the same substrate 2S, is completed in the same manner as that of the first embodiment. The gate insulator of the nMIS Qn in the thin-film region A1 is mainly composed of the insulator 6c formed by the LPCVD method, and the thickness of the gate insulator is, for example, about 8 to 9 nm in equivalent oxide thickness. Also, the gate insulator of the pMIS Qp in the thick-film region A2 is mainly composed of the laminated film of the insulators 6b and 6c formed by the LPCVD method, and the thickness of the gate insulator is, for example, about 25 nm in equivalent oxide thickness.

Thus, the following effects can be obtained in the second embodiment besides those in the first embodiment. That is, the crystal defects can be further reduced in comparison to the first embodiment because the sidewalls of the trenches in the device isolation 3 are scarcely oxidized. In addition, since the thickness of the filling insulator in the device isolation 3 is increased in comparison to that before forming the gate oxide film and the recession of the filling insulator can be reduced in comparison to that in the first embodiment, it is possible to make the switching characteristics of the MIS more appropriate.

Third Embodiment

Figure 20:
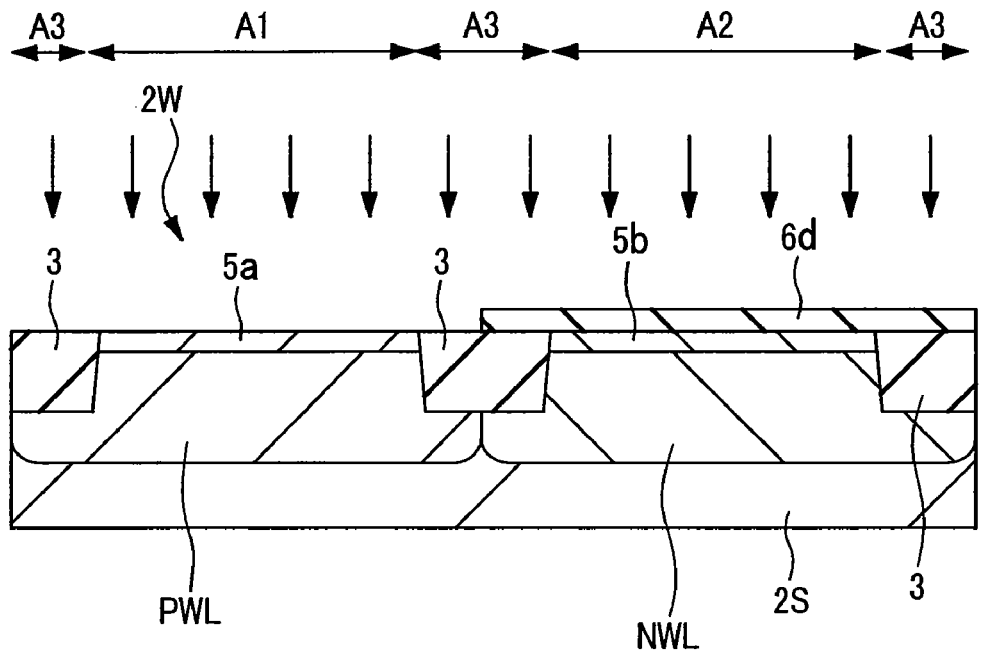
FIG. 20 is a sectional view showing the principal part in the fabrication process of the semiconductor device according to another embodiment of the present invention.
Figure 21:
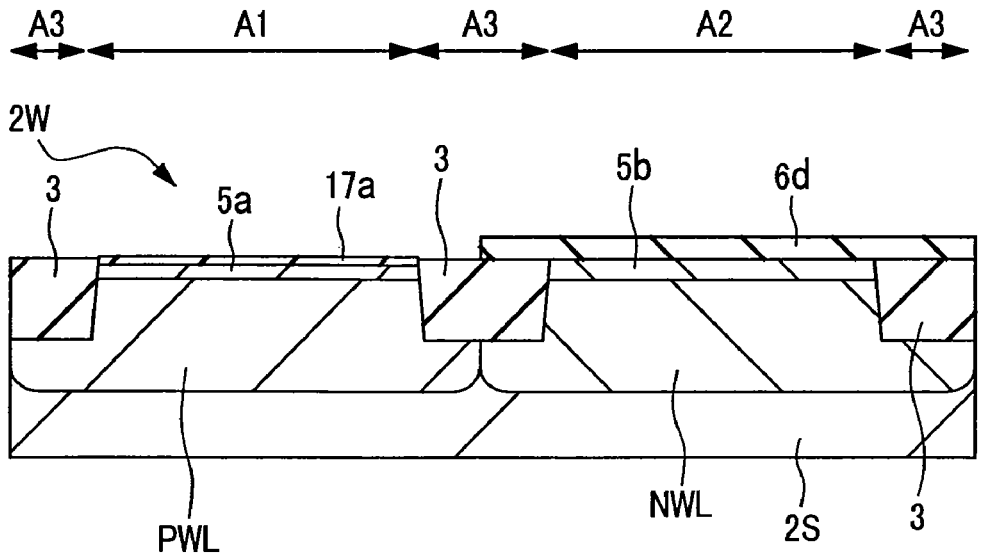
FIG. 21 is a sectional view showing the principal part at the step subsequent to that in FIG. 20 in the fabrication process of the semiconductor device.
Figure 22:
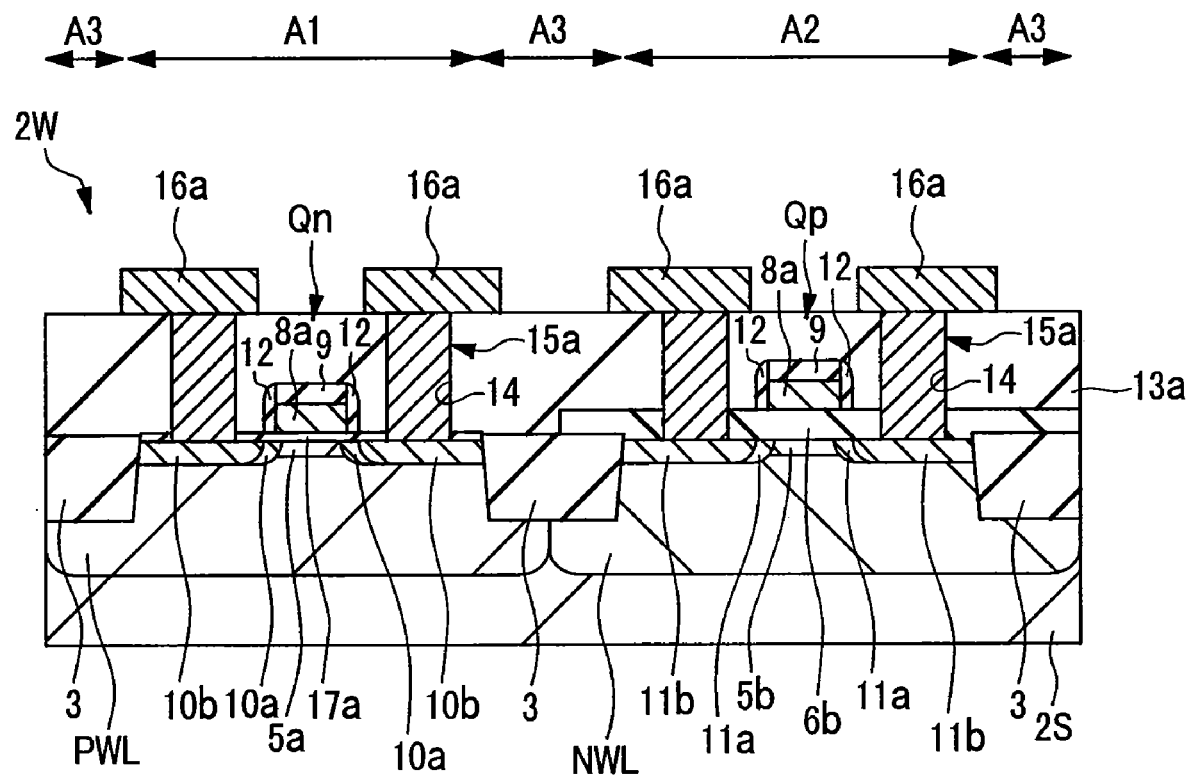
FIG. 22 is a sectional view showing the principal part at the step subsequent to that in FIG. 21 in the fabrication process of the semiconductor device.

In a third embodiment, an example of the case where the gate insulator in the thin-film region is formed by the above oxygen plasma treatment will be described with reference to FIGS. 20 to 22. FIGS. 20 to 22 are sectional views showing the principal part of the semiconductor wafer 2W in the fabrication process of the semiconductor device according to the third embodiment.

First, after the process of removing the insulator 4 shown in FIG. 12 in the first embodiment, as shown in FIG. 20, an insulator 6d made of, for example, silicon oxide 6d is deposited on the main surface of the semiconductor wafer 2W by the LPCVD method to have about 24 nm in equivalent oxide thickness. Subsequently, after forming a resist pattern with an opening in the thin-film region A1, the insulator 6d is selectively removed in the hydrofluoric acid solution with using the resist pattern as an etching mask. Thereafter, after removing the resist pattern and performing the cleaning process, the oxygen plasma treatment is performed in the manner as schematically shown by the arrows in FIG. 20. By so doing, an insulator 17a made of silicon oxide with about 8 nm in equivalent oxide thickness is formed on the exposed main surface of the substrate 2S in the thin-film region A1, as shown in FIG. 21. At this time, similarly to the first and second embodiments, the film quality of the insulator 6d to be a gate insulator in the thick-film region A2 can be improved. Furthermore, since the formation and the reforming of the insulator 6d can be made under the relatively low temperature condition, it is possible to achieve the more desirable impurity concentration profile of the impurity already introduced to the substrate 2S. In addition, since the irradiation energy of the ions in oxygen plasma to the main surface of the semiconductor wafer 2W can be set relatively low (about several eV), the damages to the main surface of the semiconductor wafer 2W and the insulator 6d can be reduced and the treatment for improving the insulator 6d can be performed. Consequently, it is possible to improve the reliability and the performance of the device. The thickness of the gate insulator, formed in the thick-film region A2, is scarcely increased by the oxygen plasma treatment, and eventually becomes about 25 nm in equivalent oxide thickness.

Thereafter, as shown in FIG. 22, a semiconductor device, in which the nMIS Qn and the pMIS Qp having respective gate insulators different in thickness are formed on the same substrate 2S, is completed in the same manner as that of the first embodiment. The gate insulator of the nMIS Qn in the thin-film region A1 is mainly composed of the insulator 17a formed by the oxygen plasma treatment, and the thickness of the gate insulator is, for example, about 8 nm in equivalent oxide thickness. Also, the gate insulator of the PMIS Qp in the thick-film region A2 is mainly composed of the laminated film of the insulator 6d formed by the LPCVD method and the insulator formed by the oxygen plasma treatment, and the thickness of the gate insulator is, for example, about 25 nm in equivalent oxide thickness.

The effects similar to those in the first embodiment can be obtained in the third embodiment. More particularly, unlike the first and second embodiments, though the plasma treatment is not performed after forming the silicon oxide by the LPCVD method, the insulation reliability approximately equal to that of the thermal oxide can be realized in the third embodiment. This is because the oxygen plasma treatment for forming the thin-film region A1 fills the role of the oxygen plasma treatment performed just after the formation of the LPCVD silicon oxide in the first and second embodiments. However, in removing the resist pattern which protects the silicon oxide (insulator 6d in the third embodiment) in the thick-film region A2, the cleaning process, which inevitably etches some of the underlying silicon oxide, is performed in many cases. Therefore, it is desirable for the achievement of the object of this embodiment that, in order to prevent the damages to the underlying silicon oxide by the etching, at least light oxygen plasma treatment is performed to the silicon oxide (insulator 6d) before forming the resist pattern similarly to the first and second embodiments and the film quality in the surface region of the silicon oxide (insulator 6d) is improved.

Fourth Embodiment

In a fourth embodiment, an example of the method for fabricating the semiconductor device, which has the step of forming a protection film on a gate insulator in the thick-film region, will be described with reference to FIGS. 23 to 26. FIGS. 23 to 26 are sectional views showing the principal part of the semiconductor wafer 2W in the fabrication process of the semiconductor device according to the fourth embodiment.

Figure 23:
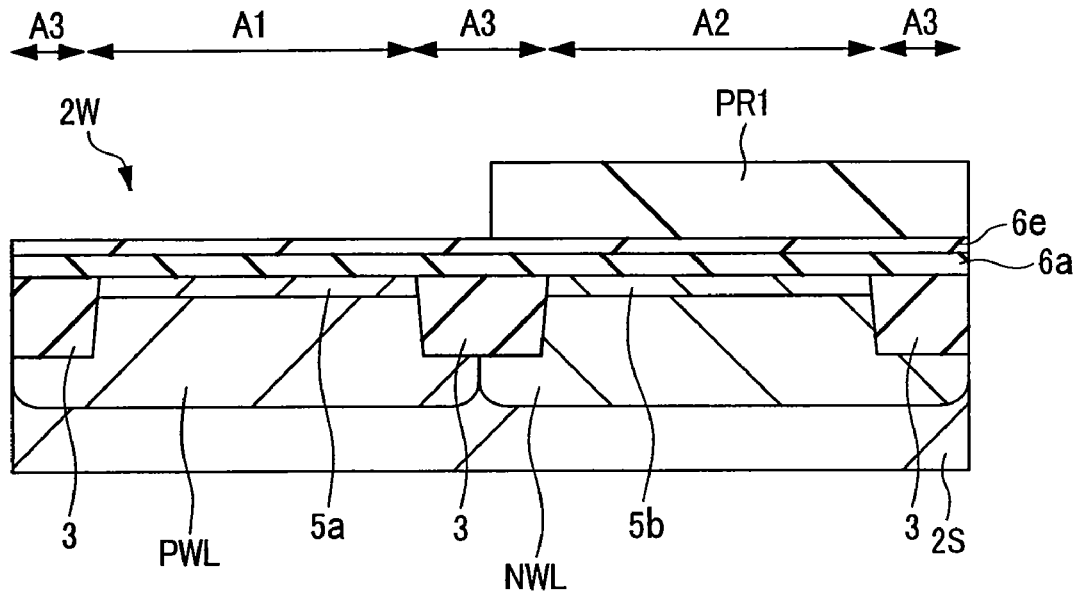
FIG. 23 is a sectional view showing the principal part in the fabrication process of the semiconductor device according to another embodiment of the present invention.
Figure 24:
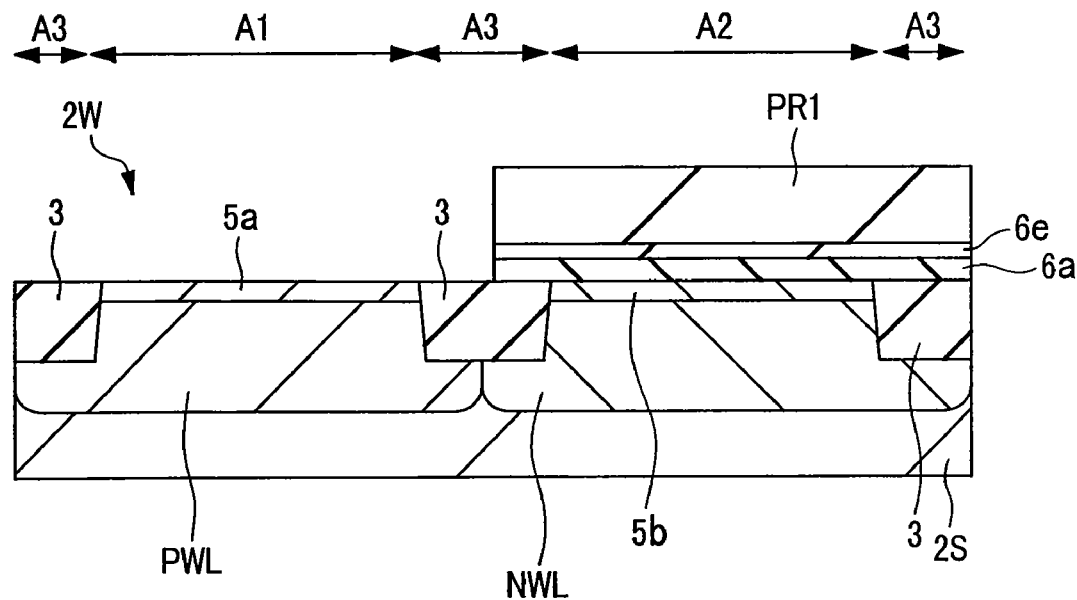
FIG. 24 is a sectional view showing the principal part at the step subsequent to that in FIG. 23 in the fabrication process of the semiconductor device.

First, as shown in FIG. 23, after the process of depositing the insulator 6a on the main surface of the semiconductor wafer 2W and performing the oxygen plasma treatment to the insulator 6a (see FIG. 13) in the same manner as that of the first embodiment, an insulator 6e made of, for example, silicon oxide is formed on the insulator 6a by the LPCVD method so as to have about 13 nm in equivalent oxide thickness. Subsequently, as shown in FIG. 24, a resist pattern PR1, which has an opening in the thin-film region A1 and covers the thick-film region A2 and at least a part of the isolation region A3 around the region A2, is formed. In the fourth embodiment, the plane shape of the resist pattern PR1 is the same as that of the first embodiment. However, the resist pattern PR1 in this case is formed so as not to come into direct contact with the insulator to later be the gate insulator 6a and so as to come into direct contact with the insulator 6e thereon. Therefore, since the pollution of the gate insulator (insulator 6a) caused due to the resist pattern PR1 can be reduced or prevented, it is possible to improve the reliability and the performance of the MIS in the thick-film region A2. Thereafter, the insulators 6e and 6a exposed from the resist pattern PR1 are removed in the hydrofluoric acid solution. Since the insulator 6a is formed in the isolation region 3 also in patterning the insulators 6a and 6e similarly to the first embodiment, it is possible to reduce or prevent the removal and the recession of the exposed upper portion of the filling insulator in the device isolation 3 during the etching process. Therefore, it is possible to significantly improve the switching characteristics of the MIS.

Figure 25:
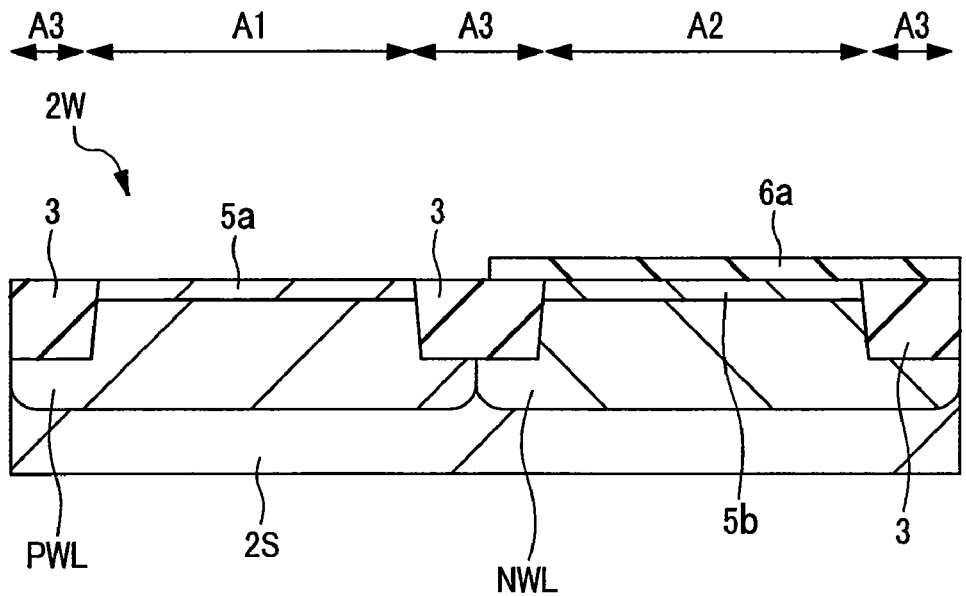
FIG. 25 is a sectional view showing the principal part at the step subsequent to that in FIG. 24 in the fabrication process of the semiconductor device.

Subsequently, the resist pattern PR1 is removed by the ashing method or the like, as shown in FIG. 25. At this time, according to the fourth embodiment, since the insulator 6e is formed on the insulator 6a to later be a gate insulator and protects the underlying insulator 6a, it is possible to reduce or prevent the etching of and the damages to the insulator 6a during the removing of the resist pattern PR1. Therefore, it is possible to improve the reliability and the performance of the MIS in the thick-film region A2. Thereafter, the insulator 6e is removed in the hydrofluoric acid solution, in which the cleaning process is also performed. In this case, for securing the insulation reliability in the thick-film region A2, it is important to make the etching amount of the underling insulator 6a as small as possible within such a range that the insulator 6e does not remain. Both the insulators 6a and 6e are silicon oxide formed by the LPCVD method. However, the film quality of the insulator 6a is improved to the extent almost equal to that of the thermal oxide by the oxygen plasma treatment. Meanwhile, since the oxygen plasma treatment is not performed to the insulator 6e, the etching rate thereof is relatively high. More specifically, the insulators 6a and 6e are originally the same LPCVD silicon oxide, but can each obtain the high etching selectivity. Therefore, in the fourth embodiment, it is possible to minimize the etching amount of and the damages to the insulator 6a in etching the insulator 6e. Note that if the deposition of the insulator 6e is performed at the temperature lower than that of the insulator 6a, the higher etching selectivity can be obtained, whereby the etching amount of and the damages to the insulator 6a can be further reduced.

Figure 26:
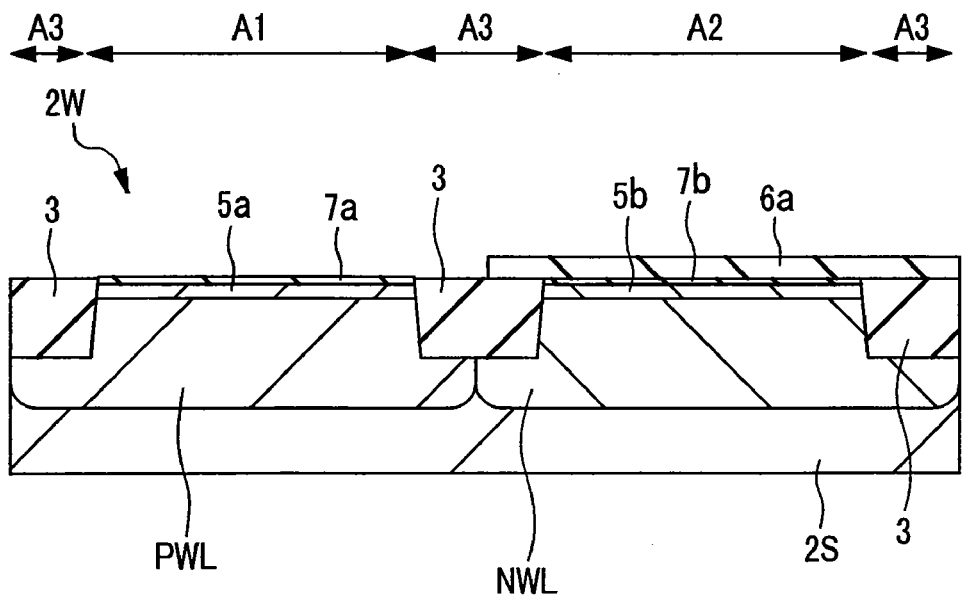
FIG. 26 is a sectional view showing the principal part at the step subsequent to that in FIG. 25 in the fabrication process of the semiconductor device.

Thereafter, similarly to the first embodiment, the thermal oxidation treatment is performed to the semiconductor wafer 2W so that a silicon oxide with, for example, an about 8 nm in equivalent oxide thickness can be formed on the exposed main surface of the substrate 2S. By so doing, an insulator 7a made of silicon oxide with, for example, about 8 nm in equivalent oxide thickness is formed in the thin-film region A1, as shown in FIG. 26. At this time, an insulator 7b made of silicon oxide with, for example, about 5 nm in equivalent oxide thickness is simultaneously formed at the interface of the substrate 2S, which comes into contact with the insulator 6a in the thick-film region A2. Thus, the semiconductor device similar to that shown in FIG. 17 is completed.

It is needless to say that the formation of the insulator 6e with such protection function can exert the same effect in the other embodiments of the present invention. However, when the above-mentioned insulator 6e is formed in the third embodiment, it is important to perform the oxygen plasma treatment to the insulator 6d after forming the insulator 6d. This can minimize the thickness reduction of and the damages to the insulator 6d caused due to the etching in removing the insulator 6e.

Fifth Embodiment

In a fifth embodiment, an example of the fabrication process will be described with reference to FIGS. 27 to 31, in which, when the gate insulator in the thick-film region is formed by the CVD method, the deposition process of the insulator is performed in several steps and the oxygen plasma treatment is performed in each step. FIGS. 27 to 31 are sectional views showing the principal part of the semiconductor wafer 2W in the fabrication process of the semiconductor device according to the fifth embodiment.

Figure 27:
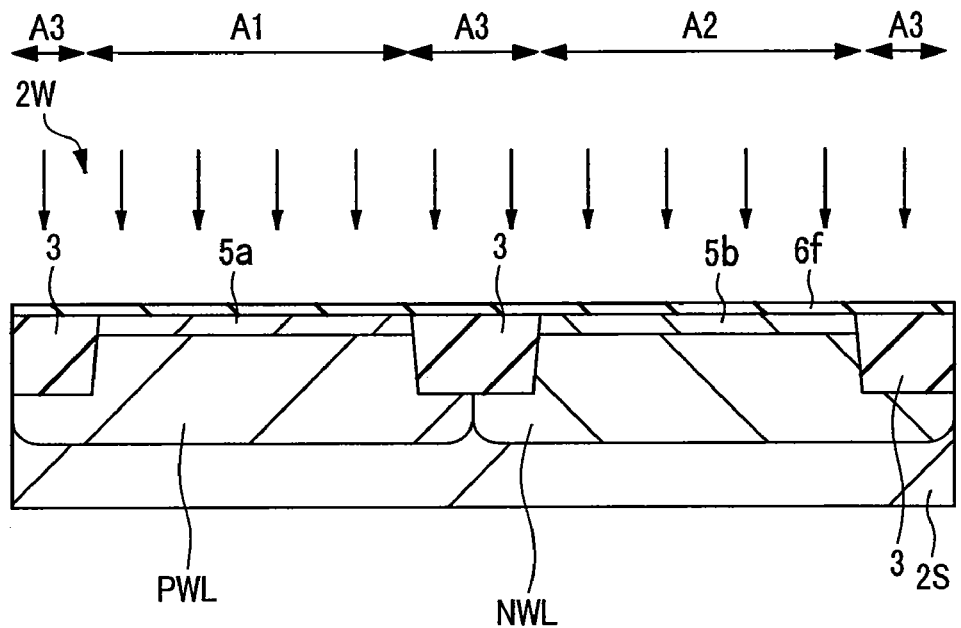
FIG. 27 is a sectional view showing the principal part in the fabrication process of the semiconductor device according to another embodiment of the present invention.
Figure 28:
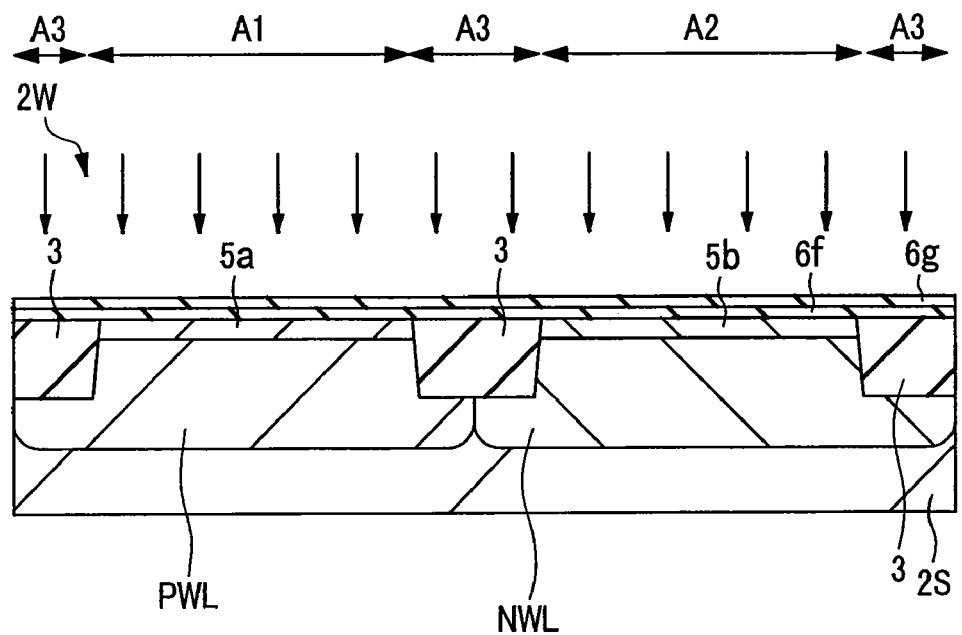
FIG. 28 is a sectional view showing the principal part at the step subsequent to that in FIG. 27 in the fabrication process of the semiconductor device.

First, after the process of removing the insulator 4 shown in FIG. 12 in the first embodiment, an insulator 6f made of, for example, silicon oxide is deposited on the main surface of the semiconductor wafer 2W by the LPCVD method so as to have about 10 nm in equivalent oxide thickness, as shown in FIG. 27. Subsequently, the oxygen plasma treatment is performed to the insulator 6f and, similarly to the first to fourth embodiments, the film quality of the insulator 6f is reformed to be almost equal to that of the thermal oxide. Thereafter, as shown in FIG. 28, an insulator 6g made of, for example, silicon oxide is formed again on the insulator 6f by the LPCVD method so as to have about 10 nm in equivalent oxide thickness. Then, the oxygen plasma treatment is performed to the insulator 6g and, similarly to the first to fourth embodiments, the film quality of the insulator 6g can be reformed to be almost equal to that of the thermal oxide. Thus, to form the gate insulator, the laminated film of the insulators 6f and 6g with the desirable thickness is formed in the thick-film region A2.

Figure 29:
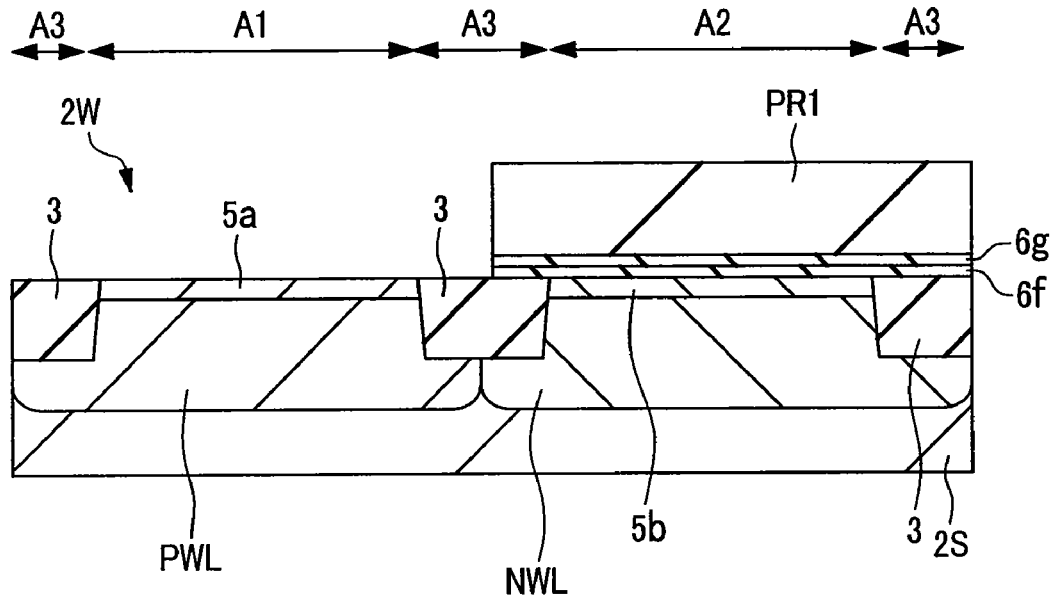
FIG. 29 is a sectional view showing the principal part at the step subsequent to that in FIG. 28 in the fabrication process of the semiconductor device.

Next, similarly to the first embodiment, the resist pattern PR1 is formed on the insulator 6g, as shown in FIG. 29, and then the laminated film of the insulators 6g and 6f exposed from the resist pattern PR1 is removed in the hydrofluoric acid solution. At this time, similarly to the first embodiment, it is possible to reduce or prevent the recession of the upper portion of the filling insulator in the exposed device isolation 3, thereby allowing the switching characteristics of the MIS to be significantly improved. Subsequently, the cleaning process is performed after the resist pattern PR1 is removed by the ashing method. At this time, similarly to the first embodiment, since the film qualities of the insulators 6f and 6g are improved to the extent almost equal to that of the thermal oxide, it is possible to reduce or prevent the etching of and the damages to the insulators 6f and 6g to later be the gate insulator of the MIS in the thick-film region. Also, similarly to the first embodiment, it is possible to reduce or prevent the recession of the upper portion of the filling insulator in the device isolation 3, thereby allowing the switching characteristics of the MIS to be significantly improved.

Figure 30:
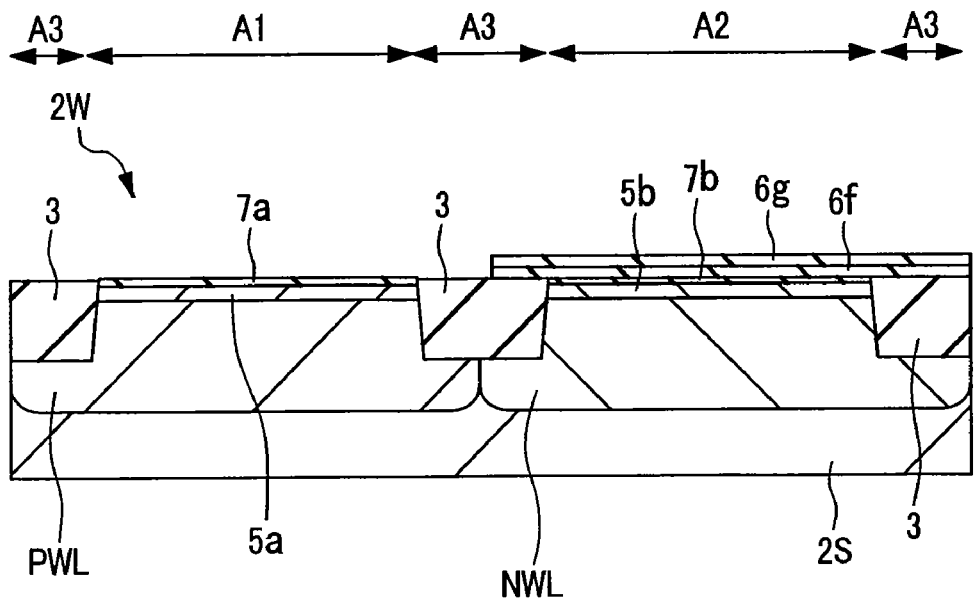
FIG. 30 is a sectional view showing the principal part at the step subsequent to that in FIG. 29 in the fabrication process of the semiconductor device.
Figure 31:
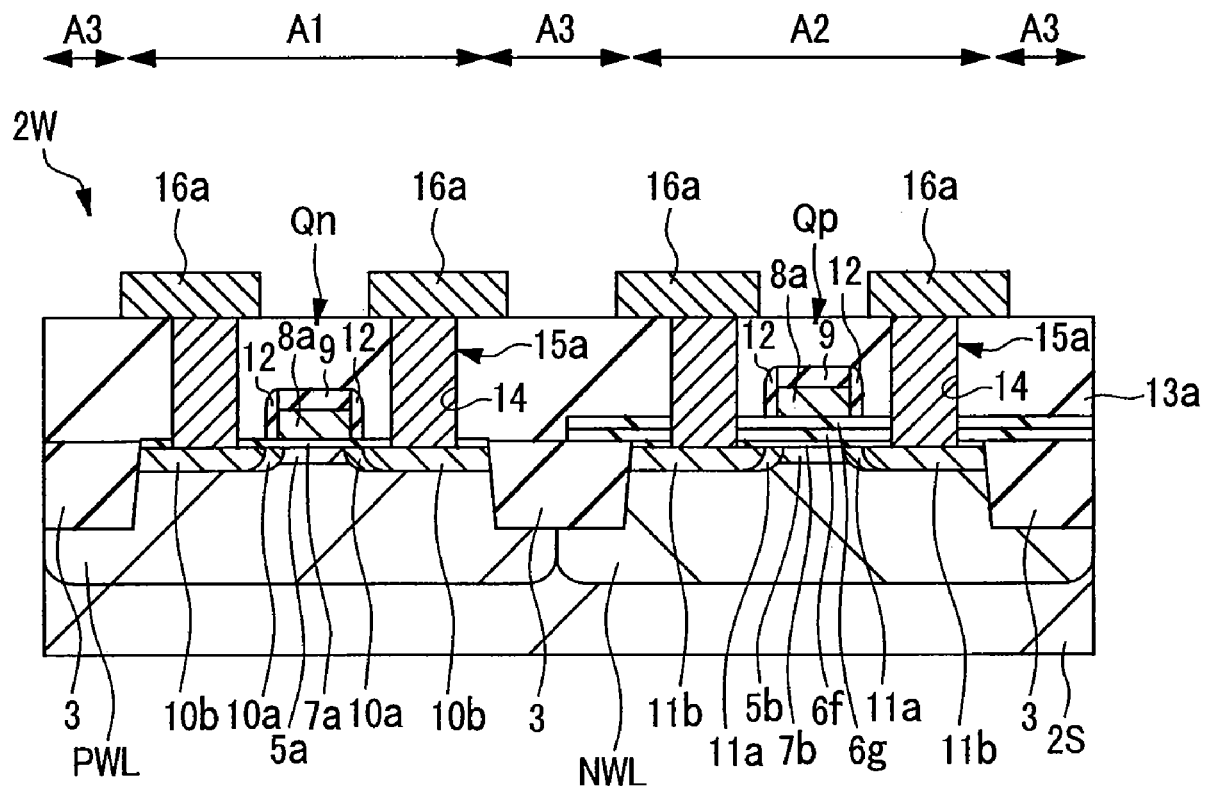
FIG. 31 is a sectional view showing the principal part at the step subsequent to that in FIG. 30 in the fabrication process of the semiconductor device.

Subsequently, similarly to the first embodiment, the thermal oxidation treatment is performed to the semiconductor wafer 2W so that a silicon oxide with about 8 nm in equivalent oxide thickness can be formed on the exposed surface of the substrate 2S. Thereby, as shown in FIG. 30, an insulator 7a made of, for example, silicon oxide with about 8 nm in equivalent oxide thickness is formed in the thin-film region A1 and, simultaneously, an insulator 7b made of, for example, silicon oxide with about 5 nm in equivalent oxide thickness is formed at the interface of the substrate 2S which comes into contact with the insulator 6f in the thick-film region A2. More specifically, the total thickness of the insulators 6f, 6g, and 7b over the substrate 2S in the thick-film region A2 becomes, for example, about 25 nm in equivalent oxide thickness due to the thermal oxidation treatment. The insulator 7a is to be the gate insulator of the MIS in the thin-film region A1, and the laminated film of the insulators 6f, 6g, and 7b is to be the gate insulator of the MIS in the thick-film region A2. Thereafter, similarly to the first to fourth embodiments, as shown in FIG. 31, a gate electrode 8a is formed on the insulator 7a and the laminated film of the insulators 6f, 6g, and 7b, and, thus, the semiconductor device is fabricated.

The effect of the oxygen plasma treatment shown in FIG. 13 does not adequately cover the lower portion of the LPCVD silicon oxide (insulator 6a) in some cases in the first embodiment, and, even though the insulation reliability (breakdown voltage of gate insulator or the like) is improved, the film is inferior to the thermal oxide in some cases. In contrast, since the deposition of the LPCVD silicon oxide is performed in two steps and the oxygen plasma treatment is performed in each step in the fifth embodiment, almost the whole of the film is reformed and can obtain the insulation reliability (breakdown voltage of gate insulator or the like) close to that of the thermal oxide. In addition, depending on the conditions of the oxygen plasma treatment, the insulation reliability (breakdown voltage of gate insulator or the like) can be further improved by dividing the deposition process of the LPCVD silicon oxide into three steps or more.

Sixth Embodiment

In a sixth embodiment, an example of the case where the present invention is applied to a method for fabricating a non-volatile data storage device such as an AND-type flash memory with an assist gate (AG) will be described with reference to FIGS. 32 to 39. FIGS. 32 to 39 are sectional views showing the principal part of the semiconductor wafer 2W in the fabrication process of the AND-type flash memory according to the sixth embodiment. The symbol "MCA" represents a memory cell array.

Figure 32:
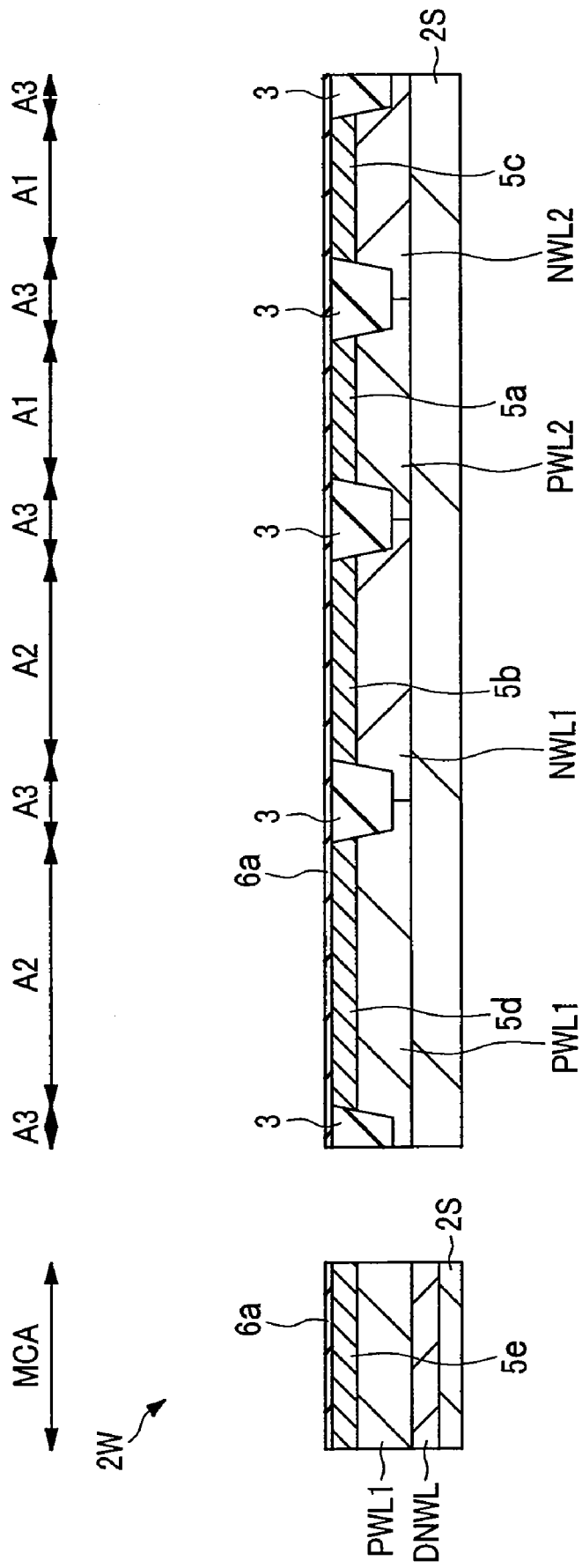
FIG. 32 is a sectional view showing the principal part in the fabrication process of the semiconductor device according to another embodiment of the present invention.
Figure 33:
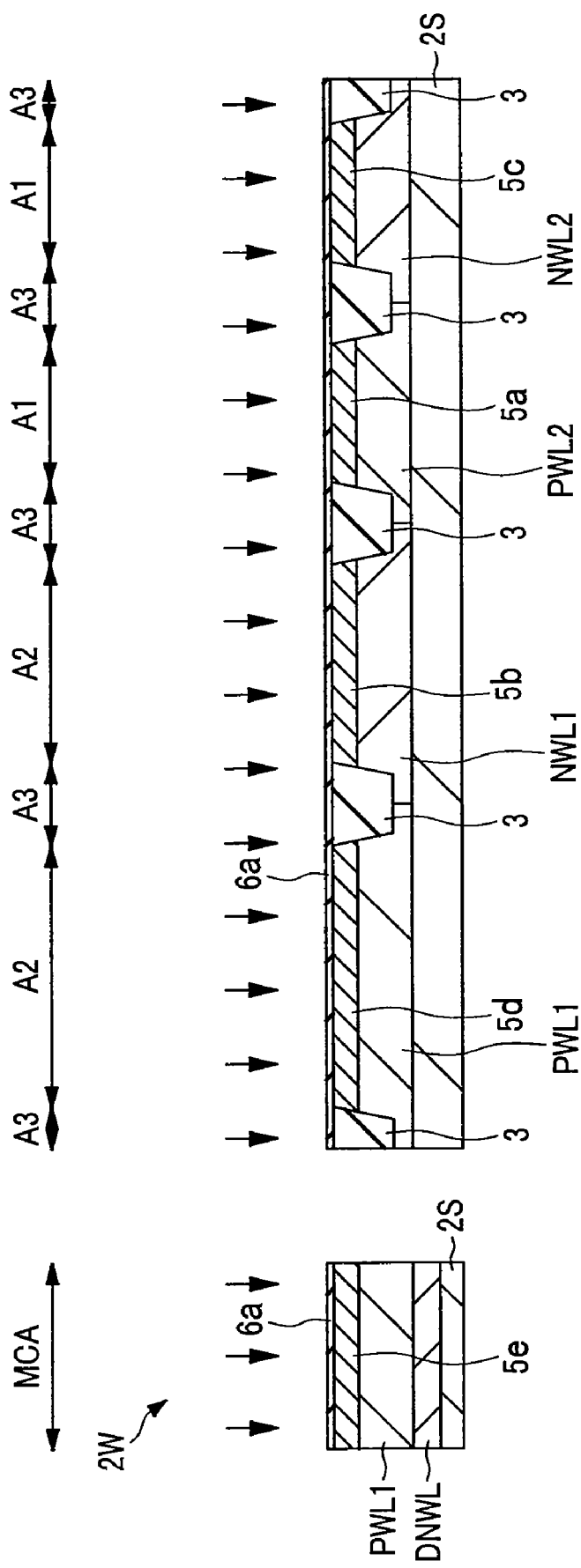
FIG. 33 is a sectional view showing the principal part at the step subsequent to that in FIG. 32 in the fabrication process of the semiconductor device.

First, as shown in FIG. 32, in the p type substrate 2S which constitutes the semiconductor wafer 2W, an n type filling region DNWL is formed in the memory cell array MCA and, then, the trench-type device isolations 3 are formed in the isolation regions A3 on the main surface of the semiconductor wafer 2W. Subsequently, similarly to the first embodiment, the p wells PWL1 and PWL2 and the n wells NWL1 and NWL2 are respectively formed in the substrate 2S by the ion implantation with using the respective different resist patterns as masks. Subsequently, similarly to the first embodiment, the semiconductor regions 5a, 5b, 5c, 5d, and 5e for controlling the threshold voltage are respectively formed in the substrate 2S by the ion implantation with using the respective different resist patterns as masks. Then, after exposing the active region on the main surface of the substrate 2S, the insulator 6a made of, for example, silicon oxide is deposited on the main surface of the semiconductor wafer 2W by the LPCVD method so as to have about 20 nm in equivalent oxide thickness. Thereafter, as shown in FIG. 33, the oxygen plasma treatment is performed to the insulator 6a in the same manner as in the first embodiment. In this case, the oxygen plasma treatment is performed in the following manner, that is, the treatment chamber of the plasma treatment apparatus 1 shown in FIG. 11 is filled with, for example, the atmosphere containing oxygen under the pressure held at about 100 Pa, and a 2.45 GHz electromagnetic wave is introduced to the treatment chamber to generate the plasma. The film quality of the insulator 6a can be improved to the extent almost equal to that of the thermal oxide by the above-mentioned oxygen plasma treatment. Furthermore, since the treatment with the low energy can be performed as mentioned above, the substrate 2S and the insulator 6a are not damaged by the oxygen plasma treatment.

Figure 34:
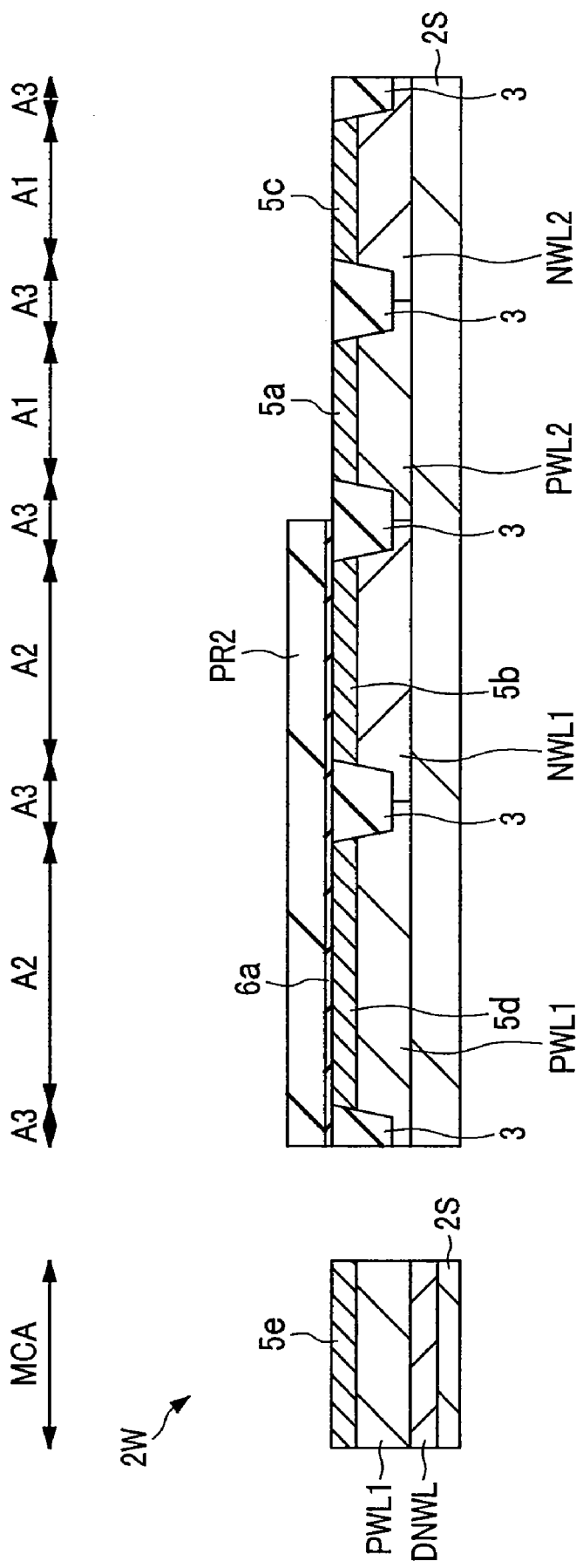
FIG. 34 is a sectional view showing the principal part at the step subsequent to that in FIG. 33 in the fabrication process of the semiconductor device.
Figure 35:
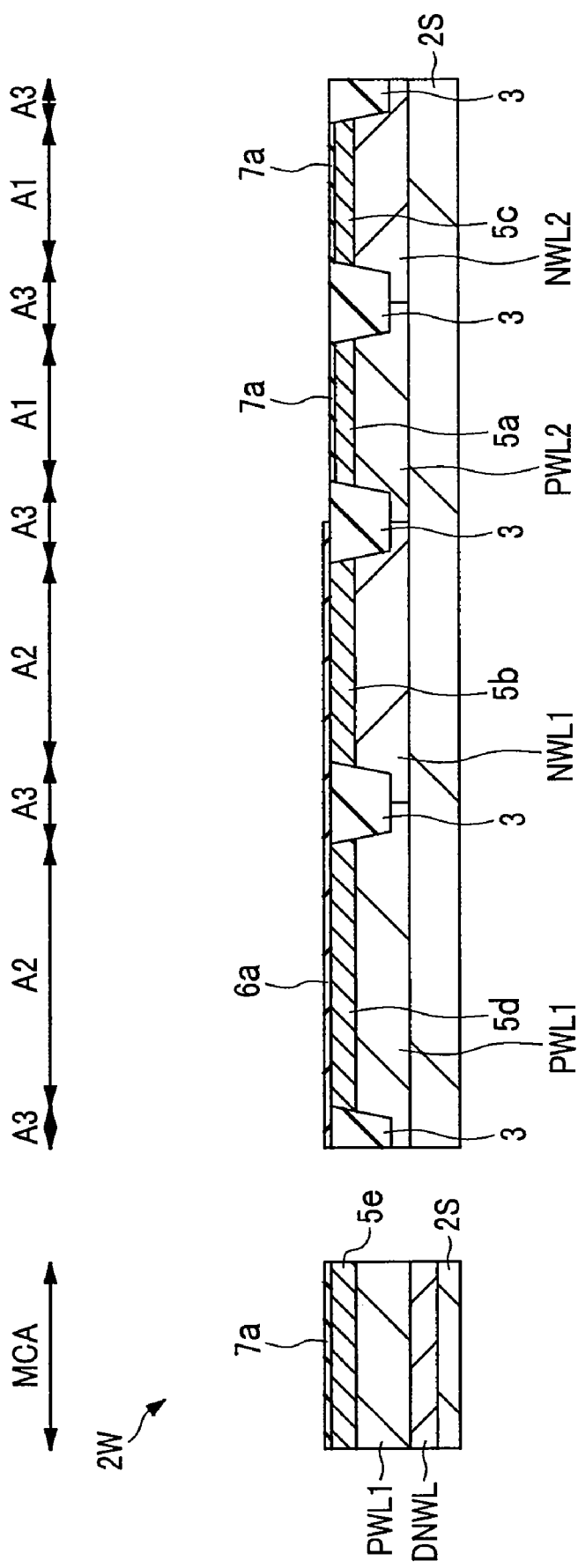
FIG. 35 is a sectional view showing the principal part at the step subsequent to that in FIG. 34 in the fabrication process of the semiconductor device.
Figure 36:
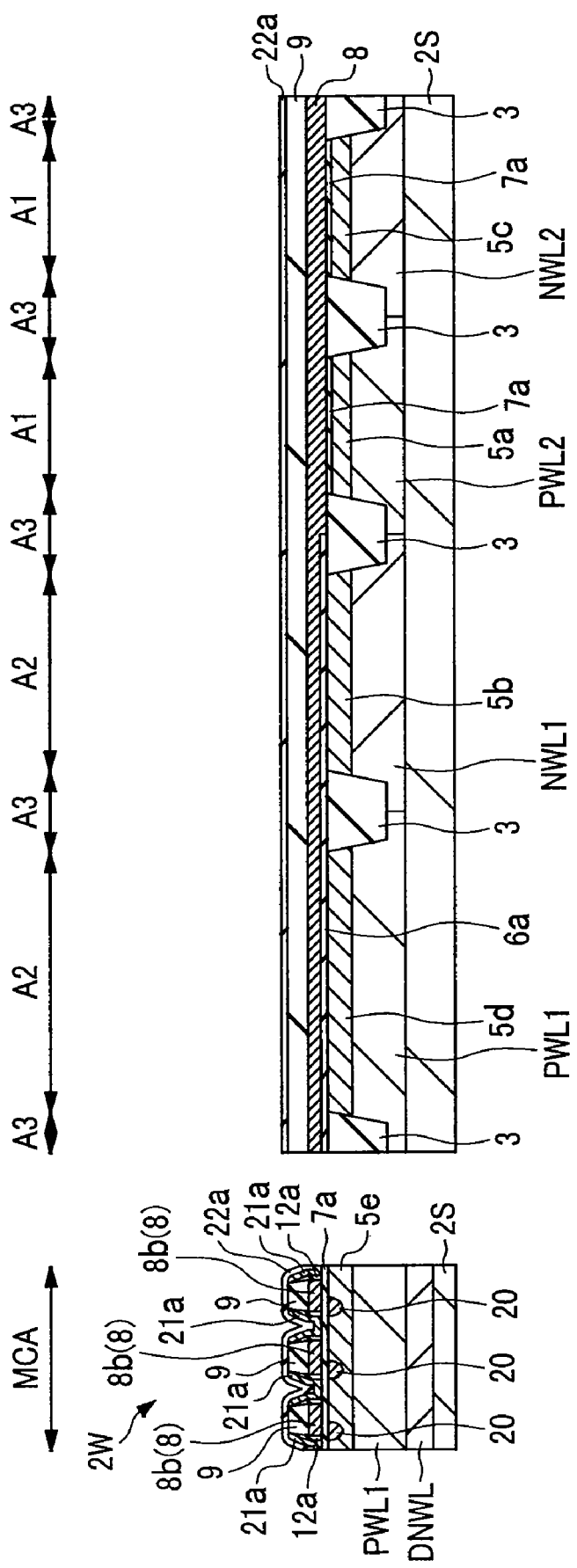
FIG. 36 is a sectional view showing the principal part at the step subsequent to that in FIG. 35 in the fabrication process of the semiconductor device.

Next, as shown in FIG. 34, a resist pattern PR2, which covers the thick-film region A2 and the isolation region A3 around the region A2 and exposes the thin-film region A1 and the memory cell array MCA, is formed on the main surface of the semiconductor wafer 2W, and then the insulator 6a, exposed from the resist pattern PR2 used as an etching mask, is removed. Subsequently, after removing the resist pattern PR2 by the ashing method, the cleaning process of the semiconductor wafer 2 is performed. Also in this case, similarly to the first embodiment, since the film quality of the insulator 6a is improved to the extent almost equal to that of the thermal oxide, it is possible to reduce or prevent the damages to the insulator 6a due to the ashing and the cleaning process. It is also possible to reduce or prevent the recession of the upper portion of the filling insulator in the device isolation 3 by the cleaning process. Thereafter, for example, the thermal oxidation treatment is performed to the semiconductor wafer 2W so that the silicon oxide with about 8 nm in equivalent oxide thickness can be formed on the exposed surface of the substrate 2S similarly to the first embodiment. By so doing, an insulator 7a is formed over the exposed main surface of the substrate 2S, as shown in FIG. 35. At this time, similarly to the first embodiment, a thin insulator is simultaneously formed over the substrate 2S and below the insulator 6a in the thick-film region A2. Then, as shown in FIG. 36, a conductor film 8, made of polycrystalline silicon with the thickness of about 100 nm, is deposited on the main surface of the semiconductor wafer 2W by the CVD method while doping, for example, phosphorus (P), and a cap insulator 9 made of, for example, silicon oxide is deposited thereon by the CVD method so as to have about 200 nm in equivalent oxide thickness. Thereafter, the conductor film 8 and the cap insulator 9 in the memory cell array MCA are patterned by the lithography technique and the dry etching technique to form gate electrodes 8b to be assist gate electrodes. Then, for example, phosphorus or arsenic is ion-implanted diagonally to the main surface of the semiconductor wafer 2W to form n type semiconductor regions 20 in the substrate 2S.

Next, after an insulator made of, for example, silicon oxide is deposited on the main surface of the semiconductor wafer 2W by the CVD method, the insulator is etched back by the anisotropic dry etching to form sidewalls 12a on the side surfaces of the gate electrodes 8b and the cap insulators 9. Subsequently, after removing the remaining silicon oxide over the substrate 2S in the memory cell array MCA, an insulator made of silicon oxide is formed over the substrate 2S by the thermal oxidation treatment so as to have about 8 nm in equivalent oxide thickness. Thereafter, a conductor film made of polycrystalline silicon doped with phosphorus is deposited on the main surface of the semiconductor wafer 2W by the CVD method or the like, and the conductor film on the region other than the memory cell array MCA is selectively removed. Thereafter, after coating an organic resin film on the main surface of the semiconductor wafer 2W, a resist pattern, which covers the region other than the memory cell array MCA, is formed and the organic resin film exposed from the resist pattern is etched so that the organic film is left between the gate electrodes 8d adjacent to each other. Thereafter, the conductor film made of the above-mentioned n type polycrystalline silicon exposed from the left organic resin film is etched using the left resin film as a mask. Then, the organic resin film is removed by the ashing method to form, in a self alignment manner, floating gate electrodes 21a to be charge storing layers between the gate electrodes 8b adjacent to each other. This can reduce the alignment margin of each floating gate electrode 21a, thereby allowing the memory cell to be downscaled. Also, since each floating gate electrode 21a is formed into a V shape cross-section instead of a flat shape, it is possible to increase each surface area of the floating electrodes 21a without increasing each occupying area of the floating electrodes 21a on the main surface of the semiconductor wafer 2W.

Figure 37:
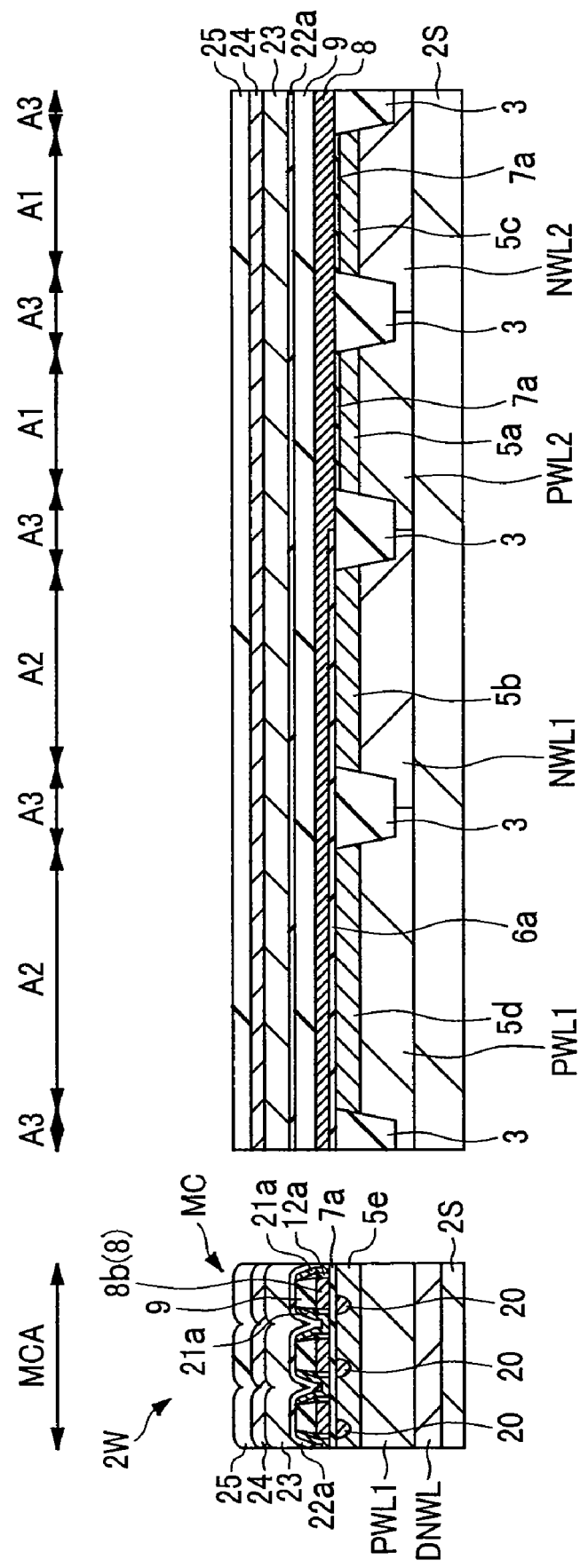
FIG. 37 is a sectional view showing the principal part at the step subsequent to that in FIG. 36 in the fabrication process of the semiconductor device.
Figure 38:
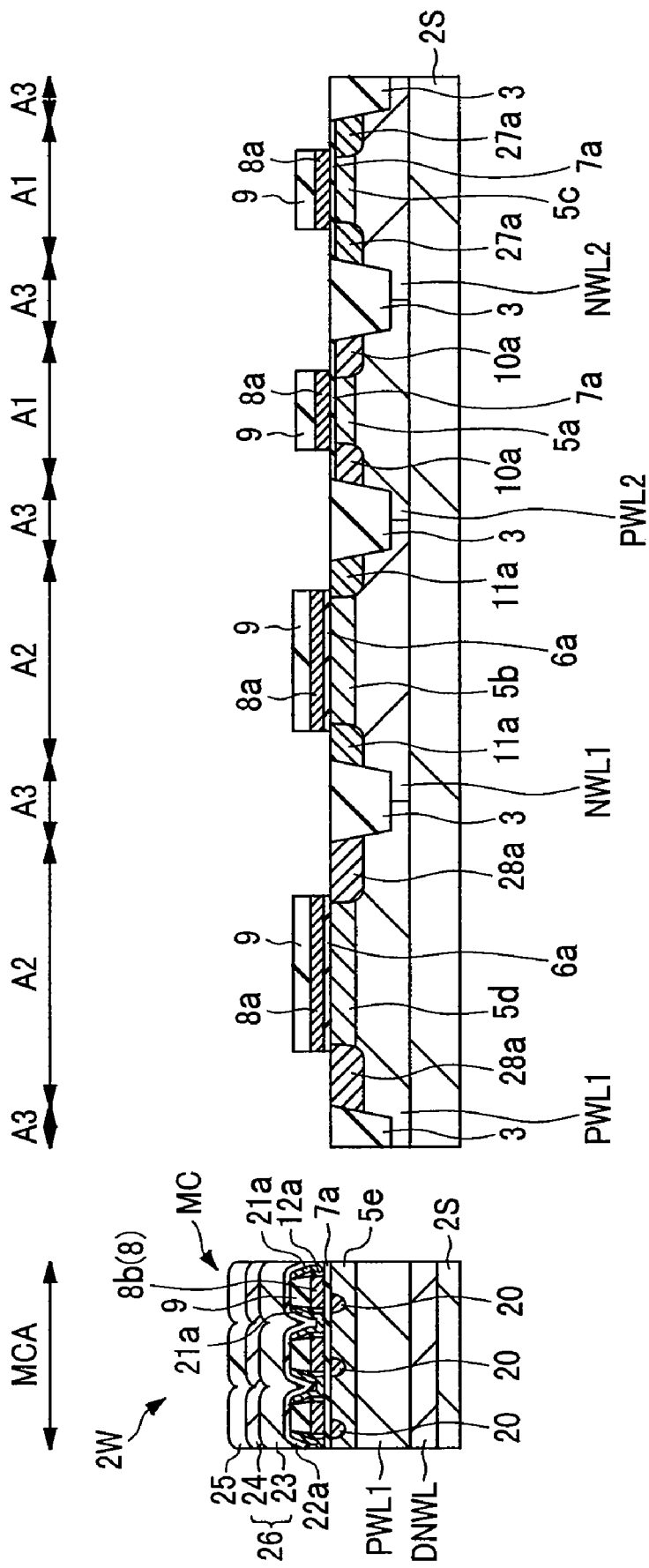
FIG. 38 is a sectional view showing the principal part at the step subsequent to that in FIG. 37 in the fabrication process of the semiconductor device.

Next, an insulator made of, for example, silicon oxide is deposited on the main surface of the semiconductor wafer 2W by the LPCVD method, and then the oxygen plasma treatment is performed to the insulator. Subsequently, after an insulator made of, for example, silicon nitride ($Si_xN_y$) is deposited on the insulator by the LPCVD method, an insulator made of, for example, silicon oxide is deposited thereon by the LPCVD method, and the oxygen plasma treatment is further performed to the insulator. Thus, an interlayer film 22a, having the laminated structure in which the silicon nitride is sandwiched between the insulators made of silicon oxide, is formed. The above-described method for forming the interlayer film 22a makes it possible to significantly improve the time to dielectric breakdown of the interlayer film 22a. Also, the thickness of the interlayer film 22a can be reduced, thereby allowing the coupling ratio to be improved and allowing the low-voltage data writing and deleting operations to the memory cell to be advanced. It is effective to set the oxygen plasma treatment time so that the thickness of the silicon oxide, formed over the substrate 2S by the oxygen plasma treatment, can be within ±30% of that of the LPCVD silicon oxide. The effective thickness of the interlayer film 22a is, for example, about 14 nm in equivalent oxide thickness. Thereafter, as shown in FIG. 37, a conductor film 23 made of, for example, polycrystalline silicon, a silicide film 24 made of tungsten silicide or the like, and an insulator 25 made of, for example, silicon oxide are sequentially formed on the main surface of the semiconductor wafer 2W in this order from below by the CVD method. Subsequently, after forming a resist pattern on the insulator 25, the insulator 25 is patterned with using the resist pattern as an etching mask. Then, after removing the resist pattern, the silicide film 24 and the conductor film 23 exposed from the pattern of the left insulator 25 are removed by the dry etching method using the left insulator as an etching mask, and a control gate electrode 26 is formed, as shown in FIG. 38. Thus, a plurality of memory cells MC each having the assist gate (AG) are formed in the memory cell array MCA. In addition, the insulator 25, the silicide film 24, the conductor film 23, and the interlayer film 22a in the region other than the memory cell array MCA are removed.

Figure 39:
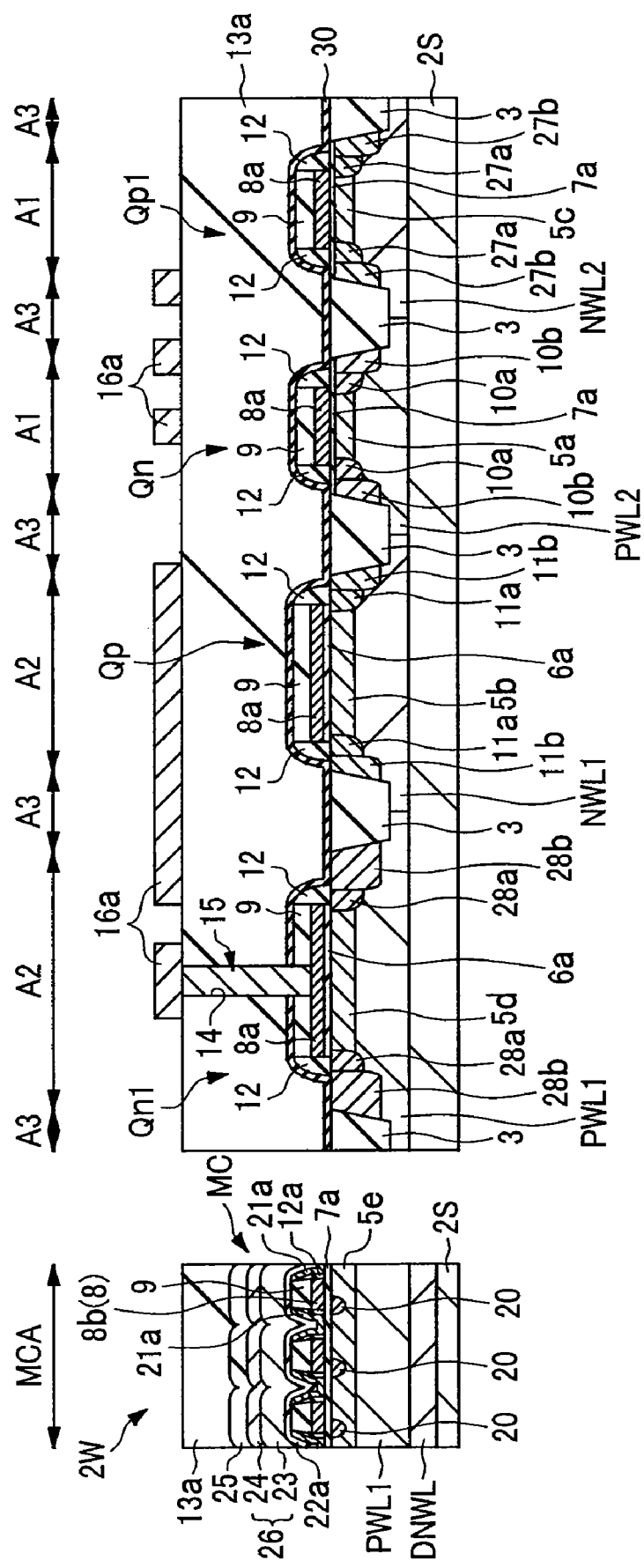
FIG. 39 is a sectional view showing the principal part at the step subsequent to that in FIG. 38 in the fabrication process of the semiconductor device.

Next, the cap insulator 9 and the conductor film 8 in the region other than the memory cell array MCA are patterned by the lithography technique and the dry etching technique to form the gate electrodes 8a and the cap insulators 9 and, then, the semiconductor regions 10a, 11a, 27a, and 28a for the source and drain and with relatively low impurity concentration are formed by the ion implantation with using respective different resist patterns as masks similarly to the first embodiment. The semiconductor region 27a becomes p type by introducing, for example, boron (B) or boron difluoride (BF$_2$), and the semiconductor region 28a becomes n type by introducing, for example, phosphorus (P) or arsenic (As). Subsequently, as shown in FIG. 39, after forming sidewalls 12 on the side surfaces of the gate electrodes 8a and the cap insulators 9, the semiconductor regions 10b, 11b, 27b, and 28b for the source and drain and with relatively high impurity concentration are formed by the ion implantation method with using respective different resist patterns as masks similarly to the first embodiment. The semiconductor region 27b becomes p$^+$type by introducing, for example, boron (B) or boron difluoride (BF$_2$), and the semiconductor region 28b becomes n$^+$type by introducing, for example, phosphorus (P) or arsenic (As). Thus, the semiconductor regions 10a, 10b, 11a, 11b, 27a, 27b, 28a, and 28b for the source and drain and with the LDD (Lightly Doped Drain) structure are formed, and, for example, the nMIS Qn and the pMIS Qp1 are formed in the thin-film region A1 and the nMIS Qn1 and the pMIS Qp are formed in the thick-film region A2. The nMIS Qn and the PMIS Qp1 are driven at a relatively low power supply and exemplify the MIS as requiring a relatively high speed operation while the nMIS Qn1 and the pMIS Qp are driven at a relatively high power supply and exemplify the MIS as not requiring a high speed operation. Thereafter, after depositing an insulator 30 made of, for example, silicon nitride on the semiconductor wafer 2W by the CVD method, the insulator 13a is deposited thereon by the CVD method, similarly to the first embodiment, to form a contact hole 14, a plug 15a, and wirings 16a. Thereafter, the deposition of the insulator made of silicon oxide, planarization of its surface by the CMP (Chemical Mechanical Polishing) method, formation of through holes, formation of plugs, and formation of wirings are repeated twice to form three wiring layers. Then, the formation of a protection film, annealing in the atmosphere containing hydrogen, and formation of openings for bonding pads by the lithography technique and the dry etching technique are performed to complete the AND-type flash memory with the assist gates.

The memory cell array MCA of the AND-type flash memory according to the sixth embodiment is a so-called virtual ground, which is common to the n type semiconductor region 20 for the source and drain in the memory cells MC adjacent to each other, and has a selected transistor in each memory block. The memory cells are connected in parallel to a local data line. The gate electrodes 8b (assist gate electrode) to be a writing gate of the memory cell selected (referred to as "selected cell") MC and a device isolation gate of the unselected cell are also arranged in parallel to the data line. The gate electrodes 8b are sandwiched between the floating gate electrodes 21a and coupled to each other in the vicinity of a selected transistor. The thickness of the insulator below the gate electrode 8b to be an assist gate electrode is, for example, about 8 to 9 nm in equivalent oxide thickness. The thickness of a tunnel insulator below the floating gate electrode 21a is, for example, about 8 to 9 nm in equivalent oxide thickness.

A data writing method into the memory cell MC adopts a hot electron injection with constant charge injection programming. More specifically, it adopts a so-called source-side hot electron injection in which charges in the source line flows as a certain channel current to write the data in the floating gate electrode 21a. This data writing is executed by applying, for example, an about 13 V voltage of about 13 V to the selected word line, an about 5V voltage to the data line, and an about 0.6 V voltage to one of the gate electrodes 8b. During the execution, the unselected gate electrode 8b adjacent to the selected gate electrode 8b through the floating gate electrode 21a is fixed to, for example, 0 V to control the channel formation in the memory cell MC thereof. More specifically, the gate electrode 8b to be an assist gate functions not only as a writing gate but also as the field isolation gate. Therefore, the trench isolation is unnecessary in the memory cell array MCA, thereby allowing the pitch between the data lines to be reduced. Under such voltage applying conditions, the channel below the selected gate electrode 8b is weakly inverted, and the channel below the floating gate electrode 21a adjacent thereto is completely depleted. Therefore, large potential drop occurs below the interface between the gate electrode 8b and the floating gate electrode 21a adjacent thereto. As a result, the channel lateral current below the interface is increased so that the hot electron is efficiently generated. In the structure of the memory cell MC in the sixth embodiment, even if the channel current is reduced to, for example, about 100 nA, the 30 nA injection current, which is sufficient to execute the writing in about 10 μs, can be obtained. More specifically, the data writing of 10 μs can be achieved by the 0.6 V voltage applied to the gate electrode 8b, which corresponds to the channel current of 100 nA. The chip writing rate calculated from the cell characteristics is 20 MB/s. Also, the injection efficiency is about $3 \times 10^{-4}$, that is, the value, increased by double digits or more in comparison to that of the drain side hot electron injection usually used in the NOR type flash memory, can be obtained. As described above, in the flash memory according to the sixth embodiment, the cell writing in 10 μs at low channel current can be realized by the source-side hot electron injection, in which the gate electrode 8b to be an assist gate electrode is used as the writing gate. In this manner, the chip writing rate of 20 MB/s can be realized. In addition, it is possible to reduce the memory cell area to, for example, 0.104 μm² (binary) or 0.052 μm² (multiple value) by: the field isolation by the gate electrode 8b to be an assist gate electrode; and the self alignment process in the formation of the floating gate electrode. Note that the data deletion of the memory cell MC is performed by the F-N tunnel emission from the floating gate electrode 21a to the substrate 2S, which is caused by applying the negative voltage to the selected word line.

The sixth embodiment can obtain the same effects as those in the first to fifth embodiments. For example, the reliability (breakdown voltage of gate insulator) of the gate insulator 6a is almost equivalent to that of the thermal oxide. Therefore, it is possible to improve the reliability of the nMIS Qn1 and the pMIS Qp with high breakdown voltage around the memory. In addition, it is possible to significantly reduce the generation of the crystal defects in the substrate 2S. Therefore, the operation reliability and the yield rate of the flash memory can be improved. Also, since the amount of recession of the filling insulator in the isolation region 3 is reduced, the trouble in the device characteristics can be reduced or prevented. In addition, it is possible to significantly improve the time to dielectric breakdown of the interlayer film 22a by the oxygen plasma treatment. Furthermore, the film quality improvement of the interlayer film 22a makes it possible to reduce the thickness of the interlayer film 22a, thereby allowing the coupling ratio to be improved and allowing the data writing and deletion to the memory cell MC at lower voltage to be executed.

Seventh Embodiment

In a seventh embodiment, an example of the case where the present invention is applied to a method for fabricating a non-volatile data storage device such as a F-MONOS (Metal Oxide Nitride Oxide Semiconductor) type flash memory will be described with reference to FIGS. 40 to 44. FIGS. 40 to 44 are sectional views showing the principal part of the semiconductor wafer 2W in the fabrication process of the flash memory according to the seventh embodiment.

Figure 40:
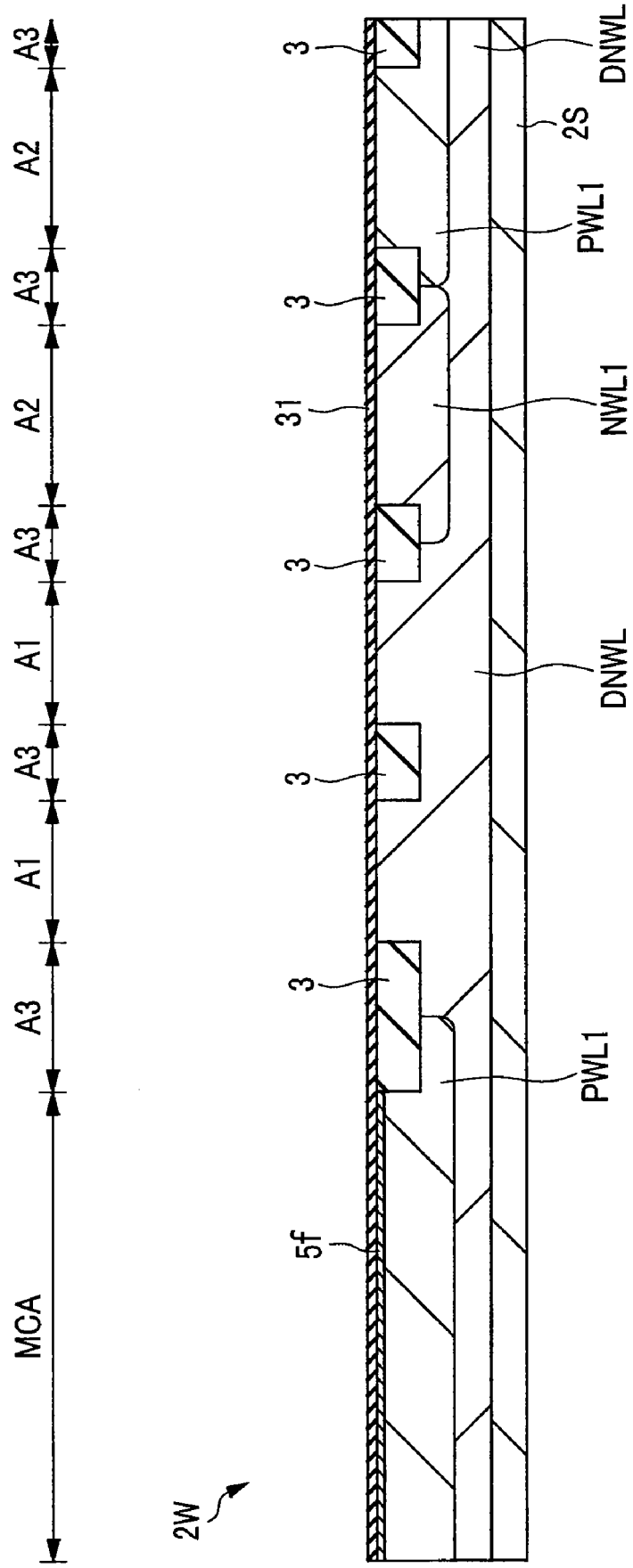
FIG. 40 is a sectional view showing the principal part in the fabrication process of the semiconductor device according to another embodiment of the present invention.

First, as shown in FIG. 40, similarly to the sixth embodiment, an n type filling region DNWL is formed in the p type substrate 2S of the semiconductor wafer 2W, and the trench-type device isolations 3 are formed on the main surface of the semiconductor wafer 2W, and p well PWL1 and n well NWL1 are formed in the substrate 2S by the ion implantation with using the respective different resist patterns as masks. Subsequently, a semiconductor region 5f is formed by the ion implantation of, for example, arsenic as the impurity for controlling the threshold voltage. The semiconductor region 5f is formed to make the MONOS-type memory cell being a depletion type. Thereafter, after exposing the active region on the main surface of the substrate 2S, an insulator made of, for example, silicon oxide is deposited over the main surface of the semiconductor wafer 2W by the LPCVD method, and the oxygen plasma treatment is performed to this insulator. Subsequently, after an insulator made of, for example, silicon nitride ($Si_xN_y$) is deposited on the above insulator by the LPCVD method, an insulator made of, for example, silicon oxide is deposited thereon by the LPCVD method, and the oxygen plasma treatment is further performed to the insulator. Thus, an insulator 31 having the laminated structure, in which the silicon nitride is sandwiched between the insulators made of silicon oxide, is formed. By such oxygen plasma treatment, it is possible to significantly improve the time to dielectric breakdown of the insulator 31. The silicon nitride of the insulator 31 is a charge storing layer and has a function as means storing electric with scattered positions, and the charges that retain data is captured in both or either of the carrier trap of the silicon nitride and/or the carrier trap at the interface between the silicon nitride and the silicon oxide on and below it. The effective thickness of the insulator 31 is, for example, about 15 nm.

Figure 41:
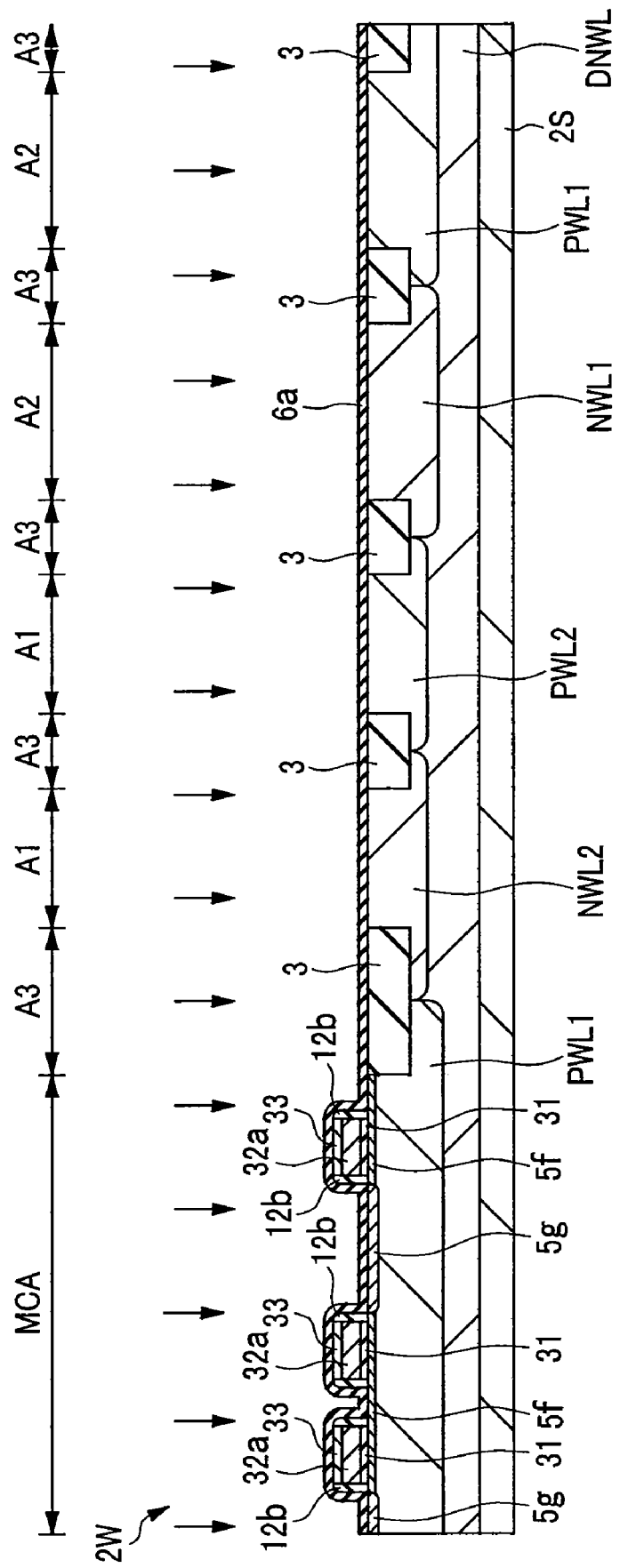
FIG. 41 is a sectional view showing the principal part at the step subsequent to that in FIG. 40 in the fabrication process of the semiconductor device.
Figure 42:
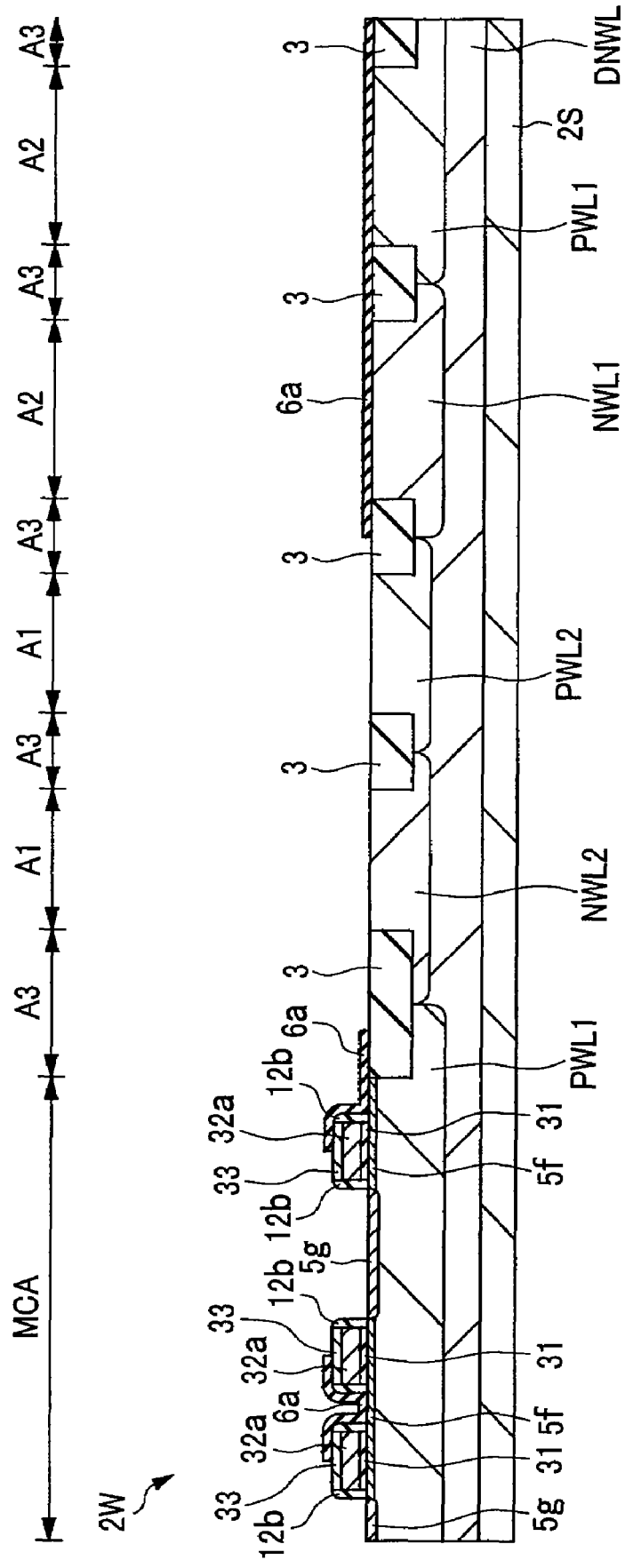
FIG. 42 is a sectional view showing the principal part at the step subsequent to that in FIG. 41 in the fabrication process of the semiconductor device.
Figure 43:
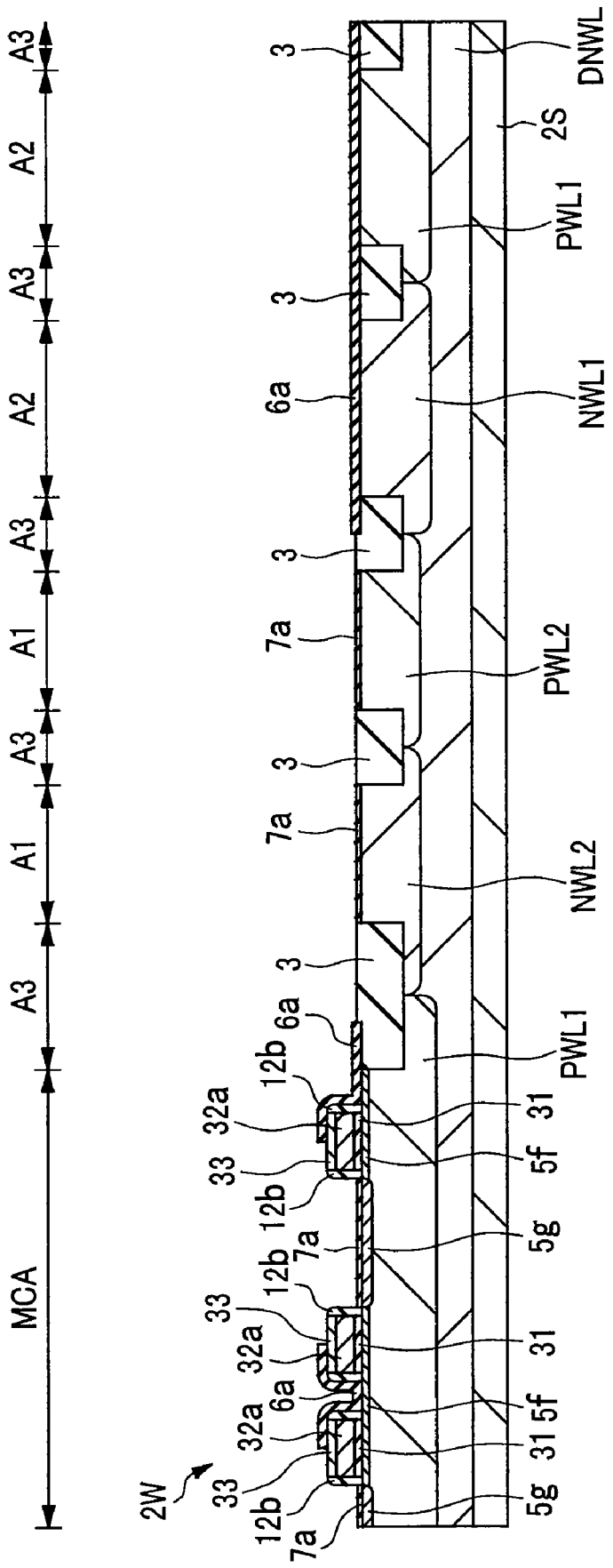
FIG. 43 is a sectional view showing the principal part at the step subsequent to that in FIG. 42 in the fabrication process of the semiconductor device.
Figure 44:
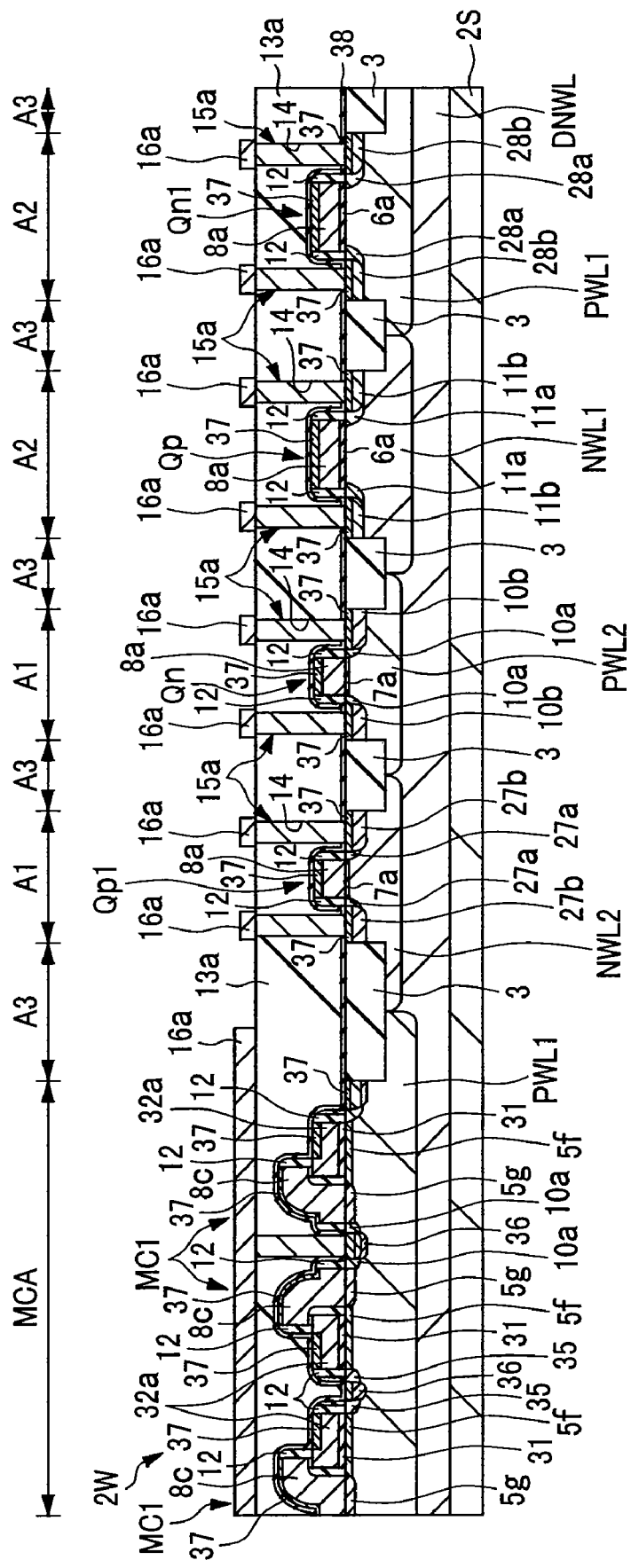
FIG. 44 is a sectional view showing the principal part at the step subsequent to that in FIG. 43 in the fabrication process of the semiconductor device.

Next, a conductor film made of, for example, polycrystalline silicon and an insulator made of silicon oxide are deposited on the main surface of the semiconductor wafer 2W in this order from below by the CVD method. Subsequently, after patterning the insulator by the lithography technique and the dry etching technique, the resist pattern, used in the patterning of the insulator, is removed and, then, the underlying conductor film is patterned by the dry etching technique with using the patterned insulator as a mask. In this manner, the gate electrodes 32a and the cap insulators 33 are formed in the memory cell array MCA, as shown in FIG. 41. The gate electrode 32a is a memory gate electrode. Subsequently, after removing the insulator 31 exposed from the gate electrode 32a, an insulator made of, for example, silicon oxide is deposited by the CVD method and is etched back, and the sidewalls 12b are formed on the side surfaces of the gate electrodes 32a and the cap insulators 33. Subsequently, similarly to the sixth embodiment, a p well PWL2 and an n well NWL2 are formed in the substrate 2S in the thin-film region A1 by the ion implantation with using the respective different resist patterns as masks. Subsequently, the semiconductor regions 5g are formed by the ion implantation of, for example, boron difluoride as the impurity for controlling the threshold voltage below the control gate electrode. Thereafter, after depositing a relatively thick insulator 6a made of, for example, silicon oxide on the main surface of the semiconductor wafer 2W by the LPCVD method or the like, the plasma treatment is performed to the insulator 6a in the manner as schematically shown by the arrows in FIG. 41. This insulator 6a is mainly a film to be the gate insulator of the MIS with a high breakdown voltage in the thick-film region A2. By performing the above oxygen plasma treatment to the insulator 6a, the reliability (breakdown voltage of gate insulator) of the insulator 6a can be improved to the extent almost equal to that of the thermal oxide under the relatively low temperature condition (e.g., 0 to 400° C.). Thereafter, the insulator 6a is patterned, by the lithography technique and the wet etching technique, in the hydrofluoric acid solution so that the insulator 6a is left in the part of the memory cell array MCA and in the thick-film region A2, as shown in FIG. 42. Subsequently, similarly to the first and sixth embodiments, a relatively thin insulator 7a made of, for example, silicon oxide is formed over the exposed surface of the substrate 2S by performing the thermal oxidation treatment to the semiconductor wafer 2W, as shown in FIG. 43. Then, a conductor film made of, for example, polycrystalline silicon doped with phosphorus (P) is deposited on the main surface of the semiconductor wafer 2W by the CVD method, and thereafter is patterned by the lithography technique and the dry etching technique. In this manner, control gate electrodes 8c and gate electrodes 8a are formed, as shown in FIG. 44.

Next, the ion implantation of, for example, arsenic is performed with using, as a mask, a resist pattern, from which the memory cell array MCA is exposed and which covers the regions other than the exposed memory cell array, to form n type semiconductor regions 35 for the source in the substrate 2S. Subsequently, the semiconductor regions 10a, 11a, 27a, and 28a with relatively low impurity concentrations are formed by the ion implantation with using respective different resist patterns as masks similarly to the first embodiment. Then, after forming sidewalls 12 on the side surfaces of the gate electrodes 8a, the semiconductor regions 10b, 11b, 27b, 28b, and 36 with relatively high impurity concentrations are formed by the ion implantation with using respective different resist patterns as masks similarly to the first embodiment. Thus, the memory cells MC1 are formed in the memory cell array MCA. The memory cell MC1 has the selected MIS (including the control gate electrode 8c) and the memory MIS (including the gate electrode 32). Then, after forming a silicide layer 37 such as cobalt silicide ($CoSi_x$) or the like over the exposed surface of the substrate 2S, the gate electrodes 8a and 32a, and the control gate electrodes 8c, a thin insulator 38 made of, for example, silicon nitride and a thick insulator 13a are deposited in this order from below on the main surface of the semiconductor wafer 2W. Thereafter, the same process as those in the first and sixth embodiments are performed to fabricate the flash memory.

The data writing method into the memory cell MC1 adopts, for example, the source-side hot electron injection. This data writing is executed by, for example, applying: the power supply voltage VCC to the control gate electrode 8c of the selected MIS; the power supply voltage VCC or the voltage of 0 V to the drain (semiconductor regions 36 and 10a) of the selected MIS; the voltage of about 6 V to the source (semiconductor regions 35 and 36) of the memory MIS; the voltage of about 10 V to the gate electrode 32a of the memory MIS; and the voltage of 0V to the p well PWL1 of the memory cell array MCA, and by injecting the hot electron generated in the channel to the insulator 31.

Also, the date deletion is executed by, for example, applying: the voltage of 0 V to the control gate electrode 8c, the drain (semiconductor regions 36 and 10a) of the selected MIS, and the source (semiconductor regions 35 and 36) of the memory MIS; and the voltage of about 12 V to the gate electrode 32a of the memory MIS, and by moving the electrons in the insulator 31 toward the gate electrode 32a by means of the tunnel emission. Note that the method for deleting the data is not limited to this, and may use other methods of moving the electrons in the insulator 31 to the substrate (p well PWL1 or the sources 35 and 36) by the tunnel emission or injecting the hot holes into the insulator 31 from the sources 35 and 36.

In addition, when the selected MIS (on the side of the control gate electrode 8c) of the memory cell MC1 is turned on by, for example, applying the power supply voltage VCC to the control gate electrode 8c and the drain (semiconductor regions 36 and 10a) of the selected MIS; and the voltage of about 0V to the gate electrode 32a of the memory MIS and the source (semiconductor regions 35 and 36) of the memory MIS, the stored data is read out depending on whether or not the predetermined current flows under the threshold voltage condition of the memory MIS (on the side of the gate electrode 32a).

The flash memory according to the seventh embodiment is excellent in data retention since the charges forming the data are discretely stored in either or both the carrier trap in the silicon nitride of the insulator 31 and/or the carrier trap in the interface between the silicon nitride and the silicon oxide. Consequently, it is possible to reduce the thickness of the silicon oxide on and below the silicon nitride of the insulator 31, and achieve the reduction of the voltage in the data writing and deleting operation. Especially, since the film quality of the silicon oxide on the silicon nitride is improved by the oxygen plasma treatment in this embodiment, the reliability of the data retention can be maintained even if the thickness of the silicon oxide is reduced in comparison to the conventional case. Therefore, it is possible to further advance the low voltage operation. In addition, since the hot electrons are injected to the silicon nitride of the insulator 31 by the source-side injection and by using the split gate type cell, the electron injection ratio can be improved, thereby allowing the high speed and low current data writing to be executed. Also, since the data writing and deleting operation can be easily controlled, the size of the peripheral circuit can be reduced.

Note that it is needless to say that the object of the present invention can be achieved even if the silicon oxide, formed below the silicon nitride and constituting the insulator 31 with a laminated structure, is formed by a normal thermal oxidation.

Eighth Embodiment

In an eighth embodiment, another example of the case where the present invention is applied to a method for fabricating a non-volatile data storage device such as an F-MONOS type flash memory will be described with reference to FIGS. 45 to 49. FIGS. 45 to 49 are sectional views showing the principal part of the semiconductor wafer 2W in the fabrication process of the flash memory according to the eighth embodiment.

Figure 45:
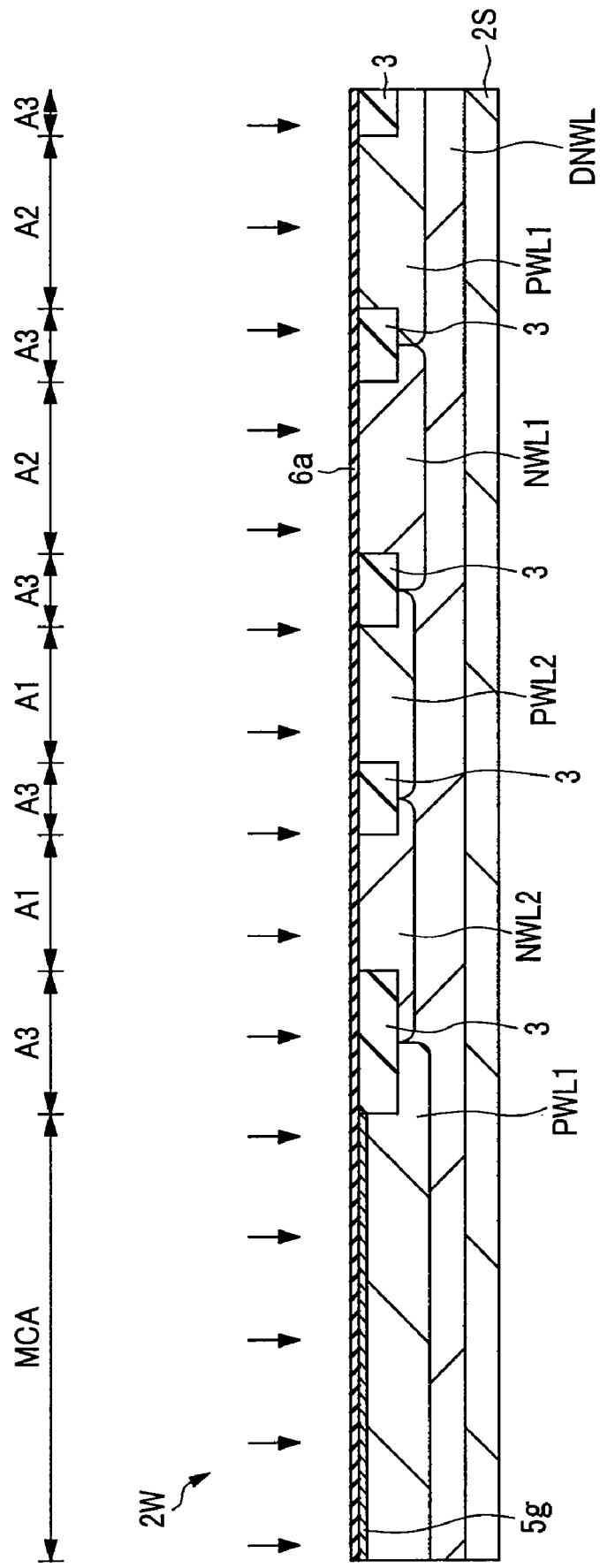
FIG. 45 is a sectional view showing the principal part in the fabrication process of the semiconductor device according to another embodiment of the present invention.
Figure 46:
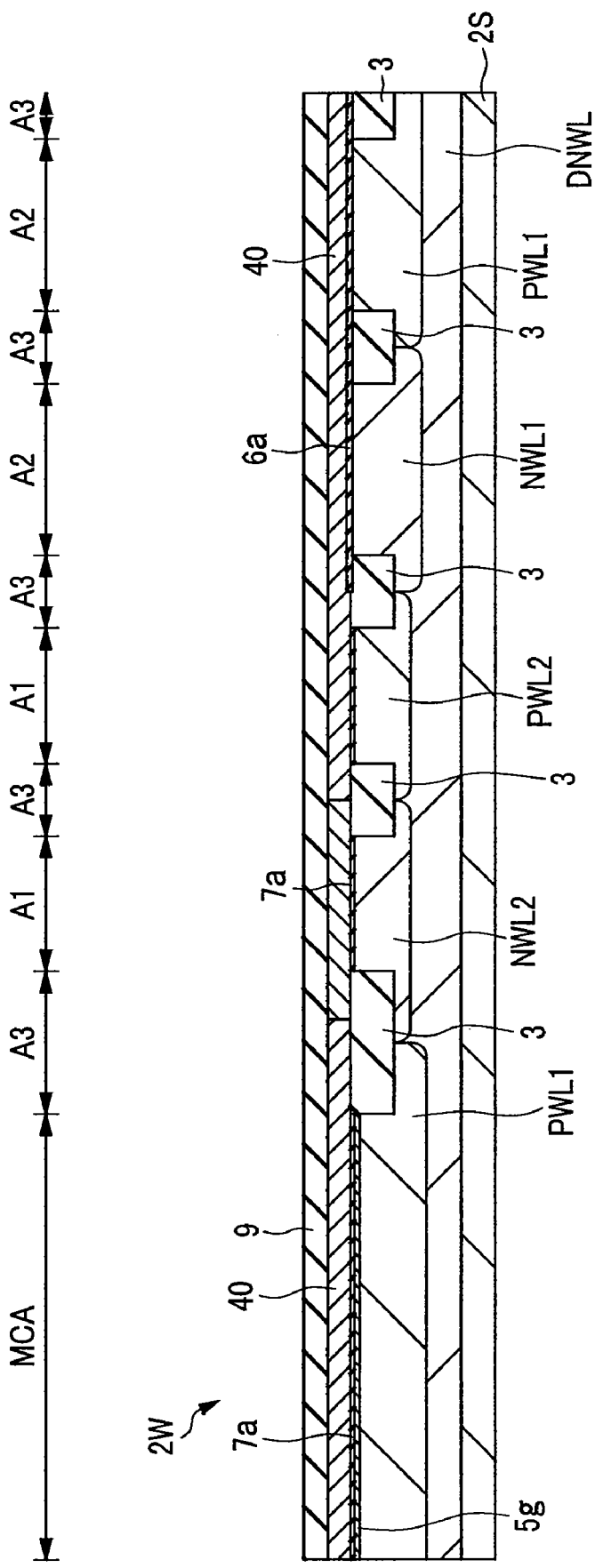
FIG. 46 is a sectional view showing the principal part at the step subsequent to that in FIG. 45 in the fabrication process of the semiconductor device.
Figure 47:
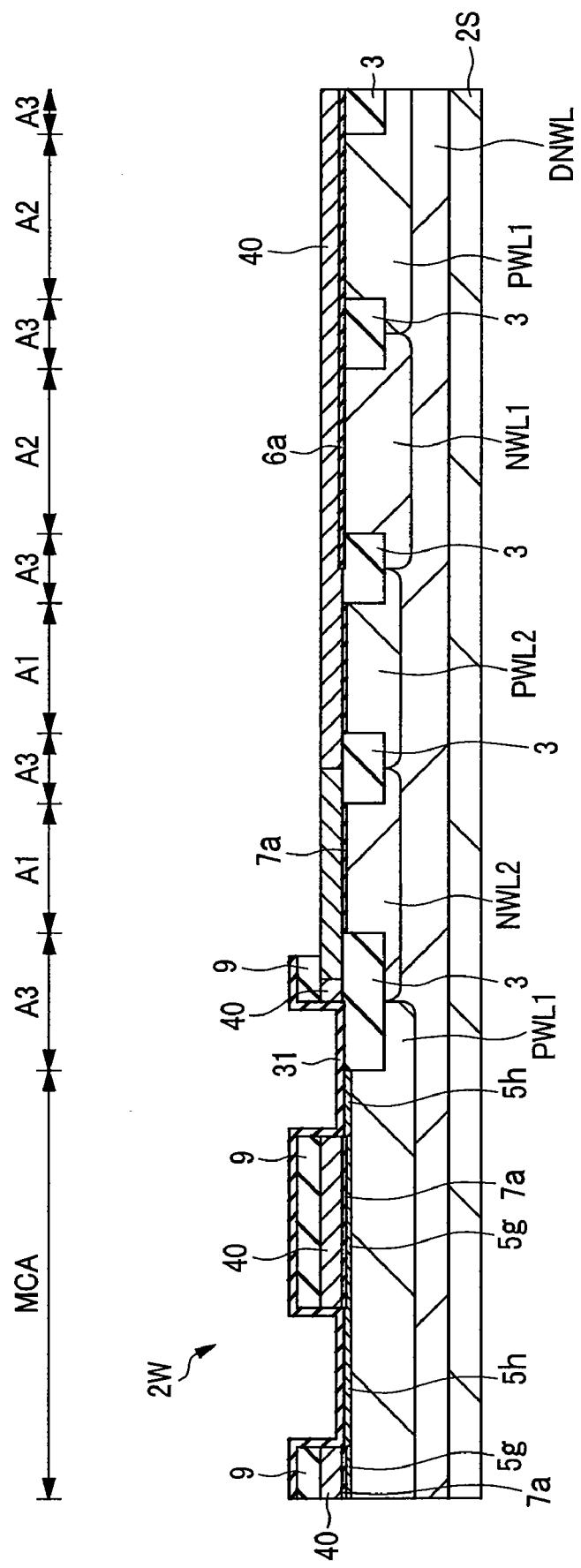
FIG. 47 is a sectional view showing the principal part at the step subsequent to that in FIG. 46 in the fabrication process of the semiconductor device.

First, as shown in FIG. 45, an n type filling region DNWL, trench-type device isolations 3, p wells PWL1 and PWL2, n wells NWL1 and NWL2, and a semiconductor region 5g for controlling a threshold voltage are formed in the p type substrate 2S of the semiconductor wafer 2W, and the insulator 6a made of, for example, silicon oxide is formed by the LPCVD method so as to have about 16 nm in equivalent oxide thickness. The insulator 6a is to later be the gate insulator of the high breakdown voltage MIS. Subsequently, similarly to the first to seventh embodiments, the oxygen plasma treatment is performed to this insulator 6a in the manner as schematically shown by the arrows in FIG. 45, and the film quality of the insulator 6a can be improved to the extent almost equal to that of the thermal oxide. Subsequently, as shown in FIG. 46, after patterning the insulator 6a so that the insulator 6a is left in the thick-film region A2 and in the isolation regions A3 around the region A2, the thermal oxidation treatment is performed to the semiconductor wafer 2W and the insulator 7a made of, for example, silicon oxide is formed on the exposed surface of the substrate 2S in the thin-film region A1 and the memory cell array MCA so as to have about 3.7 nm in equivalent oxide thickness. Thereafter, after a polycrystalline silicon film 40 is deposited on the main surface of the semiconductor wafer 2W by the CVD method to have a thickness of about 100 nm, phosphorus or arsenic is ion implanted into the memory cell array MCA, the nMIS forming region in the thin-film region A1, and the polycrystalline silicon film 40 in the thick-film region A2. The polycrystalline silicon film 40 in the pMIS forming region of the thin-film region A1 is an intrinsic semiconductor. Thereafter, after the cap insulator 9 made of, for example, silicon oxide is deposited on the main surface of the semiconductor wafer 2W by the CVD method, the cap insulator 9 and the polycrystalline silicon film (conductor film 8) are patterned and, further, semiconductor regions 5h for controlling the threshold voltage are formed in the memory cell array MCA by the ion implantation, as shown in FIG. 47. The semiconductor region 5h is a region for controlling the threshold voltage below the gate electrode for the memory.

Figure 48:
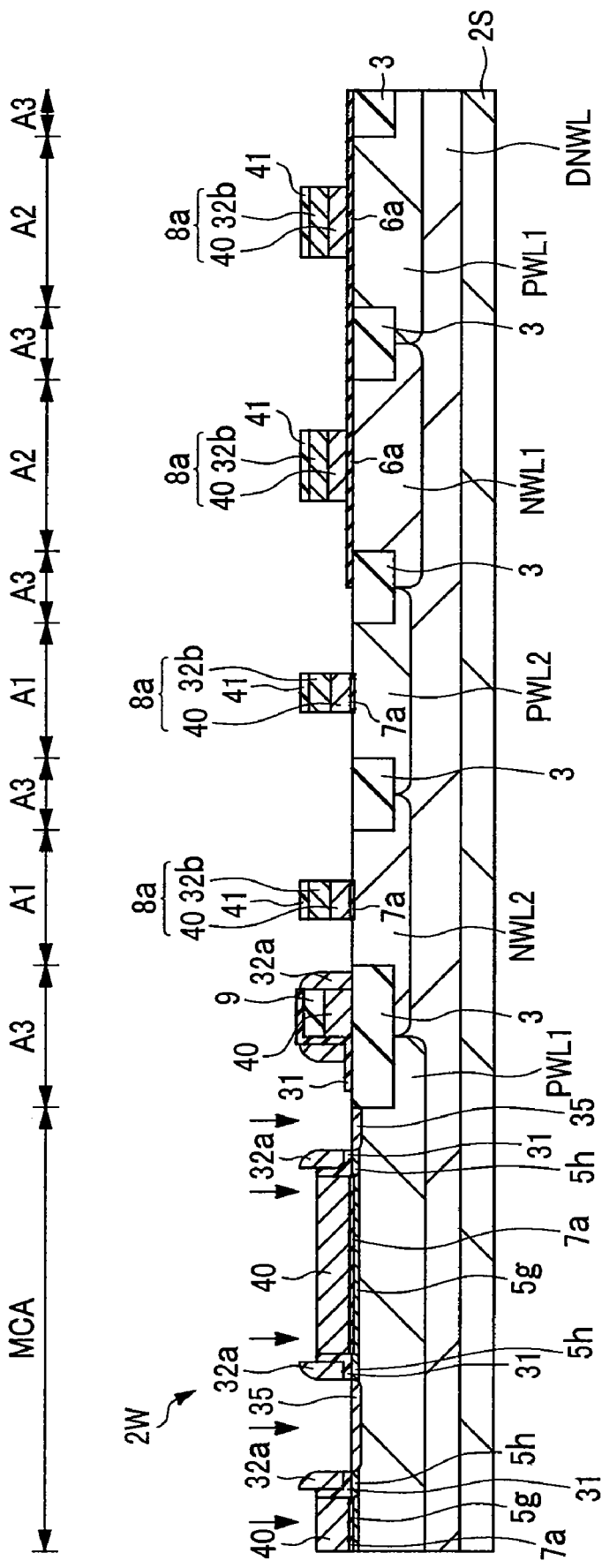
FIG. 48 is a sectional view showing the principal part at the step subsequent to that in FIG. 47 in the fabrication process of the semiconductor device.

Next, the insulator 31 is formed on the main surface of the semiconductor wafer 2W. Similarly to the seventh embodiment, the insulator 31 is composed of a laminated film of silicon oxide, silicon nitride, and silicon oxide deposited in this order from below by the LPCVD method. Also in this eighth embodiment, the silicon nitride of the insulator 31 has a function as means storing electric charge with scattered positions, so that the charges that retain data is captured in both or either the carrier trap of the silicon nitride and/or the carrier trap at the interface between the silicon nitride and the silicon oxide on and below it. In addition, also in this eighth embodiment similarly to the seventh embodiment, during the process of forming the insulator 31, the film quality of the silicon oxide on and below the silicon nitride is improved to the extent almost equal to that of the thermal oxide, by the oxygen plasma treatment performed after the deposition of the silicon oxide on and below the silicon nitride contributing to the data storing. Therefore, the same effects as those in the seventh embodiment can be achieved. Subsequently, after the insulator 31 and cap insulators 9 in the thin-film region A1, the thick-film region A2, and the isolation region A3 around them are selectively removed, a polycrystalline silicon film is deposited on the main surface of the semiconductor wafer 2W by the CVD method. Thereafter, phosphorus or arsenic is ion implanted into the deposited polycrystalline silicon film in the memory cell array MCA, the nMIS forming region of the thin-film region A1, and the thick-film region A2, and boron difluoride is ion implanted into the pMIS forming region of the thin-film region A1. Then, the thermal treatment is performed thereto to make the polycrystalline silicon film being a conductor film. In this thermal treatment, an impurity such as boron is thermally diffused from the upper polycrystalline silicon film to the lower polycrystalline silicon film 40 in the pMIS forming region of the thin-film region A1. Thereafter, a cap insulator is deposited on the conductor film and is patterned so that the cap insulator is left in the region for forming gate electrodes, and other than the memory cell array MCA. Then, the underlying conductor film is etched back by the anisotropic dry etching method with using the cap insulator as a mask. In this manner, as shown in FIG. 48, the gate electrodes 32a, composed of the conductor films, are formed in the memory cell array MCA, and the gate electrodes 8a, composed of the laminated film of the polycrystalline silicon film 40 and the conductor film 32b and the cap insulator 41 on the gate electrode 8a, are formed in the region other than the memory cell array MCA. Thereafter, for example, arsenic is ion implanted with using, as a mask, a resist pattern, from which the memory cell array MCA is exposed and which covers the other region, to form the n type semiconductor regions 35 in the substrate 2S.

Figure 49:
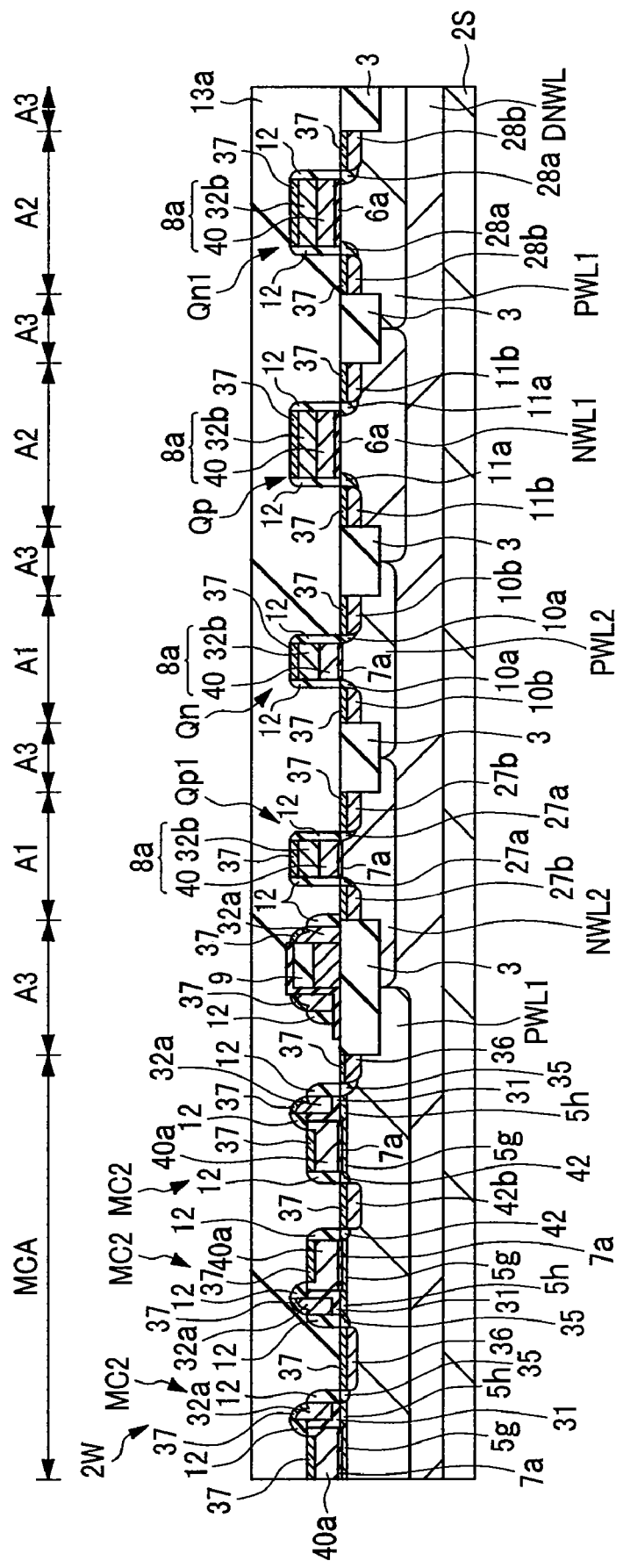
FIG. 49 is a sectional view showing the principal part at the step subsequent to that in FIG. 48 in the fabrication process of the semiconductor device.

Next, as shown in FIG. 49, the polycrystalline silicon film 40 in the memory cell array MCA is partially removed to form control gate electrodes 40a, and then arsenic is ion implanted thereto, and thereby n type semiconductor regions 42 are formed and the memory cells MC2 are formed. The memory cell MC2 has the selected MIS (including control gate electrode 40a) and the memory MIS (including gate electrode 32a). Subsequently, after the semiconductor regions 10a, 11a, 27a, and 28a are formed, the sidewalls 12, the semiconductor regions 10b, 11b, 27b, and 28b, the n+type semiconductor regions 42b, the silicide layer 37, and the insulator 13a are formed similarly to the seventh embodiment. Since the following process is identical to that of the seventh embodiment, the description thereof will be omitted.

The data writing into the memory cell MC2 is executed by injecting, for example, the hot electron generated in the channel to the insulator 31.

The date deletion is executed by injecting, for example, the hot hole of the substrate 2S to the insulator 31. In the case of this memory cell MC2, there are two methods for deleting data, that is, the above-mentioned tunnel deletion and the BTBT (Band-To-Band Tunneling) hot hole injection deletion. In the tunnel deletion, the data deletion is executed so that the electrons injected into the silicon nitride in the insulator 31 is extracted to the gate electrode 32a or the substrate 2S by the tunneling of the silicon oxide on and below the silicon nitride in the insulator 31 while applying a positive or negative voltage to the gate electrode 32a. Meanwhile, in the BTBT hot hole injection deletion, the data deletion is executed by applying the high voltage between the source and the gate electrode 32a and by injecting, into the silicon nitride in the insulator 31, the hot holes generated by the BTBT.

Furthermore, in the data reading, the stored data is read out depending on whether or not the predetermined current flows under the threshold voltage condition of the memory MIS (on the side of the gate electrode 32a) at the time when the control gate electrode 40a is, for example, turned on.

Also the eighth embodiment can achieve the same effects as those in the first to seventh embodiments. Also, similarly to the seventh embodiment, the object of the present invention can be achieved even if the silicon oxide formed below the silicon nitride and constituting the insulator 31 with a laminated structure is formed of a normal thermal oxide.

Ninth Embodiment

Figure 50:
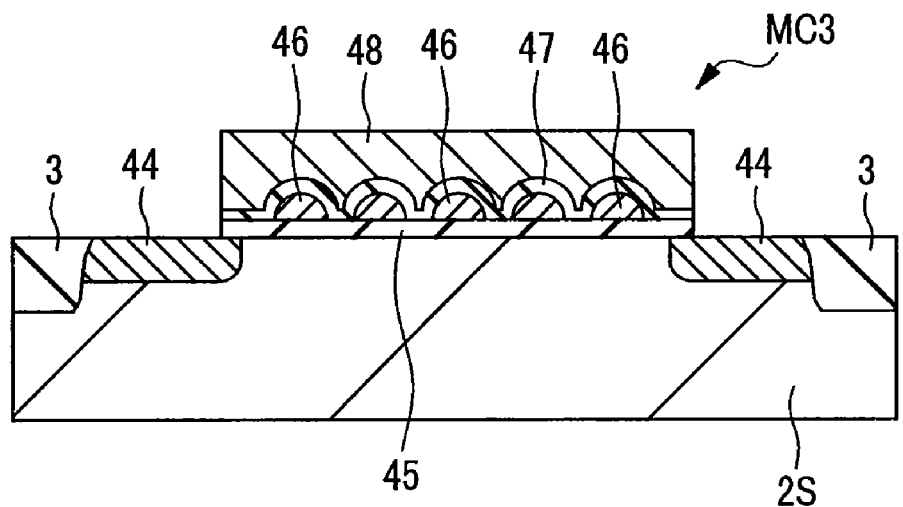
FIG. 50 is a sectional view showing the principal part of the semiconductor device according to another embodiment of the present invention.
Figure 51:
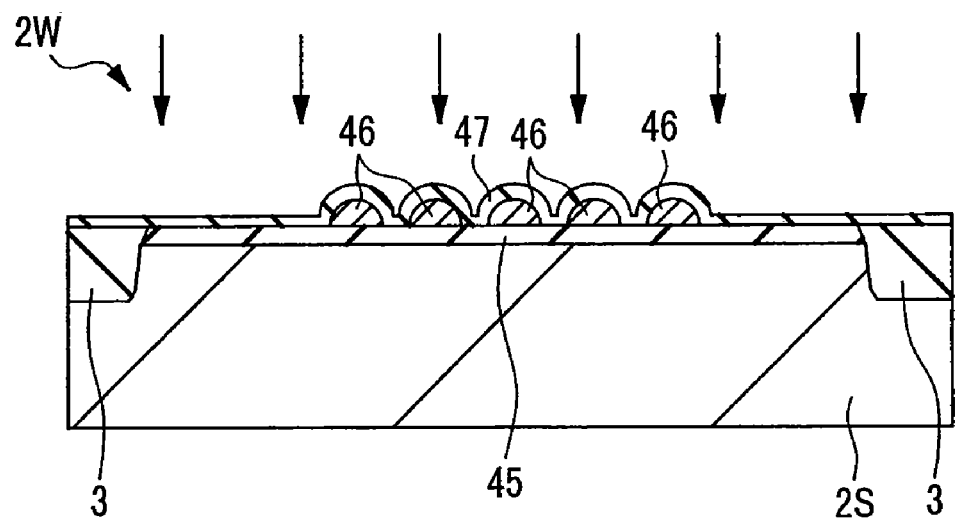
FIG. 51 is a sectional view showing the principal part in the fabrication process of the semiconductor device in FIG. 50.

In a ninth embodiment, an example of the case where the present invention is applied to another memory cell structure of the non-volatile memory will be described with reference to FIGS. 50 and 51. FIG. 50 is a sectional view showing the principal part of the memory cell MC3 in the non-volatile memory in the ninth embodiment, and FIG. 51 is a sectional view showing the principal part of the semiconductor wafer 2W during the fabrication process of the memory cell MC3 in FIG. 50.

As shown in FIG. 50, the memory cell MC3 of the non-volatile memory according to the ninth embodiment includes: a pair of n type semiconductor regions 44 for the source and drain formed in the substrate 2S; an insulator 45 formed on the main surface of the substrate 2S between the pair of n type semiconductor regions 44; a plurality of nanocrystals 46 formed on the insulator 45; an interlayer film 47 deposited on the insulator 45 so as to cover the nanocrystals 46; and a control gate electrode 48 formed on the interlayer film 47.

For example, phosphorus or arsenic is introduced to the n type semiconductor regions 44. The insulator 45 is made of, for example, silicon oxide and is formed by the thermal oxidation in this case. Also, the nanocrystals 46 are made of, for example, silicon single crystal with the almost plane circular shape and the diameter of several nm and are formed by, for example, the CVD method. Each of the nanocrystals 46 is a portion having the function equivalent to that of the floating gate electrode in the normal non-volatile memory, and is a portion that captures charges that retain data. Each of the nanocrystals 46 is formed to be physically separated. The memory cell MC3 with such structure is excellent in data retention because only a part of charges is lost even if there is the leak path in retaining the data. Therefore, it is possible to improve the reliability as the memory in the flash memory. In addition, also in the data deletion and writing, the characteristics of the nanocrystals 46 are equalized in the large number of nanocrystals 46, so that the influences due to the variation in the diameter of nanocrystals 46, the structural variation in the insulator and the like, and the random behavior can be reduced. Therefore, it is possible to improve the yield of the flash memory. The interlayer film 47 is made of, for example, silicon oxide, and is formed by, for example, the LPCVD method. In the ninth embodiment, the oxygen plasma treatment is performed to the interlayer film 47. More specifically, as shown in FIG. 51, after forming the plurality of nanocrystals 46 on the insulator 45 on the main surface of the semiconductor wafer 2W, the interlayer film 47 is deposited so as to cover the nanocrystals 46 by the LPCVD method. Thereafter, the oxygen plasma treatment is performed to the interlayer film 47 in the manner as schematically shown by the arrows in FIG. 51. By so doing, the film quality (breakdown voltage of insulator) of the interlayer film 47 can be improved to the extent almost equal to that of the thermal oxide. Since the film quality of the silicon oxide formed by the CVD method is not sufficient in general, the breakdown voltage of the interlayer film 47 cannot be sufficiently obtained if no treatment is performed. Therefore, it is necessary to increase the thickness of the interlayer film 47. However, if the thickness of the interlayer film 47 is increased, the coupling ratio is reduced. Although performing the thermal treatment is intended to improve the film quality, the long-time thermal treatment in the oxidizing atmosphere at a high temperature is required to obtain the sufficient effect. Accordingly, a problem arises such that the nanocrystals are oxidized and an oxide film with lower film quality is formed on the surface thereof. In addition, there is also the problem that the film quality of the interlayer 47 is inferior to that of the thermal oxide in spite of the long-time thermal treatment. In contrast, in this ninth embodiment, the film quality of the interlayer film 47 can be improved while the oxidation amount of nanocrystals is maintained slight, thereby allowing the coupling ratio to be improved. Therefore, it is possible to advance the low-voltage data writing and deletion operations to the memory cell MC3. The control gate electrode 48 is made of, for example, low-resistance polycrystalline silicon. It is also possible to achieve the low resistance by forming, for example, a cobalt silicide layer on the surface of the polycrystalline silicon.

Tenth Embodiment

Figure 52:
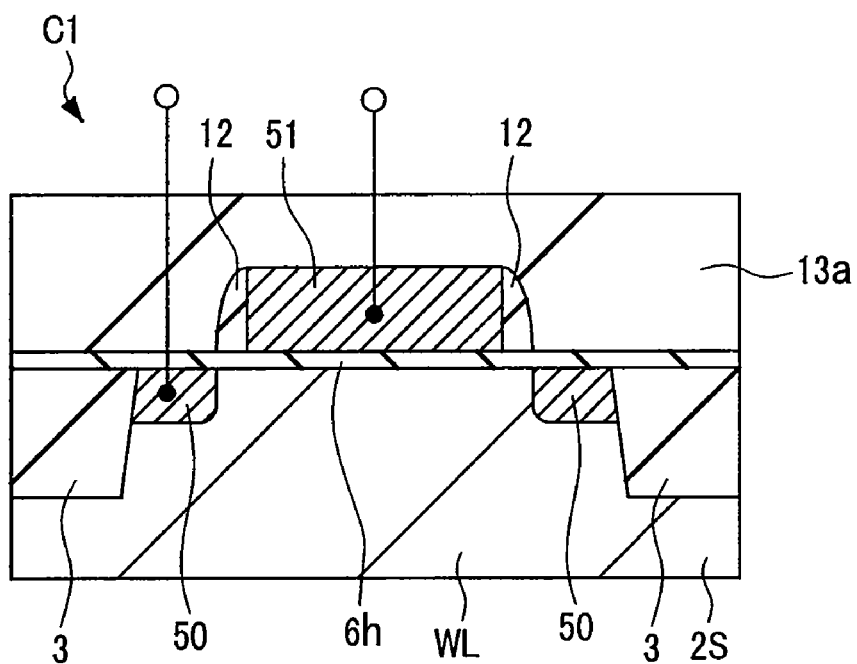
FIG. 52 is a sectional view showing the principal part of the semiconductor device according to another embodiment of the present invention.
Figure 53:
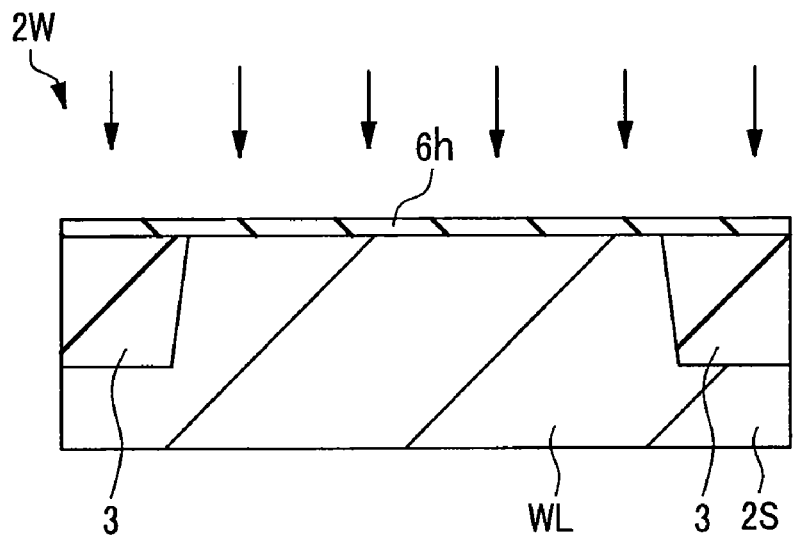
FIG. 53 is a sectional view showing the principal part in the fabrication process of the semiconductor device in FIG. 52.

In a tenth embodiment, an example of the case where the present invention is applied to, for example, a MIS capacitor will be described with reference to FIGS. 52 and 53. FIG. 52 is a sectional view showing the principal part of the MIS capacitor C1 in the tenth embodiment, and FIG. 53 is a sectional view showing the principal part of the semiconductor wafer 2W in the fabrication process of the MIS capacitor C1 in FIG. 52.

The MIS capacitor C1 according to the tenth embodiment shown in FIG. 52 is an integrated circuit device, which constitutes a booster circuit of the flash memory and is provided with: a pair of semiconductor regions 50 formed in the substrate 2S; the insulator 6h formed on the substrate 2S; and a capacitor gate electrode 51 formed on the insulator 6h. The semiconductor region 50 serves as a portion, to which the electrode of the MIS capacitor C1 is extracted, and becomes n type if the well WL of the substrate 2S is n type and becomes p type if the well WL is p type. The portion of the substrate 2S sandwiched between the semiconductor regions 50 serves as one of the electrodes of the MIS capacitor C1. The insulator 6h is a capacitor insulator of the MIS capacitor C1 and, for example, is made of silicon oxide or the like formed by the above-mentioned LPCVD method. In this tenth embodiment, the oxygen plasma treatment is performed to the insulator 6h. More specifically, as shown in FIG. 53, after depositing the insulator 6h on the main surface of the semiconductor wafer 2W by the LPCVD method, the oxygen plasma treatment is performed to the insulator 6h in the manner as schematically shown by the arrows in FIG. 53. By so doing, the film quality (breakdown voltage of insulator) of the insulator 6h can be improved to the extent almost equal to that of the thermal oxide. In this manner, it is possible to improve the performance and the reliability of the MIS capacitor C1. The capacitor gate electrode 51 is the portion, at which the other electrode of the MIS capacitor C1 is formed, and is made of, for example, low-resistance polycrystalline silicon. It is also possible to achieve the low resistance by forming, for example, a cobalt silicide layer on the surface of the polycrystalline silicon.

Eleventh Embodiment

Figure 54:
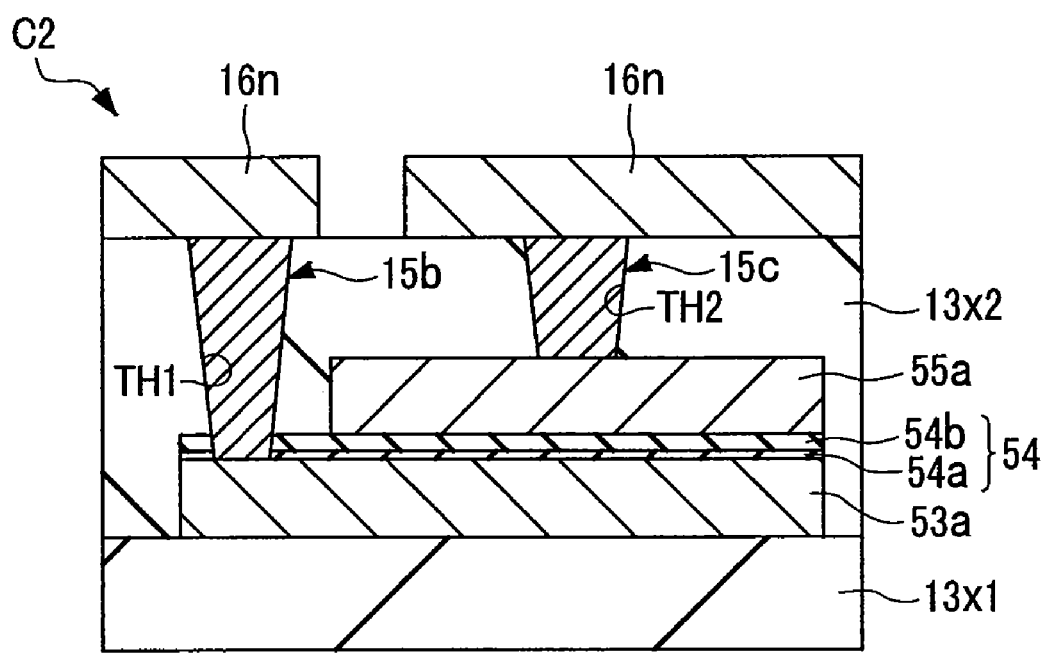
FIG. 54 is a sectional view showing the principal part of the semiconductor device according to another embodiment of the present invention.
Figure 55:
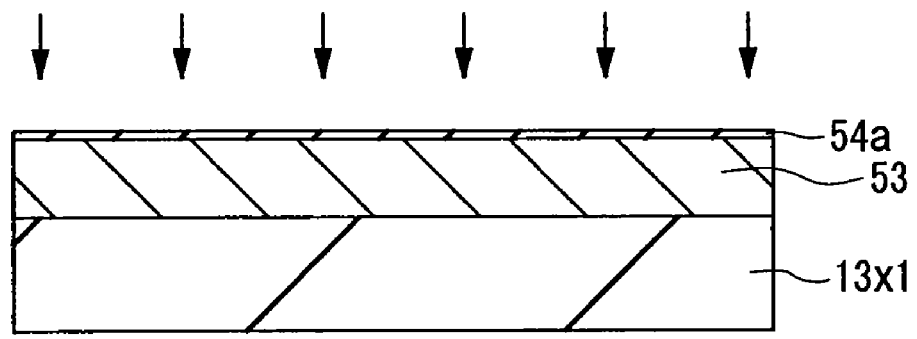
FIG. 55 is a sectional view showing the principal part in the fabrication process of the semiconductor device in FIG. 54.

In an eleventh embodiment, an example of the case where the present invention is applied to, for example, an MIM capacitor will be described with reference to FIGS. 54 and 55. FIG. 54 is a sectional view showing the principal part of the MIM capacitor C2 in the eleventh embodiment, and FIG. 55 is a sectional view showing the principal part of the semiconductor wafer in the fabrication process of the MIM capacitor C2 in FIG. 54.

The MIM capacitor C2 according to the eleventh embodiment shown in FIG. 54 includes: a first electrode 53a formed on the insulator 13x1; a capacitor insulator 54 formed thereon; and a second electrode 55a formed thereon. The first and second electrodes 53a and 55a are composed of, for example, conductor films made of titanium nitride. The capacitor insulator 54 has a laminated film structure, in which an insulator 54b made of, for example, silicon nitride is deposited on an insulator 54a made of, for example, silicon oxide. In this eleventh embodiment, the oxygen plasma treatment is performed to the insulator 54a. More specifically, as shown in FIG. 55, after depositing, by the LPCVD method, the insulator 54a on the conductor film 53 for forming the first electrode, the oxygen plasma treatment is performed to the insulator 54a in the manner as schematically shown by the arrows in FIG. 55. By so doing, since the film quality (breakdown voltage of insulator) of the insulator 54a can be improved to the extent almost equal to that of the thermal oxide, it is possible to improve the performance and the reliability of the MIM capacitor C2. If the oxygen plasma treatment is not performed, it is necessary to increase the thickness of the capacitor insulator (insulator 54a especially in this case) in order to secure the film quality (breakdown voltage) thereof. In contrast, since the film quality can be improved in this eleventh embodiment, the thickness of the insulator 54a can be reduced to, for example, about 4 nm. As a result, it is possible to increase the capacity of the MIM capacitor C2. Therefore, it is also possible to form the capacitor insulator 54 as a single layer of silicon oxide. Also in this case, since the film quality can be improved by performing the oxygen plasma treatment to the silicon oxide to be the capacitor insulator 54 and the thickness thereof can be reduced, it is possible to increase the capacity. Of course, the capacity can be further increased if the capacitor insulator 54 is formed of the laminated film of the silicon oxide to which the oxygen plasma treatment is performed, and, for example, the silicon nitride with the dielectric constant higher than the silicon oxide. Note that the above-mentioned insulator 13x1 is made of, for example, silicon oxide, and an insulator 13x2 made of, for example, silicon oxide is formed on the insulator 13x1 so as to cover the MIM capacitor C2. A through hole TH1, from which a part of the first electrode 53a is exposed, is formed in the insulator 13x2 and the capacitor insulator 54. A plug 15b is formed in the through hole TH1 and is electrically connected to the first electrode 53a. Also, a through hole TH2 from which a part of the second electrode 55a is exposed is formed in the insulator 13x2. A plug 15c is formed in the through hole TH2 and is electrically connected to the second electrode 55a. The plugs 15b and 15c are made of, for example, aluminum and are electrically connected to wirings 16n on the insulator 13x2. This MIM capacitor C2 is arranged at a relatively upper layer (at the height relatively close to an external terminal (bonding pad)).

Twelfth Embodiment

In a twelfth embodiment, the other portions, to which the oxygen plasma treatment is applied, will be described with reference to FIGS. 56 to 69.

Figure 56:
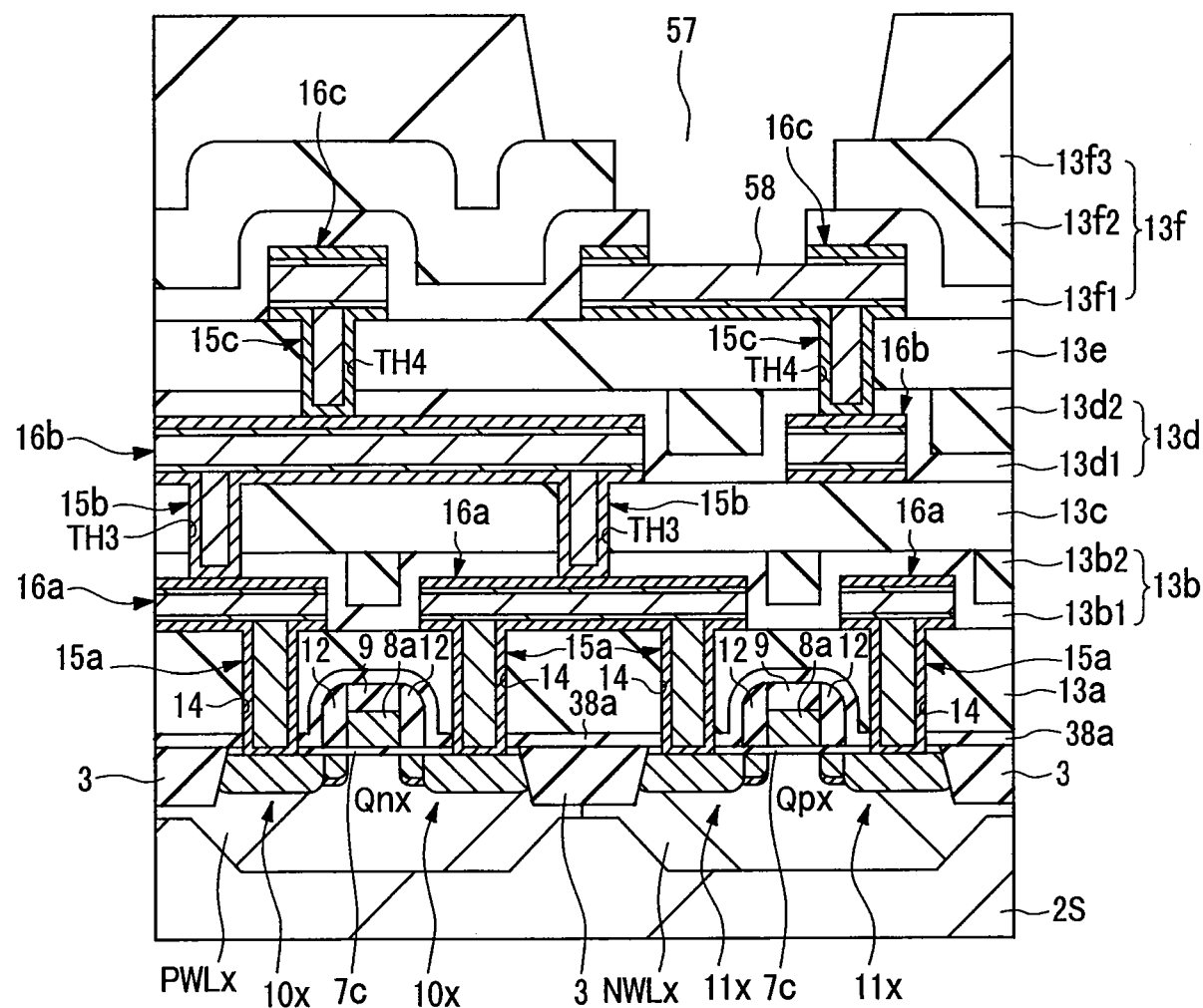
FIG. 56 is a sectional view showing the principal part of the semiconductor device according to another embodiment of the present invention.

FIG. 56 is a sectional view showing the principal part of the semiconductor device according to the twelfth embodiment. A p well PWLx and an n well NWLx are formed in the substrate 2S. An nMIS Qnx is formed in the active region in the p well PWLx surrounded by the device isolations 3. The nMIS Qnx is provided with: n type semiconductor regions 10x for the source and drain and with the LDD structures; the gate insulator 7c; and the gate electrode 8a. Meanwhile, a pMIS Qpx is formed in the active region in the n well NWLx surrounded by the device isolations 3. The pMIS Qpx is provided with: p type semiconductor regions 11x for the source and drain and with the LDD structures; the gate insulator 7c; and the gate electrode 8a. A CMIS (Complementary MIS) circuit is composed of the nMIS Qnx and the pMIS Qpx. A relatively thin insulator 38a made of, for example, silicon oxide is deposited on the main surface of the substrate 2S so as to cover the nMIS Qnx and the pMIS Qpx. Insulators 13a to 13e to be interlayer insulators and first to third wirings 16a to 16c are formed on and over the insulator 38a. The insulators 13b to 13e are made of, for example, silicon oxide. The insulator 13b is formed by filling, with an insulator 13b2, the concave portions of an insulator 13b1. Similarly, the insulator 13d is formed by filling, with an insulator 13d2, the concave portions of an insulator 13d1. The upper surfaces of the respective insulators 13a to 13e are planarized by, for example, the CMP method. The second layer wiring 16b is electrically connected to the first layer wiring 16a through the plug 15b in the through hole TH3. In addition, the uppermost third layer wiring 16c is electrically connected to the second layer wiring 16b through the plug 15c in the through hole TH4. The first to third layer wirings 16a to 16c are formed by laminating, for example, titanium nitride (TiN), titanium (Ti), aluminum (Al), titanium, and titanium nitride in this order from below. In addition, the plugs 15b and 15c have the structure identical to that of the plug 15a. The uppermost third layer wiring 16c is covered with a surface protection film 13f. The surface protection film 13f is formed by, for example, laminating insulators 13f1 to 13f3. The lowermost insulator 13f1 is made of, for example, silicon oxide, the insulator 13f2 thereon is made of, for example, silicon nitride, and further the uppermost insulator 13f3 is made of, for example, polyimide resin or the like. An opening 57, from which a part of the wiring 16c is exposed, is formed in a part of the surface protection film 13f. The part of the wiring 16c exposed from the opening 57 serves as an external terminal 58. A bonding wire or a bump electrode is bonded to the external terminal 58.

In this twelfth embodiment, the oxygen plasma treatment is performed to the device isolations 3, the insulator 38a, and the surfaces of the insulators 13a, 13c, 13e, and 13f1 in this semiconductor device. Each part will be described below with reference to FIGS. 57 to 68. FIGS. 57 to 68 are sectional views showing the principal part of the semiconductor wafer 2W in the fabrication process of the semiconductor device in FIG. 56. FIG. 69 is a sectional view showing the principal part of the semiconductor wafer in which the problems caused by not performing the oxygen plasma treatment in this embodiment are illustrated for comparison.

Figure 57:
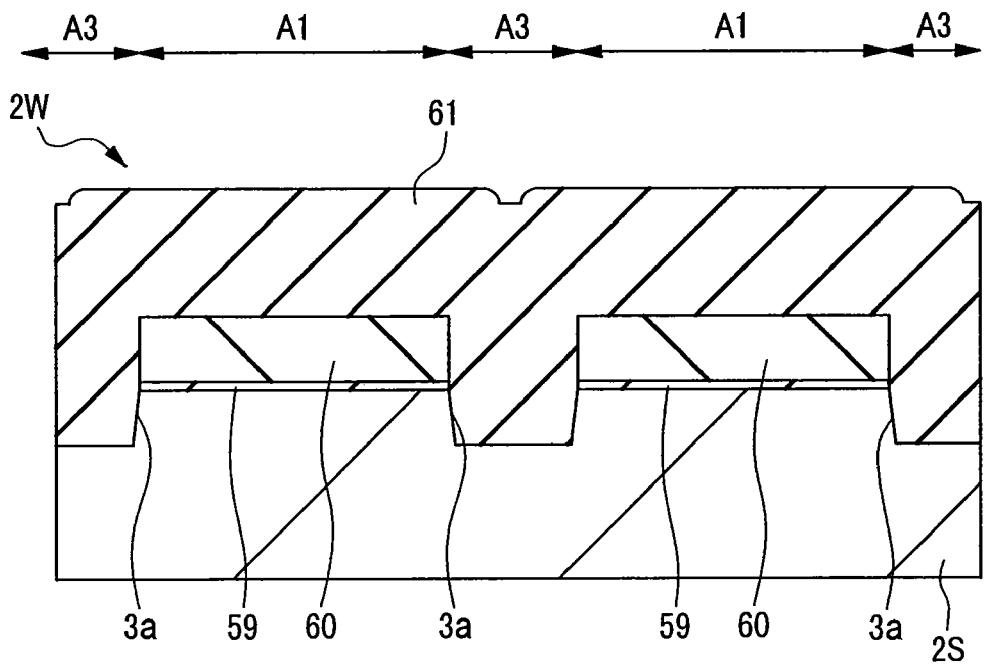
FIG. 57 is a sectional view showing the principal part in the fabrication process of the semiconductor device in FIG. 56.
Figure 58:
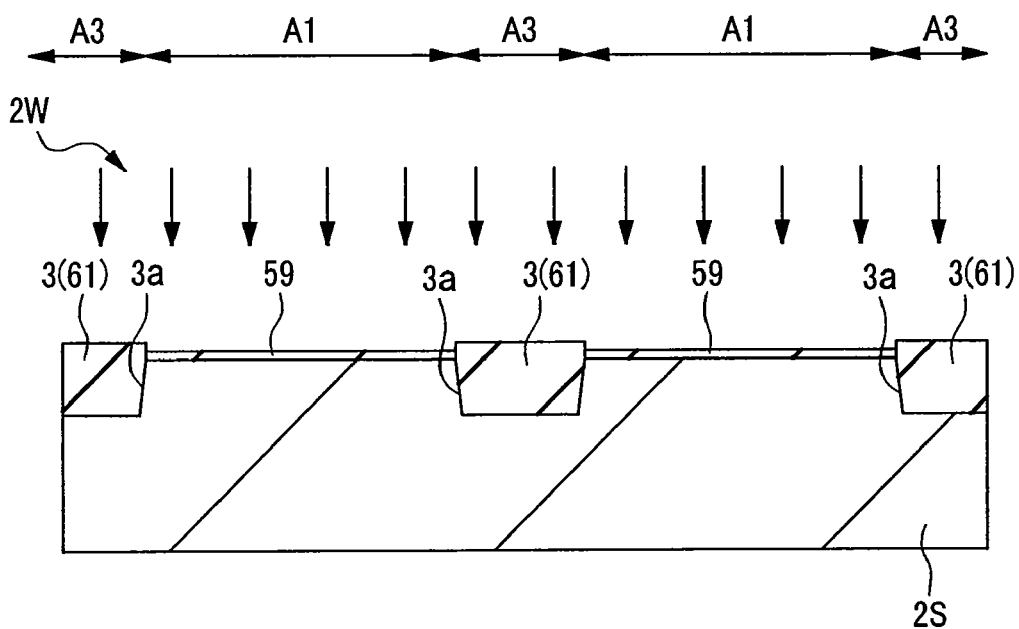
FIG. 58 is a sectional view showing the principal part at the step subsequent to that in FIG. 57 in the fabrication process of the semiconductor device in FIG. 56.
Figure 59:
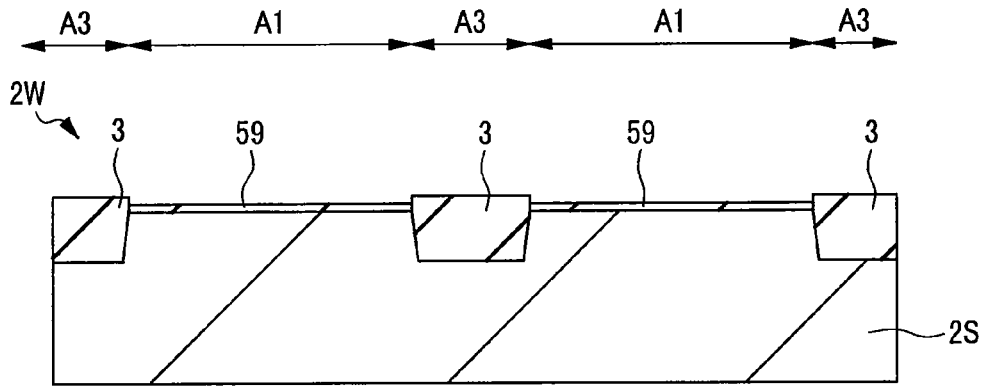
FIG. 59 is a sectional view showing the principal part at the step subsequent to that in FIG. 58 in the fabrication process of the semiconductor device in FIG. 56.
Figure 60:
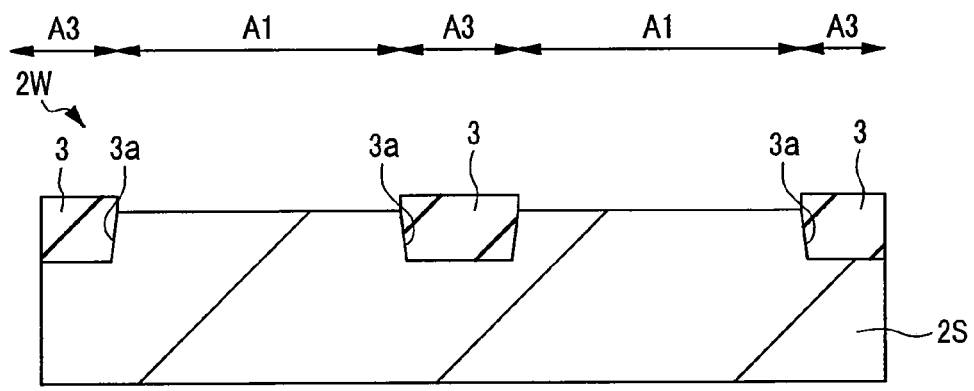
FIG. 60 is a sectional view showing the principal part at the step subsequent to that in FIG. 59 in the fabrication process of the semiconductor device in FIG. 56.
Figure 61:
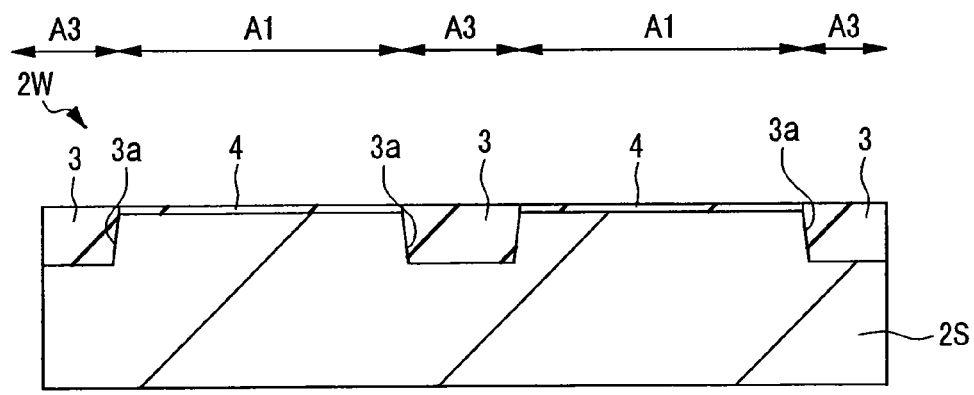
FIG. 61 is a sectional view showing the principal part at the step subsequent to that in FIG. 60 in the fabrication process of the semiconductor device in FIG. 56.

First, the device isolations 3 will be described with reference to FIGS. 57 to 61. As shown in FIG. 57, an insulator 59 made of, for example, silicon oxide is formed on the main surface of the semiconductor wafer 2W by the thermal oxidation method so as to have about 20 nm in equivalent oxide thickness, and then an insulator 60 made of, for example silicon nitride is deposited thereon by the LPCVD method so as to have the thickness of about 130 nm. Subsequently, after patterning the insulator 60 by the etching with using a resist pattern as a mask, the resist pattern is removed. Subsequently, the insulator 59 and the substrate 2S exposed from the left insulator 60 are etched using the left insulator as an etching mask, and trenches 3a, extending in the thickness direction from the main surface of the substrate 2S, are formed in the substrate 2S. Then, after the cleaning process, a silicon oxide with about 10 nm in equivalent oxide thickness is formed in each of the trenches 3a by the thermal oxidation treatment. Thereafter, an insulator 61 made of, for example, silicon oxide is deposited on the main surface of the semiconductor wafer 2W by the LPCVD method so as to fill the trenches 3a. Then, the upper surface of the insulator 61 is polished by the CMP method and is planarized, as shown in FIG. 58, to fill the trenches 3a with the insulator 61 and to form the device isolations 3. In this step, the insulator 60 is reduced in thickness in comparison to that before the polishing, but is left in the active region. Thereafter, the insulator 60 is selectively removed by the wet etching or the like with respect to the insulator 59, and the oxygen plasma treatment is performed to the main surface of the semiconductor wafer 2W in the manner as schematically shown by the arrows in FIG. 58. In this manner, the film quality of the surface of the device isolation 3 can be improved. More specifically, the film quality of the surface portion of the device isolation 3 is improved to the extent almost equal to that of the thermal oxide. Also, since the oxygen plasma treatment causes small damages as described above, the active region is not damaged. In addition, since the insulator 59 is left in the active region at this step, no damage is caused therein. Next, the insulator 59 left on the substrate 2S, as shown in FIG. 59, is removed by the etching as shown in FIG. 60. At this time, the device isolations 3, made of silicon oxide formed by the CVD method, do not generally have sufficient film quality. Therefore, if no treatment is performed, the device isolations 3 are significantly etched when the insulator 59, made of silicon oxide with good film quality formed by the thermal oxidation treatment, is removed. As a result, there is a possibility that the recession will be formed in the upper surfaces of the device isolations 3 in many cases. The recession causes the degradation of the switching characteristics of the MIS. In contrast, in the twelfth embodiment, the film quality of the upper surface of the device isolation 3 is improved to the extent almost equal to that of the thermal oxide by the oxygen plasma treatment. Therefore, it is possible to remove the insulator 59 without forming large recessions in the device isolation 3. As a result, it is possible to improve the reliability and the characteristics of the nMIS Qnx and the pMIS Qpx. Thereafter, as shown in FIG. 61, the insulator 4 for protection is formed on the exposed surface of the substrate 2S by the thermal oxidation method, and the subsequent process is performed.

Figure 62:
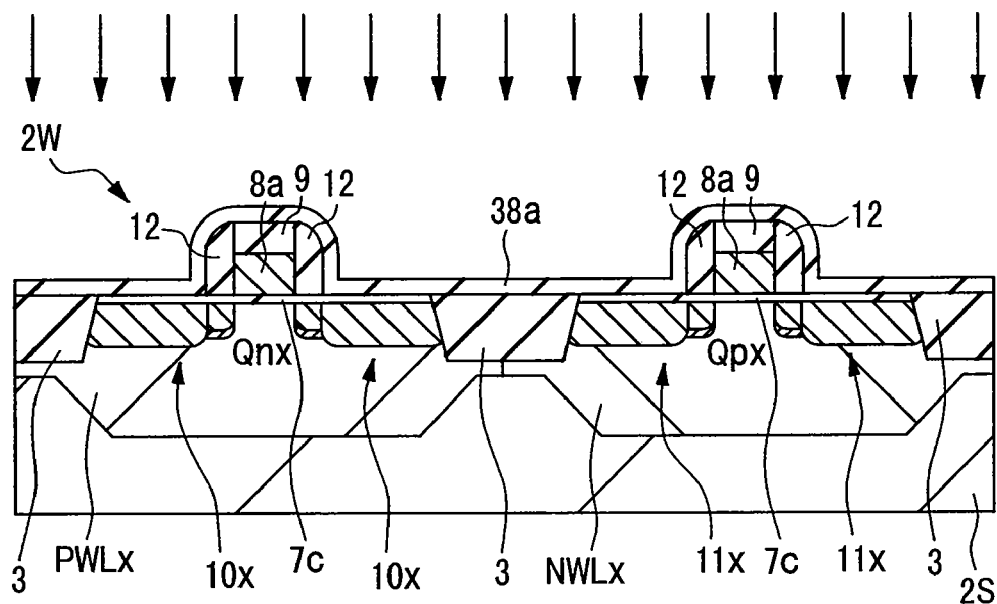
FIG. 62 is a sectional view showing the principal part in the fabrication process of the semiconductor device in FIG. 56.
Figure 63:
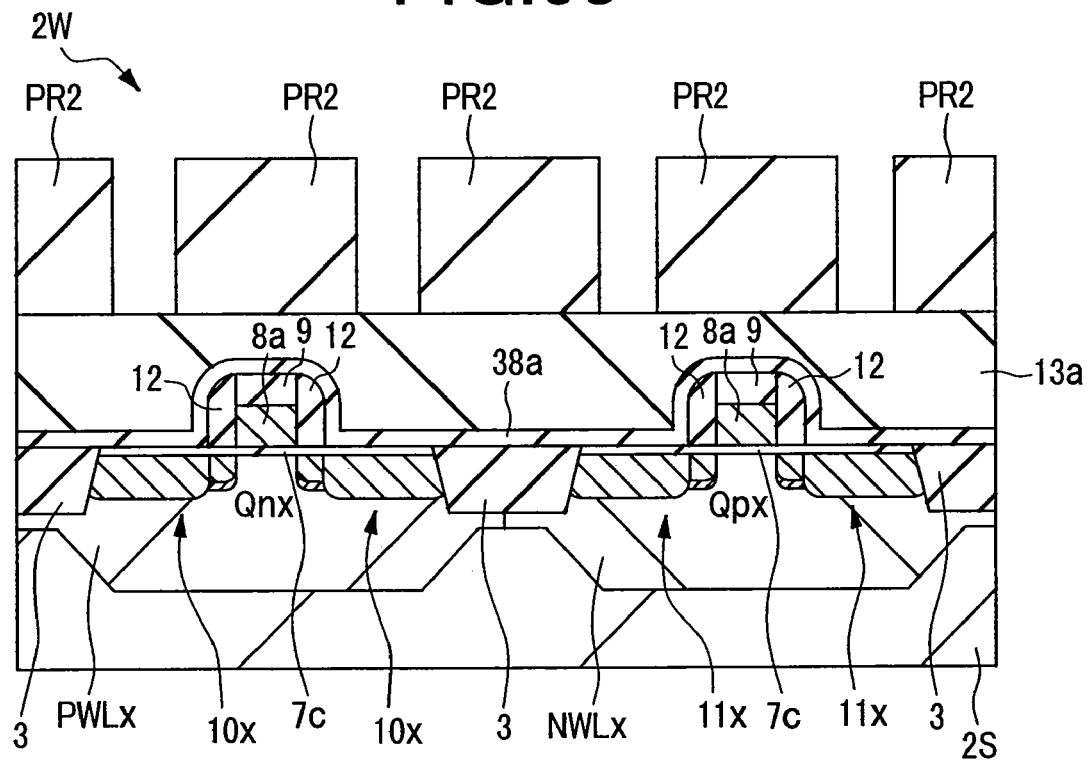
FIG. 63 is a sectional view showing the principal part at the step subsequent to that in FIG. 62 in the fabrication process of the semiconductor device in FIG. 56.
Figure 64:
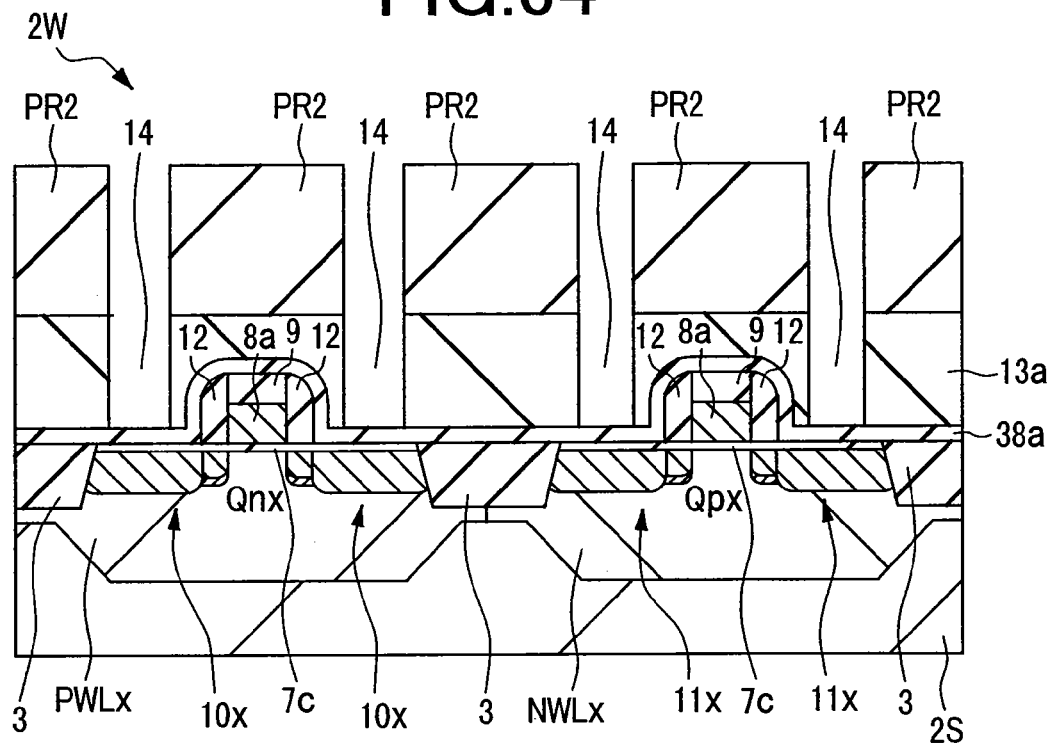
FIG. 64 is a sectional view showing the principal part at the step subsequent to that in FIG. 63 in the fabrication process of the semiconductor device in FIG. 56.
Figure 65:
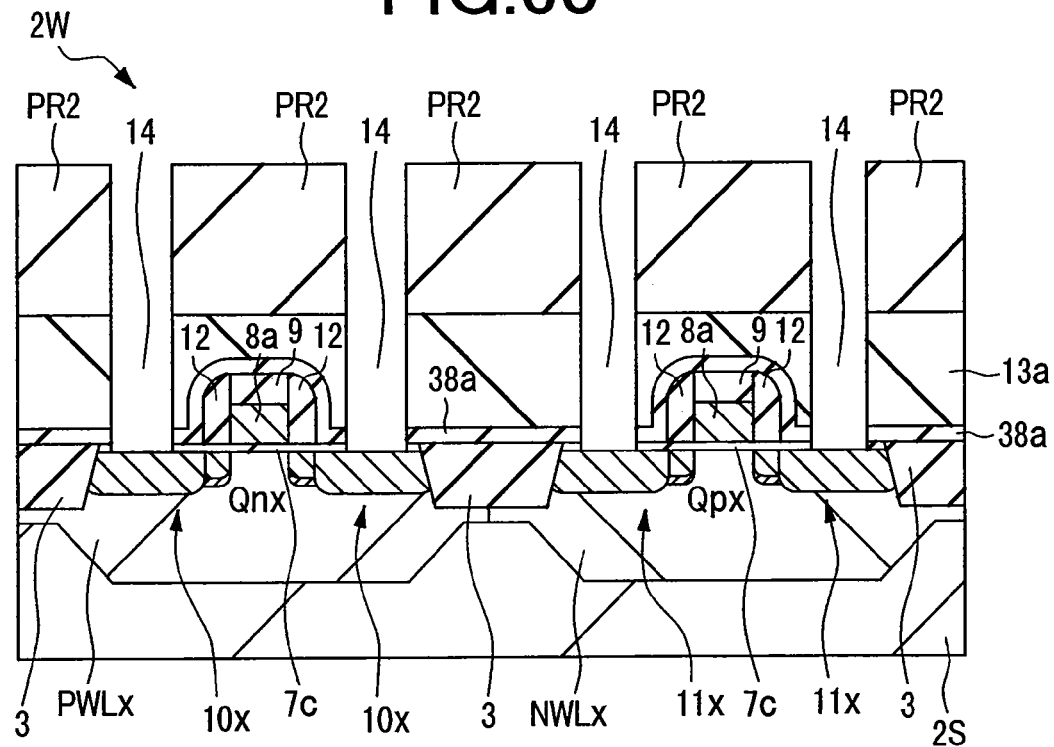
FIG. 65 is a sectional view showing the principal part at the step subsequent to that in FIG. 64 in the fabrication process of the semiconductor device in FIG. 56.

Next, the above-mentioned insulator 38 will be described with reference to FIGS. 62 to 65. As shown in FIG. 62, an insulator 38a made of, for example, silicon oxide is deposited on the main surface of the semiconductor wafer 2W by the LPCVD method so as to cover the nMIS Qnx and the pMIS Qpx, and then the oxygen plasma treatment is performed in the manner as schematically shown by the arrows in FIG. 62. By so doing, it is possible to improve the film quality of the insulator 38a to the extent almost equal to that of the thermal oxide. Subsequently, as shown in FIG. 63, after depositing an insulator 13a on the main surface of the semiconductor wafer 2W through the insulator 38a by the LPCVD method, a resist pattern PR2 for forming contact holes is formed on the upper surface thereof. Then, as shown in FIG. 64, contact holes 14, each having almost plane circular shape, are formed in the insulator 13a with using the resist pattern PR2 as an etching mask. At this time, since the film quality of the insulator 38a is improved to the extent almost equal to that of the thermal oxide in the twelfth embodiment, the etching rate of the insulator 38a can be made slower than that of the insulator 13a formed by the LPCVD method. More specifically, the insulator 38a can function as an etching stopper. In this manner, even if the contact holes 14 are misaligned and formed on the parts of the device isolations 3, it is possible to prevent the excessive removal of the device isolations 3 exposed from the contact holes 14. In addition, it is also possible to prevent the excessive removal of the substrate 2S exposed from the bottoms of the contact holes 14. After the further etching treatment, the contact holes 14 are formed, as shown in FIG. 65. In general, the insulator 38a is made of a material other than that of the insulator 13a, for example, silicon nitride to obtain the high etching selectivity. By so doing, the problems, caused by forming the contact holes 14, are prevented. However, in the case of using silicon nitride, since the dielectric constant of the silicon nitride is approximately twice as high as that of the silicon nitride, the wiring capacitance is increased. In contrast, in the twelfth embodiment, the silicon oxide is used as a material of the insulator 38a. Therefore, it is possible to reduce the wiring capacitance and also to advance the improvement of the operation speed of the semiconductor device.

Next, the insulators 13a, 13c, and 13e functioning as interlayer insulators will be described with reference to FIGS. 66 to 69. Note that since the oxygen plasma treatment to the insulators 13a, 13c, and 13e is almost identical to each other, the oxygen plasma treatment to the insulator 13a will be described and the description of the oxygen plasma treatment to the insulators 13c and 13e will be omitted.

Figure 66:
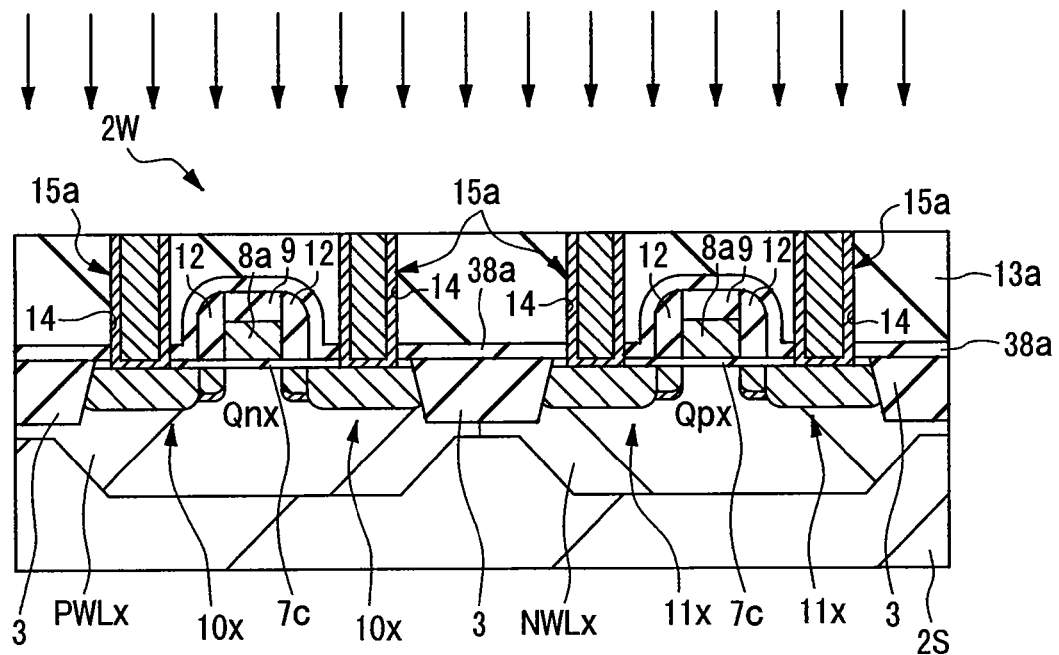
FIG. 66 is a sectional view showing the principal part in the fabrication process of the semiconductor device in FIG. 56.
Figure 67:
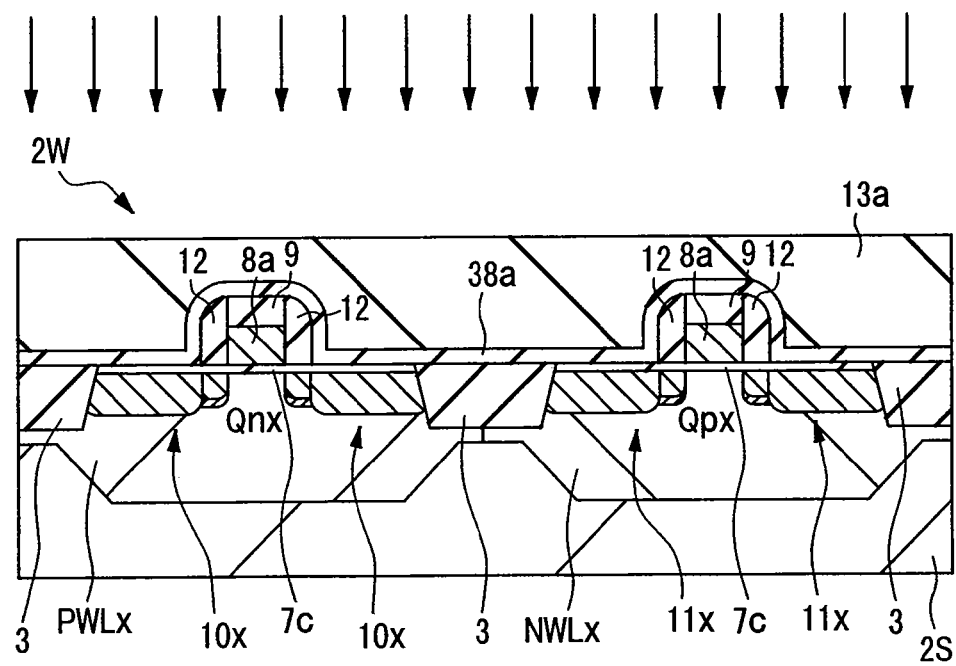
FIG. 67 is a sectional view showing the principal part at the step subsequent to that in FIG. 66 in the fabrication process of the semiconductor device in FIG. 56.

As shown in FIG. 66, the plugs 15a are formed in the contact holes 14 of the insulator 13a by the CMP method in the same manner as that in the first embodiment, and then the oxygen plasma treatment is performed to the upper surface (i.e., polished surface) of the insulator 13a. By so doing, the film quality of the upper portion of the insulator 13a can be improved to the extent almost equal to that of the thermal oxide under the relatively low temperature condition. In addition, dangling bonds exist on the upper surface of the insulator 13a polished by the CMP treatment, and the states on the upper surface become unstable in some cases. However, in the twelfth embodiment, the state of the upper surface of the insulator 13a can be stabilized by the oxygen plasma treatment. In the case where the plugs 15a are not formed by the CMP method (i.e., in the case where, after forming the contact holes 14, a wiring conductor film is deposited and is patterned by the lithography technique and the dry etching technique to form the wiring), the oxygen plasma treatment can be performed after the deposition of the insulator 13a, as shown in FIG. 67.

Figure 68:
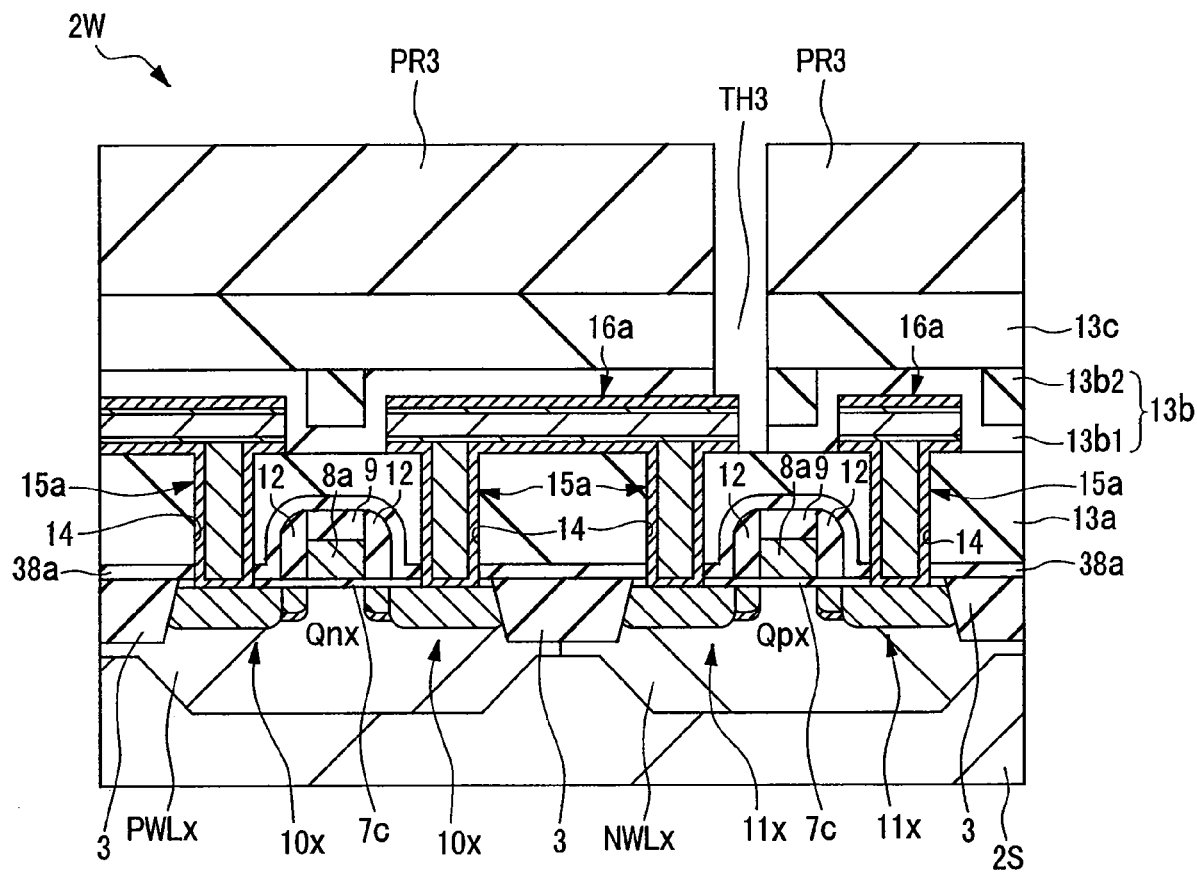
FIG. 68 is a sectional view showing the principal part at the step subsequent to that in FIG. 67 in the fabrication process of the semiconductor device in FIG. 56.
Figure 69:
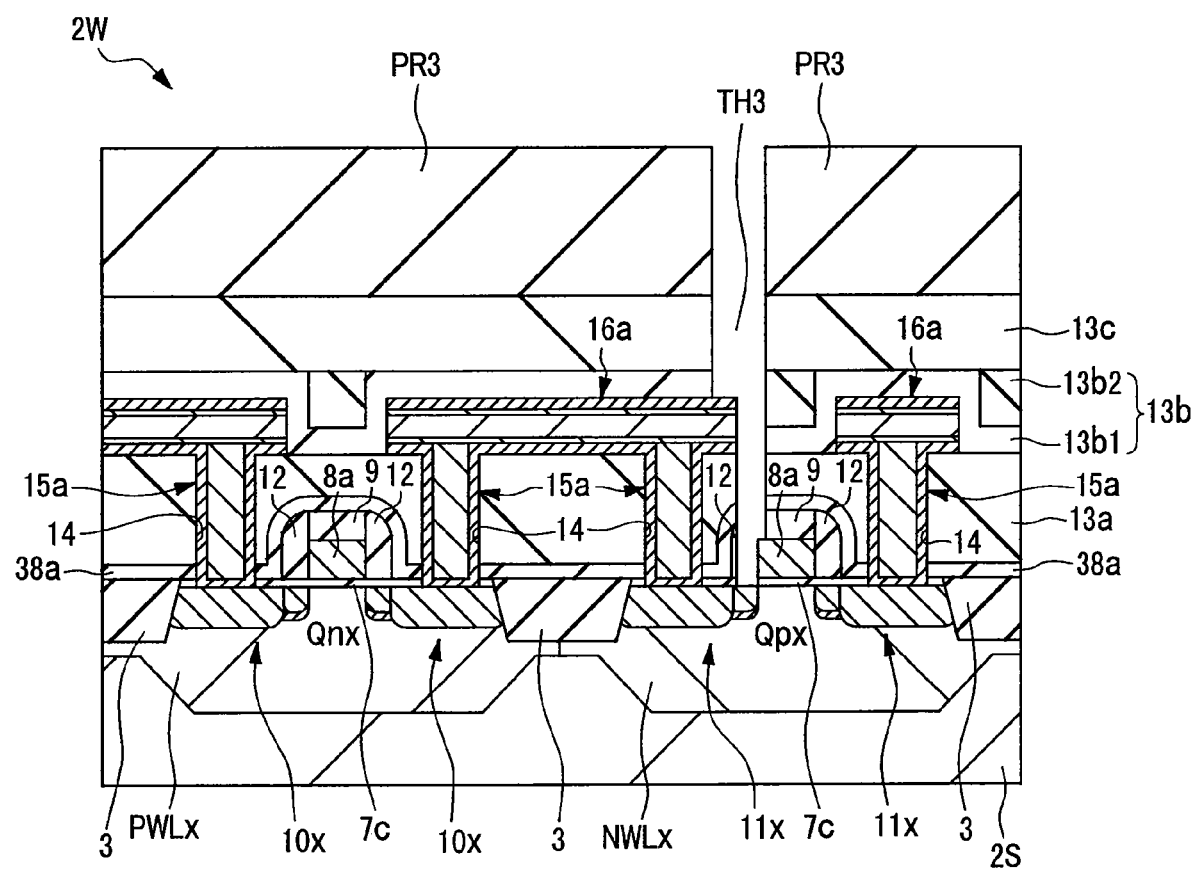
FIG. 69 is a sectional view showing the principal part of the semiconductor wafer, in which the case of not performing the oxygen plasma treatment is illustrated for comparison.

Subsequently, after removing the metal insulator formed on the plugs 15a by the cleaning, as shown in FIG. 68, the wiring 16a is formed over the insulator 13a. Furthermore, after depositing the insulators 13b and 13c, the resist pattern PR3 for forming through holes is formed on the insulator 13c. Thereafter, the insulators 13c and 13b, exposed from the resist pattern PR3 used as an etching mask, are removed by the etching, and the through hole TH3, from which a part of the wiring 16a is exposed, is formed. In FIG. 68, the case in which the position of the through hole TH3 is misaligned is exemplified for explaining the effect of the oxygen plasma treatment to the insulator 13a. Since the upper surface of the insulator 13a is reformed by the oxygen plasma oxidation in the twelfth embodiment, the etching rate of the insulator 13a can be made slower than those of the insulators 13b and 13c formed by the CVD method. More specifically, the insulator 13a can function as an etching stopper. Therefore, even if the insulator 13a is exposed from the bottom of the through hole TH3 due to the misalignment of the through hole TH3, it is possible to reduce or prevent the failure that the insulators 13a, 38a, 9, and 12 exposed from the through hole TH3 are etched. The case where the oxygen plasma treatment is not performed to the insulator 13a and the insulator 38a is exemplified in FIG. 69 for comparison. The insulators 13a, 38a, 9, and 12 exposed from the through hole TH3 are etched, and the through hole TH3 reaches the substrate 2S and the gate electrode 8a. If a plug is formed in this through hole TH3 in this condition, the substrate 2S, the gate electrode 8a, and the wiring 16a are electrically connected by the plug.

Next, the insulator 13f1 of the above-mentioned surface protection film 13f will be described with reference to FIG. 56. In the twelfth embodiment, after depositing the insulator 13f1 of the surface protection film 13f by the LPCVD method, the oxygen plasma treatment is performed to the insulator 13f1 in the same manner as described above. By so doing, the film quality of the insulator 13f1 can be improved to the extent almost equal to that of the thermal oxide under the relatively low temperature condition. The surface protection film 13f is the uppermost insulator of the semiconductor chip and plays an important role in the prevention of the penetration of pollutants and moisture. Since the film quality of the silicon oxide formed by the CVD method is not sufficient in some cases, it is not suitable from the viewpoint of the penetration of the pollutants and moisture. In contrast, since the film quality of the insulator 13f1 in the surface protection film 13f can be improved by performing the oxygen plasma treatment to the insulator 13f1 in the twelfth embodiment, the ability to prevent the penetration of the pollutants and moisture can be improved. Consequently, it is possible to improve the operation reliability and the lifetime of the semiconductor device.

Thirteenth Embodiment

The semiconductor device according to a thirteenth embodiment is a semiconductor device having, for example, an n-channel power MISFET (Power Metal Insulator Semiconductor Field Effect Transistor: power transistor) with a trench gate structure. An example of the method for fabricating the semiconductor device according to the thirteenth embodiment will be described below with reference to FIGS. 70 to 72.

Figure 70:
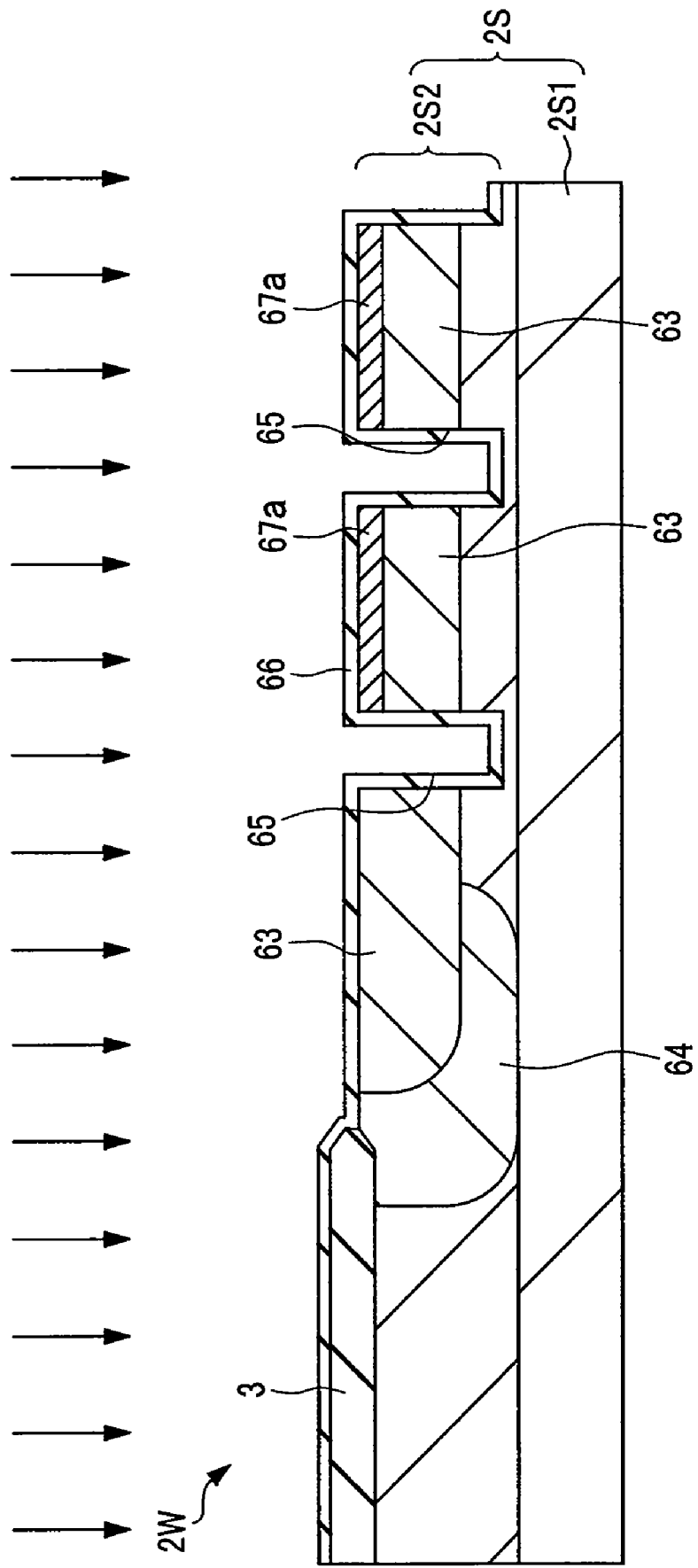
FIG. 70 is a sectional view showing the principal part in the fabrication process of the semiconductor device according to another embodiment of the present invention.

FIG. 70 is a sectional view showing the principal part in the fabrication process of the semiconductor device according to the thirteenth embodiment. The substrate 2S is a so-called epitaxial wafer (semiconductor wafer 2W) having, for example, the structure in which an $n^{31}$ semiconductor layer 2S2 is deposited by the epitaxial method on an $n^+$ semiconductor layer 2S1. The semiconductor layers 2S1 and 2S2 are made of, for example, single crystal silicon (Si). The impurity concentration of the semiconductor layer 2S1 is, for example, about $2.0 \times 10^{19}$ cm$^{-3}$, and the impurity concentration of the semiconductor layer 2S2 is, for example, about $1.0 \times 10^{16}$ cm$^{-3}$. The p-type semiconductor regions (well) 63 are formed in the semiconductor layer 2S2. The semiconductor region 63 is a region in which channels of a plurality of power MISFETs (referred to as power MIS, hereinafter) are formed. The semiconductor region 63 is formed, for example, by diffusing boron (B) from the main surface of the semiconductor layer 2S2 to the intermediate portion of the semiconductor layer 2S2 in the thickness direction. The peak concentration of the impurity in the semiconductor region 63 is, for example, about $1 \times 10^{16}$ to $1 \times 10^{18}$ cm$^{-3}$. Also, a p type semiconductor region (well) 64 is formed on the outer circumferential edge of the semiconductor region 63 in the semiconductor layer 2S2. The semiconductor region 64 contains, for example, boron. Also, the device isolation 3 made of, for example, silicon oxide (SiO$_2$ or the like) is formed in the isolation region on the main surface of the semiconductor layer 2S2 by a LOCOS (Local Oxidization of Silicon) method. As described above, the device isolation 3 may have a trench structure (trench isolation). The active region surrounded by the device isolation 3 is a power MIS forming region. A plurality of trenches 65 are formed in this active region. Each trench 65 is provided to each of the cells. The trench 65 extends from the main surface of the semiconductor layer 2S2 to the intermediate position of the semiconductor layer 2S2 in the thickness direction when seen in section, and extends in a predetermined direction when seen in plane. A gate insulator 66 made of, for example, silicon oxide is formed on the inner wall surface of the trench 65 and on the upper surface of the semiconductor layer 2S2 around the openings of the trenches 65. The gate insulator 66 has a laminated structure in which the silicon oxide deposited by the LPCVD method is stacked on the silicon oxide formed by thermal oxidation method. In the case of the thin type power MIS, the problem of the crystal defect occurs in some cases if the gate insulator 66 is formed of only the thermal oxide. Therefore, it is impossible to form the entire of the gate insulator 66 with the thermal oxide. For this reason, the gate insulator 66 is composed of the laminated film of the thermal oxide and the CVD film. In this thirteenth embodiment, after the formation of the gate insulator 66, the oxygen plasma treatment is performed in the manner as schematically shown by the arrows in FIG. 70. By so doing, the film quality (breakdown voltage of gate insulator) of the entire gate insulator 66 can be improved to the extent almost equal to that of the thermal oxide under the relatively low temperature condition. Therefore, it is possible to improve the characteristics of the power MIS. The problems of the crystal defect and the rediffusion of impurity can be reduced or prevented owing to the relatively low temperature condition. In addition, since the oxygen plasma treatment is a low energy treatment, the gate insulator 66 and the main surface of the substrate 2S are not damaged. Note that the n type semiconductor region 67a for the source is formed between the adjacent trenches 65 in the semiconductor layer 2S2. The semiconductor region 67a is formed by the diffusion of, for example, arsenic (As) from the main surface of the semiconductor layer 2S2 to the intermediate portion of the semiconductor layer 2S2 in the depth direction of the semiconductor region 63, and the semiconductor region 67a is already formed before the trenches 65 are formed. The peak concentration of the impurity in the semiconductor region 67a is, for example, about $1 \times 10^{18}$ to $1 \times 10^{20}$ cm$^{-3}$.

Figure 71:
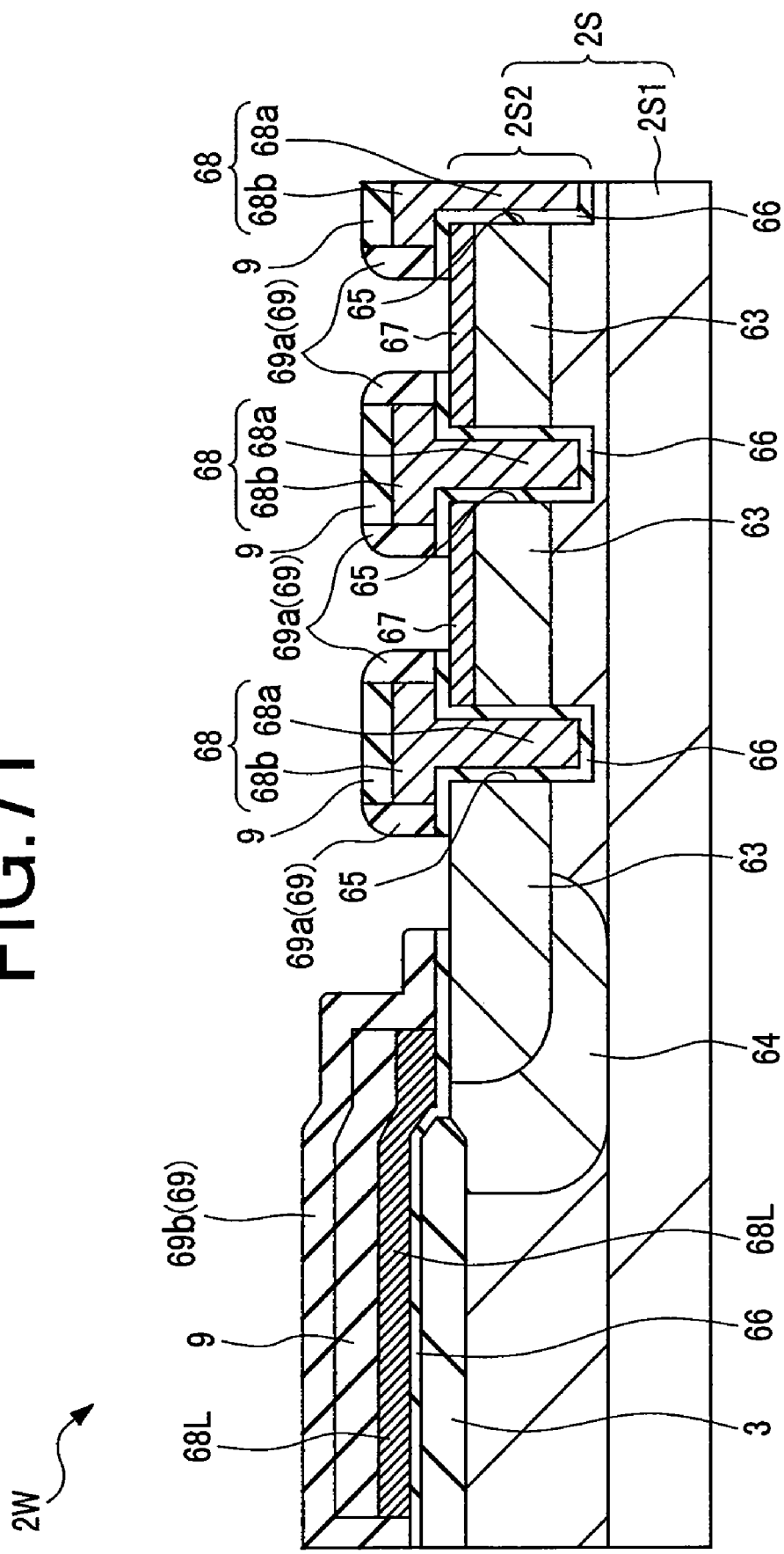
FIG. 71 is a sectional view showing the principal part at the step subsequent to that in FIG. 70 in the fabrication process of the semiconductor device.

Next, FIG. 71 is a sectional view showing the principal part at the step subsequent to that in FIG. 70 in the fabrication process of the semiconductor device. In this step, the trench type gate electrode 68 of the power MIS is formed on the gate insulator 66. The gate electrode 68 is made of, for example, low-resistance polycrystalline silicon and has a T-shape in section. More specifically, the gate electrode 68 has a first portion 68a filled in the trench 65 via the gate insulator 66 and a second portion 68b following the first portion 68a, protruded to the outside of the trench 65, and having the width larger than that of the trench 65 (dimension of the shorter side). In addition, in the circumference of the power MIS forming region, a gate extraction wiring 68L is formed over the main surface of the semiconductor layer 2S2 via the gate insulator 66 and the device isolation 3. The gate extraction wiring 68L is formed together with each gate electrode 68 and is electrically connected to the same. The cap insulator 9 made of, for example, silicon oxide is patterned and deposited on such gate electrode 68 and gate extraction wiring 68L. In this case, after a resist pattern, which covers the region other than the source region, is formed on the main surface of the substrate 2S in FIG. 71, the ion implantation of, for example, arsenic is performed to the main surface of the substrate 2S with using the resist pattern as a mask. By so doing, an n type semiconductor region (second semiconductor region) 67 for the source is formed between the adjacent gate electrodes 68 over the surface of the semiconductor layer 2S2. Subsequently, an insulator 69 made of, for example, silicon oxide is deposited on the main surface of the semiconductor layer 2S2 of the semiconductor wafer 2W by the CVD method, and then a resist pattern, which covers the outer circumferential region of the power MIS forming region and from which the other regions are exposed, is formed thereon. In this state, the etch back treatment is performed to the insulator 69 on the semiconductor wafer 2W by the anisotropic dry etching method. By so doing, sidewalls 69a are formed on the sidewalls of the gate electrodes 68 and the cap insulators 9 in the power MIS forming region, and the insulator 69b is formed in the periphery of the power MIS forming region.

Figure 72:
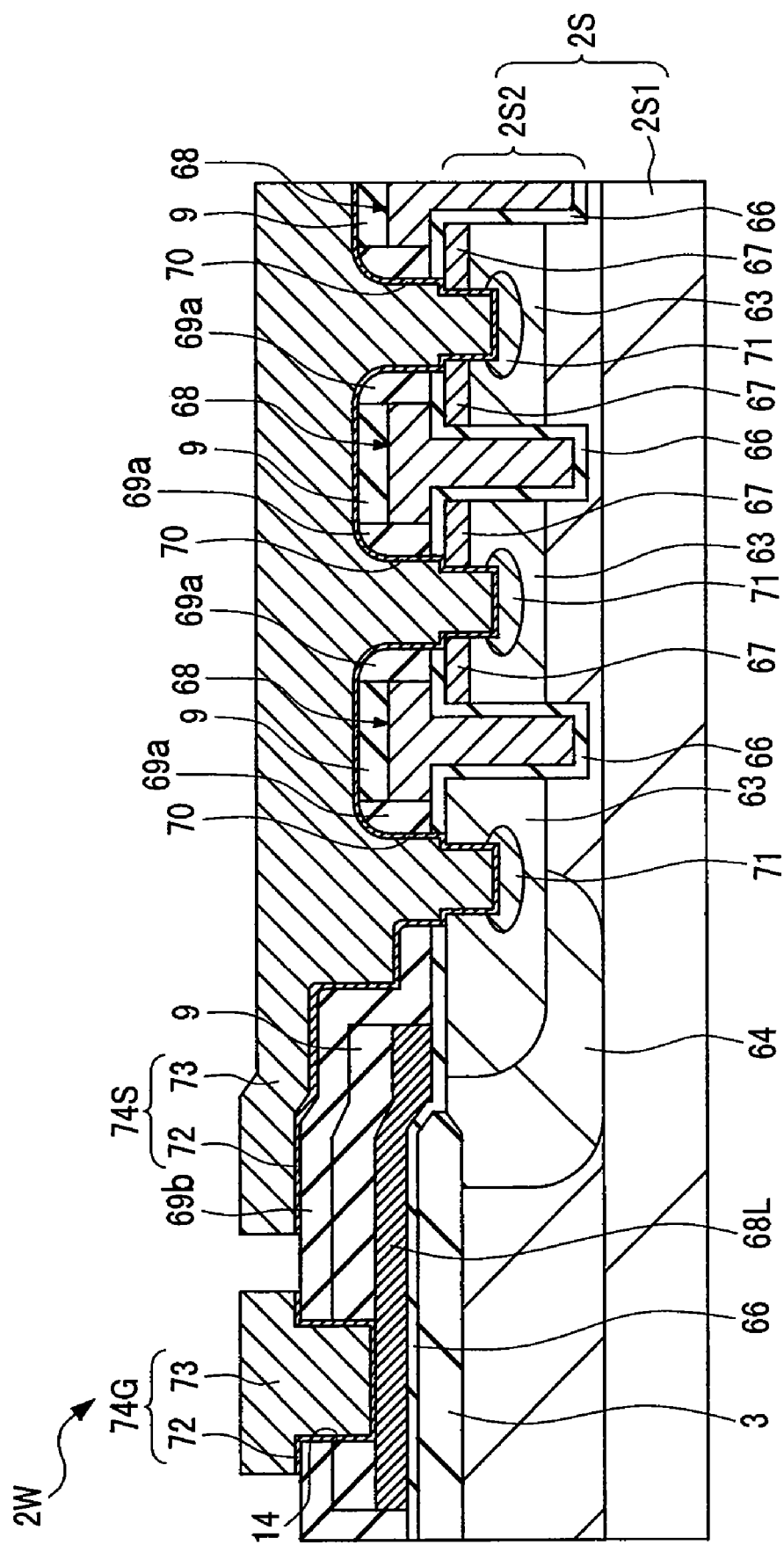
FIG. 72 is a sectional view showing the principal part at the step subsequent to that in FIG. 71 in the fabrication process of the semiconductor device.

Next, FIG. 72 is the sectional view showing the principal part at the step subsequent to that in FIG. 71 in the fabrication process of the semiconductor device. In this step, trenches 70 are formed, by the dry etching of parts of the semiconductor layer 2S2 exposed from the cap insulators 9, the sidewalls 69a, and the insulator 69b used as etching masks. Each trench 70 extends from the main surface of the semiconductor layer 2S2 to the intermediate position of the semiconductor layer 2S2 in the depth direction of the semiconductor region 63 when seen in section, and extends in a predetermined direction when seen in plane. Thereafter, boron difluoride (BF$_2$) is, for example, ion implanted into the semiconductor layer 2S2 with about 80 keV and about $3 \times 10^{15}$ cm$^{-2}$, and p$^+$ type semiconductor regions 71 are formed at the bottoms of the trenches 70. Subsequently, the outer circumferential portions of the sidewalls 69a and the cap insulators 9 are slightly removed by the wet etching treatment to widen the upper openings of the trenches 70, and then a contact hole 14 are formed in the insulator 69b to expose a part of the gate extraction wiring 68L. Thereafter, a conductor film 72 made of refractory metal, such as titanium (Ti) or the like, having the design thickness of about 50 nm is deposited on the main surface of the semiconductor wafer 2W by the sputtering method. This conductor film 72 functions to improve the hydrophilicity of aluminum film deposited later and to reduce or prevent reactions to aluminum and silicon. Subsequently, a conductor film 73 made of, for example, aluminum is deposited on the main surface of the semiconductor wafer 2W by the sputtering method, and then the conductor films 72 and 73 are patterned by the lithography technique and the dry etching technique. By so doing, a gate electrode 74G and a source electrode 74S are formed on the main surface of the semiconductor wafer 2W. The gate electrode 74G is electrically connected to the gate extraction wiring 68L through the contact hole 14 while the source electrode 74S is electrically connected to the semiconductor regions 63, 67, and 71 in the semiconductor layer 2S2 through the trenches 70. Thus, the semiconductor device with high-performance power MIS is fabricated.

Fourteenth Embodiment

Figure 76:
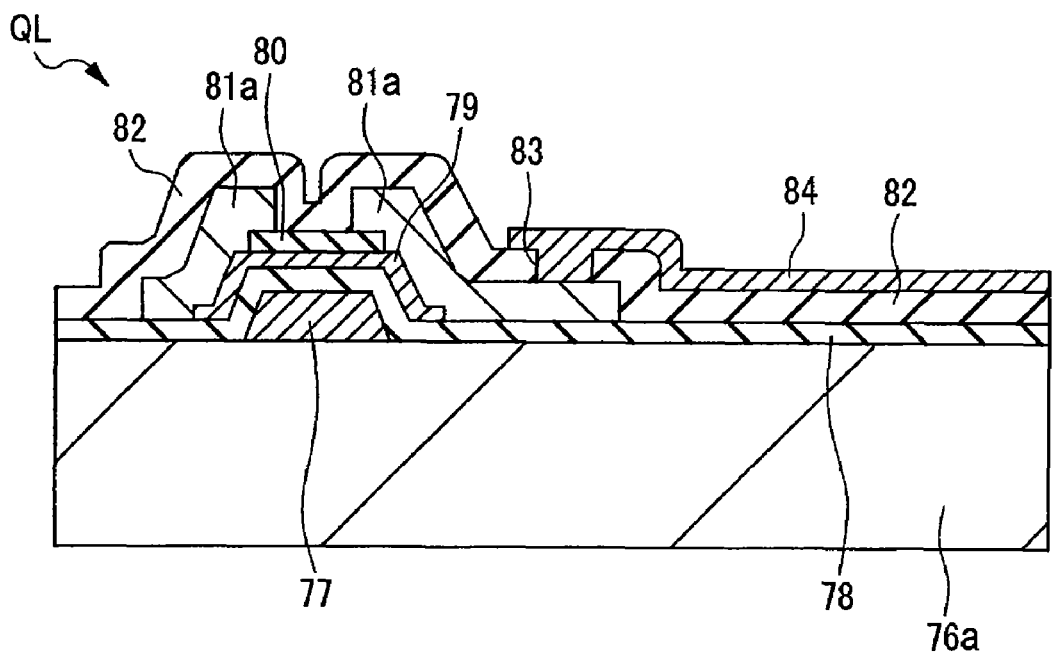
FIG. 76 is a sectional view showing the principal part at the step subsequent to that in FIG. 75 in the fabrication process of the liquid crystal display.
Figure 77:
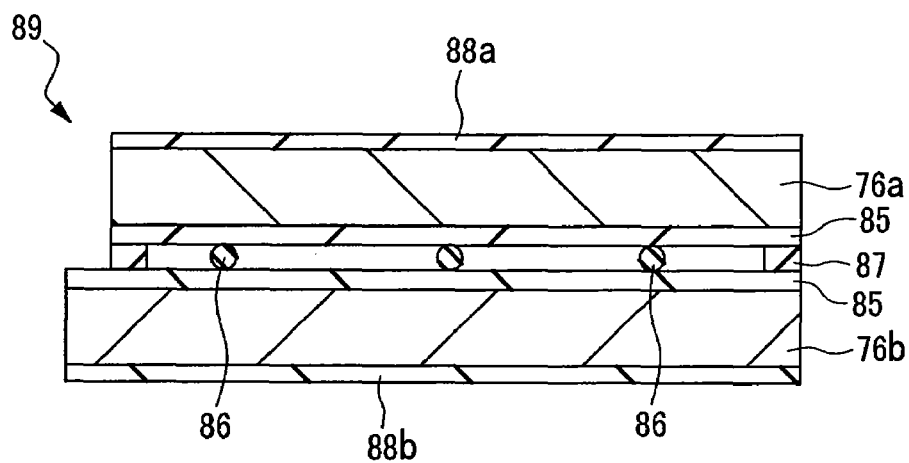
FIG. 77 is a sectional view showing the principal part at the step subsequent to that in FIG. 76 in the fabrication process of the liquid crystal display.
Figure 78:
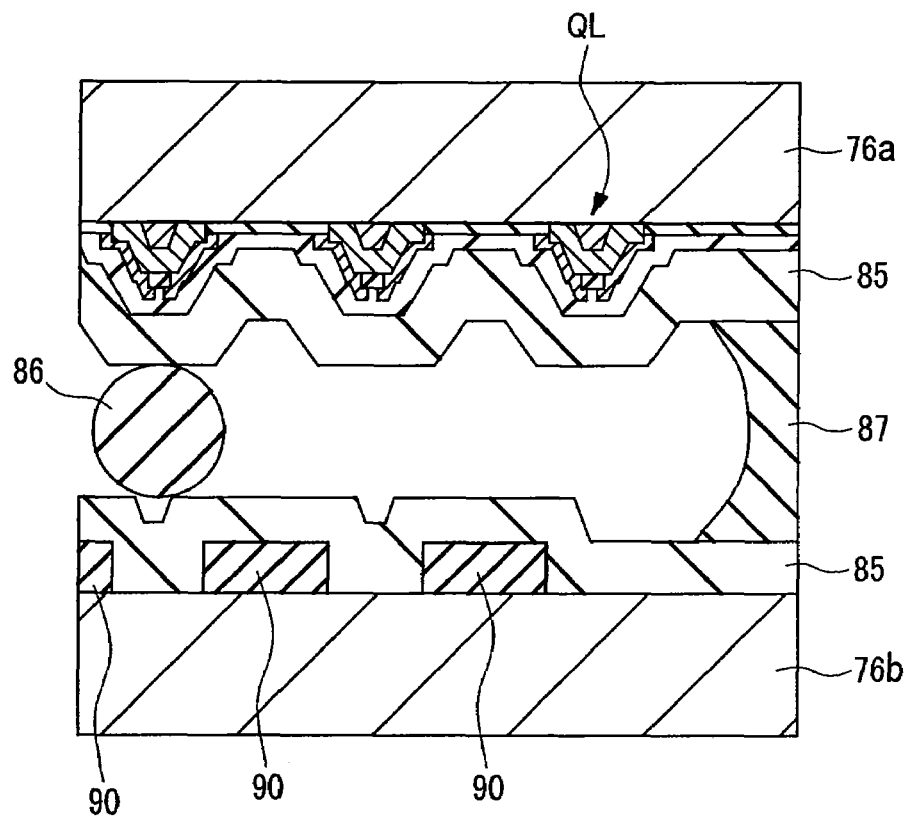
FIG. 78 is an enlarged sectional view showing the principal part of the liquid crystal display in FIG. 77.

In a fourteenth embodiment, an example of the case in which the present invention is applied to a method for fabricating a liquid crystal display (LCD) will be described with reference to FIGS. 73 to 78. FIGS. 73 to 77 are sectional views in the process for fabricating the liquid crystal display according to the fourteenth embodiment, and FIG. 78 is an enlarged sectional view showing the principal part of FIG. 77.

Figure 73:
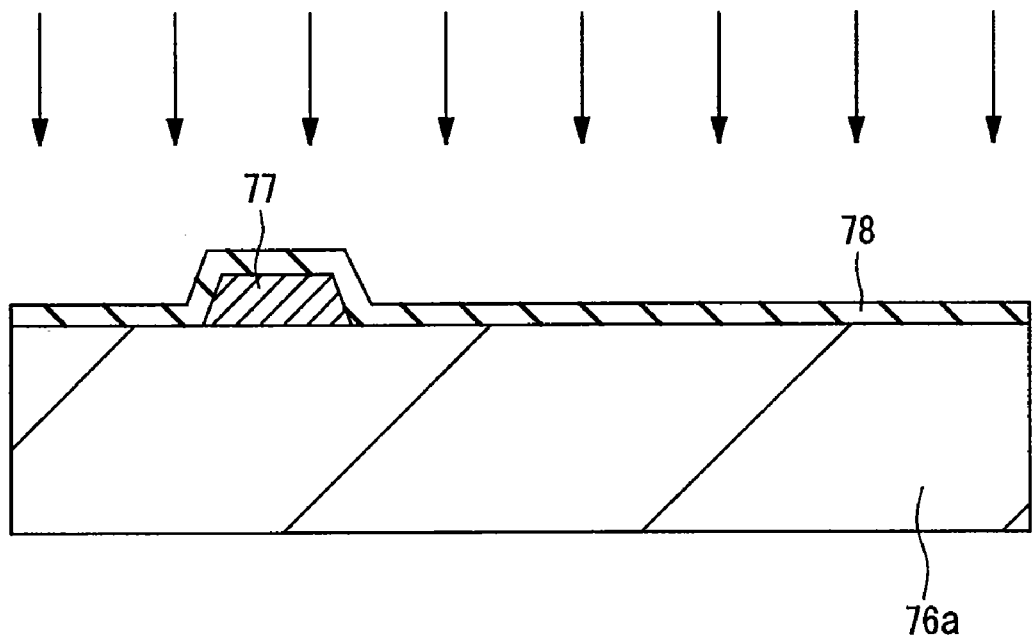
FIG. 73 is a sectional view showing the principal part in the fabrication process of the liquid crystal display according to another embodiment of the present invention.

First, as shown in FIG. 73, a conductor film made of, for example, a tantalum (Ta)-molybdenum (Mo) alloy is deposited, by the sputtering method or the like, on a main surface (device forming surface) of a transparent glass substrate 76a constituting an array substrate, and then the conductor film is patterned by the lithography technique and the etching technique to form a gate electrode 77. Subsequently, an insulator 78 made of, for example, silicon oxide is deposited on the main surface of the glass substrate 76a by the plasma CVD method so as to cover the gate electrode 77. The insulator 78 is a film for forming the gate insulator of a TFT (Thin Film Transistor) functioning as a switch element for writing image data. Thereafter, in the fourteenth embodiment, the above-mentioned oxygen plasma treatment is performed to the insulator 78 in the manner as schematically shown by the arrows in FIG. 73. By so doing, the film quality (breakdown voltage of gate insulator) of the insulator 78 can be improved. Therefore, since the thickness of the insulator 78 can be reduced, it is possible to improve the operation efficiency of the TFT. In addition, since the film quality of the insulator 78 can be improved, it is possible to improve the lifetime of the TFT QL. Furthermore, the glass substrate constituting the liquid crystal display cannot bear the treatment at a high temperature. However, in the oxygen plasma treatment in the fourteenth embodiment, the reforming treatment of the insulator 78 can be performed under the relatively low temperature condition (0 to 400° C.) and any problems are not caused on the glass substrate 76a. Therefore, it is the treatment suitable for the fabrication condition of the liquid crystal display. As an alternative example, the gate insulator formed in the following manner is also available. That is, after anodically oxidizing the surface of the gate electrode 77 to form an insulator such as tantalum oxide (TaOx) or the like on the surface of the gate electrode 77, an insulator made of silicon oxide is deposited by the CVD method and the oxygen plasma treatment may be performed to the silicon oxide to form the gate insulator. In this manner, since the dielectric constant of the gate insulator can be increased, it is possible to improve the operation efficiency of the TFT despite the relatively large thickness of the gate insulator.

Figure 74:
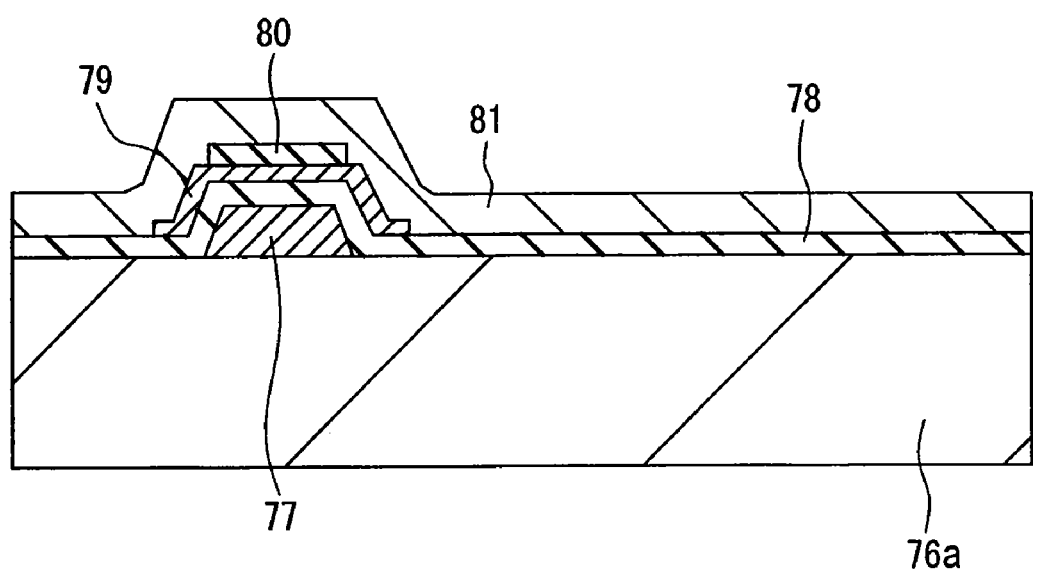
FIG. 74 is a sectional view showing the principal part at the step subsequent to that in FIG. 73 in the fabrication process of the liquid crystal display.
Figure 75:
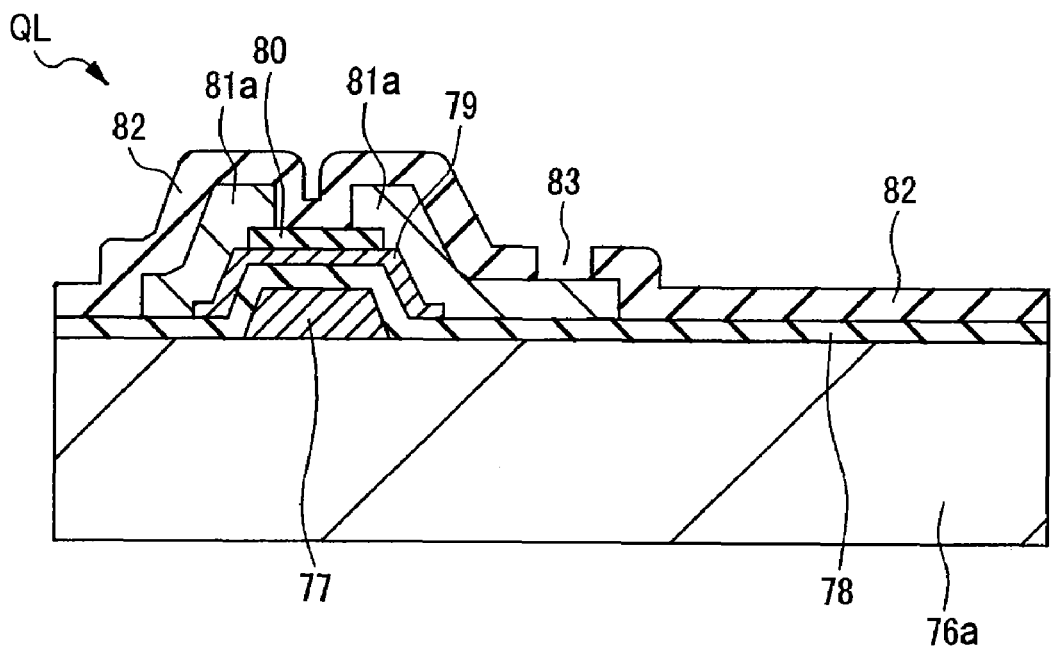
FIG. 75 is a sectional view showing the principal part at the step subsequent to that in FIG. 74 in the fabrication process of the liquid crystal display.

Next, as shown in FIG. 74, after forming a semiconductor layer 79 made of, for example, amorphous silicon (a-Si) or the like, an insulator 80 made of, for example, silicon nitride is formed thereon, and a conductor film 81 for the source and drain is deposited thereon. The semiconductor layer 79 formed of, for example, polycrystalline silicon is also available. Subsequently, the conductive film 81 is patterned. As shown in FIG. 75, after a TFT QL is formed by forming wirings 81a for the source and drain, a protection film 82 made of, for example, silicon oxide is deposited, and a contact hole 83 is formed in a part of the protection film 82. Thereafter, after depositing a transparent conductor film made of, for example, ITO (oxide of indium and tin) over the main surface of the glass substrate 76a, the conductor film is patterned. By so doing, a pixel electrode (electrode for constituting a pixel) 84 is formed as shown in FIG. 76. Thereafter, as shown in FIGS. 77 and 78, an alignment film 85 made of, for example, polyimide resin or the like is coated on both of the main surfaces of the glass substrate 76a and the glass substrate 76b, and the treatment for the alignment film is further performed. Then, both of the glass substrates 76a and 76b are bonded to each other through spacers 86 and sealing adhesives 87 and between their facing surfaces. Thereafter, after filling a liquid crystal material by the use of the capillary phenomenon or the like in the space between the facing surfaces of the two glass substrates 76a and 76b, polarization plates 88a and 88b are attached to the rear surfaces of the glass substrates 76a and 76b to fabricate a liquid crystal panel 89. The glass substrate 76b is a transparent substrate for constituting a color filter substrate. On the main surface of the glass substrate 76b, repetitive patterns of a coloring layer (color filter) 90 with three colors of RGB (red, green, and blue) are formed at the positions, which face those of the respective pixel electrodes 84 over the glass substrate 76a serving as an array substrate.

As described above, it is possible to improve the performance and lifetime of the TFT QL of the liquid crystal display in the fourteenth embodiment.

In the foregoing, the invention made by the inventors has been concretely described based on the embodiments. However, it is needless to say that the present invention is not limited to the foregoing embodiments and can be variously modified and altered without departing from the scope of thereof.

For example, the case where the LPCVD method is used as the method for fabricating an insulator has been described in the first to thirteenth embodiments. However, the present invention is not limited to this. For example, the film quality of the insulator can be improved by performing the oxygen plasma treatment to the insulator, which is made of silicon oxide formed by the plasma CVD method.

Also, the case where the film quality of silicon oxide is improved by performing the oxygen plasma treatment to the silicon oxide has been described in the first to fourteenth embodiments. However, the present invention is not limited to this. For example, it is also possible to improve the film quality (breakdown voltage of insulator) of each insulator by performing the oxygen plasma treatment to silicon oxynitride (SiON) or silicon nitride. In addition, it is also possible to improve the film quality (breakdown voltage of insulator) of each laminated film of two or more insulators selected from silicon oxide, silicon oxynitride, and silicon nitride by performing the oxygen plasma treatment to the laminated film. At this time, the oxygen plasma treatment may be performed at each deposition of the film.

Furthermore, it is sufficient for the plasma atmosphere in the oxygen plasma treatment to have the oxidation function. Therefore, it is needless to say that the same effect can be achieved even if the gas containing two or more of the water vapor, $N_2O$ molecules, NO molecules, and $O_2$ molecules is used as the gas introduced to the plasma chamber instead of the gas containing oxygen molecules. Also, in the case where the gas contains hydrogen molecules in addition to oxygen molecules, similarly to the case where the gas contains the water vapor, the effect to improve the film quality can be obtained in shorter time in comparison to the case where the gas contains only the oxygen molecules, or the oxygen molecules and inert molecules. Note that in the case where the gas introduced to the plasma chamber contains oxygen molecules and hydrogen molecules, the nitridation is performed simultaneously with the reforming of the silicon oxide and the effect that the variations in flatband voltage and leakage current due to the voltage stress are reduced can be also achieved. Therefore, the use of mixed gas containing oxygen molecules and hydrogen molecules is further effective as occasion demands.

In the foregoing descriptions, the case where the invention made by the inventors is applied to the method for fabricating a semiconductor device with a flash memory, a CMIS circuit, or a power MIS circuit and to the method for fabricating a liquid crystal display has been mainly described based on the application field and the background of the invention. However, the present invention is not limited to this and, for example, may be applied to the method for fabricating: a semiconductor device with a memory circuit such as DRAM (Dynamic Random Access Memory) or SRAM (Static Random Access Memory) or the like; a semiconductor device with a logic circuit such as a microprocessor or the like; a mixed type semiconductor device in which a memory circuit and a logic circuit are provided on the same semiconductor substrate; or the like. In addition, the present invention may be applied to the method for fabricating a micromachine.

Furthermore, the present invention may be applied to the method for fabricating a semiconductor device with a high breakdown voltage MISFET such as LCD driver. Note that, in the semiconductor device with a high breakdown voltage MISFET, the thick gate insulator of the high breakdown voltage MISFET formed by the CVD method is formed at a low temperature than the temperature performed in the thermal oxide formation process and the film quality of such thick gate insulator can be improved to the extent almost equal to that of the thermal oxide.

The effect obtained by the typical ones of the inventions disclosed in this application will be briefly described as follows.

That is, the plasma treatment is performed, in the atmosphere containing oxygen atoms, to the oxide film deposited on the semiconductor substrate by the CVD method. By so doing, the silicon oxide with the film quality almost equivalent to that of the thermal oxide can be formed without the thermal oxidation. Therefore, it is possible to improve the reliability of the semiconductor device having the silicon oxide.

What is claimed is:

1. A method for fabricating a semiconductor device, the method comprising:
   (a) forming a laminated film by performing the following steps at least twice: depositing an insulator made of silicon oxide over a semiconductor substrate by a chemical vapor deposition method; and performing a plasma treatment to said deposited insulator in an atmosphere containing oxygen atoms;
   (b) patterning said laminated film so that a relatively thick insulator comprised of said laminated film can be left at least in a thick-film region over said semiconductor substrate;
   (c) forming a relatively thin insulator in a thin-film region over said semiconductor substrate; and
   (d) forming gate electrodes in said thick-film region and said thin-film region,
   wherein said plasma treatment is a treatment with plasma mainly comprised of ions containing oxygen atoms, and
   wherein said plasma treatment is performed under a condition that the ratio of ions in the plasma is larger than that of radicals.

2. The method for fabricating a semiconductor device according to claim 1, further comprising a step of forming field effect transistors having gate insulators different in thickness over said semiconductor substrate,
   wherein said insulator to which the plasma treatment is performed is a film for forming a relatively thick gate insulator.

3. The method for fabricating a semiconductor device according to claim 1,
   wherein said insulator, formed by the chemical vapor deposition method, is formed by an atomic layer deposition method.

4. The method for fabricating a semiconductor device according to claim 1,
   wherein the pressure in a treatment chamber in said plasma treatment is at least 1 Pa and not greater than 200 Pa.

5. The method for fabricating a semiconductor device according to claim 1,
   wherein said atmosphere contains water.

6. The method for fabricating a semiconductor device according to claim 1,
   wherein said atmosphere contains an inert gas, and a flow rate of said inert gas is higher than that of a gas containing oxygen atoms.

* * * * *